United States Patent
Bang et al.

(10) Patent No.: US 11,025,242 B2
(45) Date of Patent: Jun. 1, 2021

(54) METHODS AND APPARATUS TO TRANSMIT SIGNALS IN ISOLATED GATE DRIVERS

(71) Applicant: Texas Instruments Incorporated, Dallas, TX (US)

(72) Inventors: Sarvesh Bang, San Jose, CA (US); Arun Rao, San Jose, CA (US); Joseph Pham, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 16/933,453

(22) Filed: Jul. 20, 2020

(65) Prior Publication Data

US 2020/0350905 A1    Nov. 5, 2020

Related U.S. Application Data

(62) Division of application No. 16/552,805, filed on Aug. 27, 2019, now Pat. No. 10,763,844.

(Continued)

(51) Int. Cl.
*H03K 17/08*     (2006.01)
*H03K 17/04*     (2006.01)
(Continued)

(52) U.S. Cl.
CPC ............... *H03K 17/08122* (2013.01)

(58) Field of Classification Search
CPC ......... H03K 17/0412; H03K 17/04123; H03K 17/04126; H03K 17/081; H03K 17/08104;
(Continued)

(56) References Cited

U.S. PATENT DOCUMENTS

| | | |
|---|---|---|
| 6,314,519 B1 | 11/2001 | Davis et al. |
| 6,574,168 B2 | 6/2003 | Hayashi |
| 10,581,335 B1 * | 3/2020 | Kaya ................ H02M 3/33569 |

FOREIGN PATENT DOCUMENTS

| | | |
|---|---|---|
| WO | 2014025510 A1 | 2/2014 |
| WO | 2017139406 A1 | 8/2017 |

OTHER PUBLICATIONS

Texas Instruments "ISO5852S High-CMTI 2.5-A and 5-A Reinforced Isolated IGBT, MOSFET Gate Driver With Split Outputs and Active Protection Features," Aug. 2015—Revised Jan. 2017 (43 pages).

(Continued)

*Primary Examiner* — An T Luu
(74) *Attorney, Agent, or Firm* — Lawrence J. Bassuk; Charles A. Brill; Frank D. Cimino

(57) ABSTRACT

Methods, apparatus, systems and articles of manufacture are disclosed to transmit signal in isolated gate drivers. An example apparatus includes a first encoder including: an edge detector coupled to a first sensor; a first clock counter coupled to the edge detector; a first signal selector coupled to the first clock counter; and a first multiplexer including coupled to a signal generator, the first clock counter, and the first signal selector; and a second encoder including: a level detector coupled to a second sensor; a second clock counter coupled to the level detector; a second signal selector coupled to the level detector and the second clock counter; and a second multiplexer coupled to the first multiplexer, a reference voltage, the second signal selector, and a modulator.

15 Claims, 19 Drawing Sheets

Related U.S. Application Data

(60) Provisional application No. 62/723,736, filed on Aug. 28, 2018, provisional application No. 62/740,224, filed on Oct. 2, 2018.

(51) Int. Cl.
*H03K 5/08* (2006.01)
*H03K 17/0812* (2006.01)

(58) Field of Classification Search
CPC ......... H03K 17/08112; H03K 17/0812; H03K 17/08122; H03K 17/08126; H03K 5/08; H03K 5/084; G05F 3/02; G05F 3/16
See application file for complete search history.

(56) References Cited

OTHER PUBLICATIONS

Gorry Fairhurst, Manchester Encoding, Jan. 3, 2007, available online: https://erg.abdn.ac.uk/users/gorry/course/phy-pages/man.html, last retrieved Jan. 27, 2020 (2 pages).

\* cited by examiner

METHODS AND APPARATUS TO TRANSMIT SIGNALS IN ISOLATED GATE DRIVERS

RELATED APPLICATION

This application is a divisional of prior application Ser. No. 16/552,805, filed Aug. 27, 2019;

which claims the benefit of U.S. Provisional Patent Application No. 62/723,736, which was filed on Aug. 28, 2018;

and which claims the benefit of U.S. Provisional Patent Application No. 62/740,224, which was filed on Oct. 2, 2018.

U.S. Provisional Patent Application No. 62/723,736 and U.S. Provisional Patent Application No. 62/740,224 are hereby incorporated herein by reference in their entirety. Priority to U.S. Provisional Patent Application No. 62/723,736 and U.S. Provisional Patent Application No. 62/740,224 is hereby claimed.

FIELD OF THE DISCLOSURE

This disclosure relates generally to gate drivers, and, more particularly, to methods and apparatus to transmit signals in isolated gate drivers.

BACKGROUND

High-voltage and/or high-current applications require power electronic devices capable of efficient and effective operation at elevated temperatures. In such applications, power modules deliver the required power using power metal-oxide-semiconductor field-effect transistors (MOSFETs). The power MOSFETs may be used as power delivering devices to support tens or hundreds of amperes during normal operation to deliver the power to a load.

Figure 1:
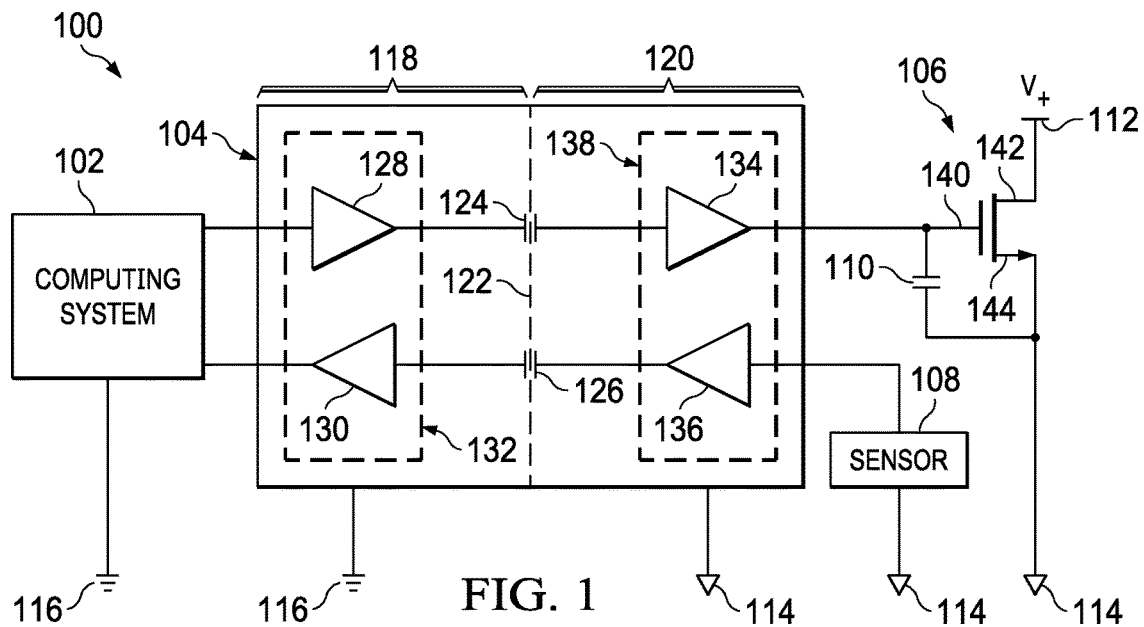
FIG. 1 is a schematic illustration of an example gate driver system.

The figures are not to scale. In general, the same reference numbers will be used throughout the drawing(s) and accompanying written description to refer to the same or like parts. Connection references (e.g., attached, coupled, connected, joined, configured to be coupled, configured to be connected, adapted to be coupled, adapted to be connected, etc.) are to be construed broadly and may include intermediate members between a collection of elements and relative movement between elements unless otherwise indicated. As such, connection references do not necessarily infer that two elements are directly connected and in fixed relation to each other.

Descriptors "first," "second," "third," etc. are used herein when identifying multiple elements or components which may be referred to separately. Unless otherwise specified or understood based on their context of use, such descriptors are not intended to impute any meaning of priority, physical order or arrangement in a list, or ordering in time but are merely used as labels for referring to multiple elements or components separately for ease of understanding the disclosed examples. In some examples, the descriptor "first" may be used to refer to an element in the detailed description, while the same element may be referred to in a claim with a different descriptor such as "second" or "third." In such instances, it should be understood that such descriptors are used merely for ease of referencing multiple elements or components.

DETAILED DESCRIPTION

High-voltage and/or high-current isolated gate driver environments and applications, such as a traction inverter in an electric vehicle (EV), a hybrid-electric vehicle (HEV), etc., utilize power electronic devices capable of efficient and effective operation at elevated temperatures. Power delivery and/or management modules have been developed to provide the required power using low-impedance power MOSFETs made from Silicon Carbide (SiC) (e.g., a silicon carbide switch, a silicon carbide metal-oxide-semiconductor field-effect transistor). Power SiC MOSFETs may be used as power delivering devices to support tens or hundreds of amperes during normal operation to deliver power to a load. Alternatively, power modules have been developed using low impedance isolated gate bipolar transistor (IGBT) devices to satisfy the necessary power requirements for applications such as traction inverters for EVs, HEVs, etc.

Some high-voltage and/or high-current applications utilize isolated gate drivers to control the power SiC MOSFETs and/or IGBTs, or more generally a power switching device. Such isolated gate drivers include isolation barriers that may be implemented by, for example, capacitors, transformers, opto-isolators, Hall effect sensors, magnetocouplers, relays, and/or any other suitable method.

In a high-voltage and/or high-current application, it may be desirable to monitor characteristics of the power switching device and/or isolated gate driver to ensure safe performance and/or other desired performance of the power switching device and/or the isolated gate driver. For example, it may be desirable to monitor the supply voltage to each side of the isolated gate driver to prevent unpredictable performance of the isolated gate driver under an under-voltage condition. Under such a condition, the isolated gate driver may implement under-voltage lockout (UVLO) to protect the isolated gate driver.

Another characteristic that may be desirable to monitor in a high-voltage and/or high current application is the magnitude of the current flowing through the power switching device. In the event that the magnitude of the current flowing through the power switching device exceeds a threshold value, the isolated gate driver can indicate to a microcontroller that an overcurrent (OC) condition has occurred (e.g., generates an indication to a microcontroller that an OC event has occurred)). When indicating an OC condition has occurred, the isolated gate driver can also turn off the power switching device to protect the transistor.

Additionally, it may be advantageous or desirable to monitor one or more signals corresponding to the power switching device, for example, temperature, bus voltage, or any other suitable signal. This information (e.g., power switching device temperature, bus voltage, power switching device current, isolated gate driver supply voltage, etc.) may be desirable so that a microprocessor and/or the isolated gate driver can turn off the power switching device to prevent damage to the power switching device (e.g., a transistor). As such, this information may be captured by one or more sensors as an analog signal and converted to a pulse width modulated signal (PWM) by an analog to PWM (APWM) converter.

While the current through the power switching device, the supply voltage to each side of the isolate gate driver, and/or other characteristics of the power switching device are useful for desirable performance of the isolated gate driver and/or the power switching device, each of these signals must be transmitted across the isolation barrier that is between a high voltage stage and a low voltage stage of the isolated fate driver. Thus, the signals must be transmitted in a manner that preserves the isolation between each side of the isolated gate driver. Additionally, based on the monitored characteristics, a microcontroller and/or the isolated gate driver may take actions to control the power switching device by transmitting control signals to the power switching device.

Some methods of transmitting these monitored characteristics and/or control signals across the isolation barrier utilize corresponding transmission channels for each signal representative of the desired characteristics. Such methods are effective in transmitting the information across isolation barriers, however, the multiple channels for multiple signals utilize an increased area of a silicon die of an integrated circuit (IC). Increased silicon die area not only presents a monetarily expensive method of transmitting signals across the isolation barrier, but it also increases the size of the isolated gate driver because the increased silicon die area requires a larger footprint on a printed circuit board (PCB).

Examples disclosed herein include methods and apparatus to communicate with signals in isolated gate drivers. The disclosed examples utilize a single transmission channel for control signals and a single transmission channel for sensing signals. The examples disclosed herein encode a signal with information corresponding to multiple characteristics of an isolated gate driver and/or power switching device utilizing frequency, pulse counting, and voltage level. The examples disclosed herein include methods and apparatus to communicate with signals in isolated gate drivers. The example disclosed herein provide, an apparatus comprising: a first encoder including: an edge detector coupled to a first sensor; a first clock counter coupled to the edge detector; a first signal selector coupled to the first clock counter; and a first multiplexer including coupled to a signal generator, the first clock counter, and the first signal selector; and a second encoder including: a level detector coupled to a second sensor; a second clock counter coupled to the level detector; a second signal selector coupled to the level detector and the second clock counter; and a second multiplexer coupled to the first multiplexer, a reference voltage, the second signal selector, and a modulator.

The examples disclosed herein additionally or alternatively provide a signal converter comprising: a first encoder including a first input coupled to an output of a signal generator, a second input coupled to an output of a first sensor, an output, and a first multiplexer, the first input of the first encoder corresponding to an input of the first multiplexer, the output of the first encoder corresponding to an output of the first multiplexer, the first encoder configured to: transmit a first signal at the output of the first encoder, the first signal including a first voltage level and a first frequency; in response to a first indication by the first sensor, transmit a second signal at the output of the first encoder, the second signal including a second voltage level and a second frequency, the second frequency different than the first frequency; and a second encoder including a first input coupled to the output of the first encoder, a second input coupled to a second sensor, a second multiplexer, and an output, the first input of the second encoder corresponding to an input of the second multiplexer, the output of second encoder coupled to an input of a modulator, the output of the second encoder corresponding to an output of the second multiplexer, the second encoder configured to, in response to a second indication by the second sensor, transmit a third signal to the modulator, the third signal including a third voltage level different than the first voltage level and the second voltage level.

The disclosed examples additionally or alternatively provide for a system comprising: a system comprising: a switch including a first current terminal coupled to a voltage supply and a second current terminal coupled to a reference node, the switch configured to conduct current from the first current terminal to the second current terminal; a signal generator including an output; a first sensor including an output and an input coupled to the first current terminal of the switch; a second sensor including an output; a modulator including an input and an output; a capacitor including an output and an input coupled to the output of the modulator; and a signal converter including an output coupled to the input of the modulator, a first input coupled to the output of the signal generator, a second input coupled to the output of the first sensor, and a third input coupled to the output of the second sensor, the signal converter configured to: transmit a first signal, the first signal including a first voltage level and a first frequency; in response to a first indication by the first sensor, transmit a second signal, the second signal including a second voltage level and a second frequency, the second frequency different than the first frequency; and in response to a second indication by the second sensor, transmit a third signal, the third signal including a third voltage level different than the first voltage level and the second voltage level.

FIG. 1 is a schematic illustration of an example gate driver system 100. The example gate driver system 100 includes an example computing system 102, an example isolated gate driver 104, an example switch 106, an example sensor 108, an example biasing device 110, an example voltage supply node 112, an example high voltage reference node 114, and an example low voltage reference node 116.

In the example of FIG. 1, the computing system 102 is coupled to the isolated gate driver 104 and the low voltage reference node 116. The isolated gate driver 104 is coupled to the switch 106, the sensor 108, the biasing device 110, and the high voltage reference node 114. The switch 106 is coupled to the biasing device 110, the voltage supply node 112, and the high voltage reference node 114. The sensor 108 is coupled to the isolated gate driver 104 and the high voltage reference node 114.

In the example of FIG. 1, the example isolated gate driver 104 includes an example low voltage stage 118, an example high voltage stage 120, and an example isolation barrier 122. Additionally or alternatively, in some examples the isolated gate driver 104 includes the sensor 108. The example isolation barrier 122 includes an example first capacitor 124 and an example second capacitor 126. The example low voltage stage 118 includes an example first encoder 128 and an example first decoder 130. In FIG. 1, the example first encoder 128 and the example first decoder 130 form an example low voltage stage signal converter 132. The example high voltage stage 120 includes an example second decoder 134 and an example second encoder 136. In FIG. 1, the example second decoder 134 and the example second encoder 136 form an example high voltage stage signal converter 138. The example switch 106 includes an example gate 140, an example drain 142, and an example source 144.

In the example of FIG. 1, the computing system 102 is coupled to the first encoder 128, the first decoder 130, and the low voltage reference node 116. The computing system 102 is a device that controls, monitors, and/or otherwise manages the switch operations of the switch 106 to regulate the flow of current from the voltage supply node 112 to the high voltage reference node 114. For example, the computing system 102 can transmit, to the first encoder 128, signals to control the switching operations of the switch 106. Additionally, the computing system 102 can monitor the switch 106 via signals received from the first decoder 130.

In the illustrated example of FIG. 1, the computing system 102 is a microcontroller. In other examples, the computing system 102 may be implemented by a digital signal processor (DSP) or any other suitable processing element. Alternatively, the computing system 102 may be implemented using hardware logic, machine readable instructions, hardware implemented state machines, etc., and/or a combination thereof.

In the example of FIG. 1, the isolated gate driver 104 is a device that amplifies low power input signals from the computing system 102 and produces a high current output to drive (e.g., enable) a switch. In the examples disclosed herein, the low voltage stage 118 is implemented on a first die (e.g., a silicon die) separate from the high voltage stage 120, within the isolated gate driver 104. The high voltage stage 120 is implemented on a second die (e.g., a silicon die) separate from the low voltage stage 118, within the isolated gate driver 104. In other examples, the low voltage stage 118 and the high voltage stage 120 may be implemented on a single die (e.g., a silicon die) within the isolated gate driver 104. In further examples, the low voltage stage 118 may be implemented on a plurality of dies (e.g., silicon dies) within the isolated gate driver 104. In additional examples, the high voltage stage 120 may be implemented on a plurality of dies (e.g., silicon dies) within the isolated gate driver 104. Alternatively, in some examples, the isolated gate driver 104 and/or any of the components shown in the isolated gate driver 104 may be implemented on a plurality of integrated circuits and/or any plurality of dies (e.g., silicon dies). In the example illustrated in FIG. 1, the low voltage stage 118 and the high voltage stage 120 are isolated by the isolation barrier 122 that implements capacitive isolation.

In the example of FIG. 1, the low voltage reference node 116 is at a voltage level of zero volts or a voltage level substantially similar thereto. In other examples, the low voltage reference node 116 may be at any suitable voltage level for the application. The high voltage reference node 114 is at a voltage level of zero volts or a voltage level substantially similar thereto. In other examples, the high voltage reference node 114 may be at any suitable voltage level for the application. The voltage supply node 112 is at a voltage level, $V_+$, of, for example, 800 volts. In other examples, the voltage supply node 112 may be at any suitable voltage level for the application.

In the illustrated example of FIG. 1, the first encoder 128 is coupled to the computing system 102 and the first capacitor 124. The first encoder 128 is at least one circuit that encodes one or more signals from the computing system 102, modulates the one or more signals, and/or transmits the one or more signals across the isolation barrier 122 to the second decoder 134 via the first capacitor 124.

In the example of FIG. 1, the first decoder 130 is coupled to the computing system 102 and the second capacitor 126. The first decoder 130 is at least one circuit that demodulates, decodes a signal received from the second encoder 136 via the second capacitor 126 into one or more signals. The first decoder 130 can additionally transmit the one or more signal to the computing system 102.

In the example of FIG. 1, the isolation barrier 122 is a capacitive isolation barrier including the first capacitor 124 and the second capacitor 126. In the example of FIG. 1, the first capacitor 124 can be implemented by a 70 femtofarad (fF) capacitor and the second capacitor 126 can be implemented by a 70 fF capacitor. In some examples, the first capacitor 124 can be implemented by any suitable capacitive value (50 fF, 25 fF, 35 fF, etc.) to implement the isolation barrier 122. In additional or alternative examples, the second capacitor 126 can be implemented by any suitable capacitive value (50 fF, 25 fF, 35 fF, etc.) to implement the isolation barrier 122. The isolation barrier 122 ensures that that the low voltage reference node 116 and the high voltage reference node 114 of the low voltage stage 118 and the high voltage stage 120, respectively, are isolated from one another. In some examples disclosed herein, the isolation barrier 122 may be implemented as a transformer isolation barrier, an optocoupled isolation barrier, an inductive isolation barrier, a Hall effect sensor based isolation barrier, a magnetocoupled isolation barrier, a relay based isolation barrier, and/or any other suitable type of isolation barrier.

In some examples, the first capacitor 124 can be implemented as a first capacitor included in the low voltage stage 118 coupled to a second capacitor included in the high voltage stage 120 and the second capacitor 126 can be implemented as a first capacitor included in the high voltage stage 120 coupled to a second capacitor included in the low voltage stage 118. In additional or alternative examples, the first capacitor 124 and the second capacitor 126 can be implemented on a third die that is separate from the low voltage stage 118 and the high voltage stage 120. In further examples, the first capacitor 124 and the second capacitor 126 can be implemented on the low voltage stage 118. In additional or alternative examples, the first capacitor 124 and the second capacitor 126 can be implemented on the high voltage stage 120. In some examples, the first capacitor 124 can be implemented on the low voltage stage 118 and the second capacitor 126 can be implemented on the high voltage stage 120. In additional or alternative examples, the first capacitor 124 can be implemented on the high voltage stage 120 and the second capacitor 126 can be implemented on the low voltage stage 118.

In the example of FIG. 1, the second decoder 134 is coupled to the first capacitor 124, the gate 140, and the biasing device 110. The second decoder 134 is at least one circuit that demodulates and decodes a signal received from the first encoder 128 via the first capacitor 124 into one or more signals to control the switch 106. The second decoder 134 can also provide high current to the gate 140 and/or the biasing device 110 to cause the switch 106 to conduct and/or cease conducting current from the voltage supply node 112. In additional or alternative examples, the isolated gate driver 104 includes additional circuitry separate to the second decoder 134, the additional circuitry to provide high current to the gate 140 and/or the biasing device 110 to cause the switch 106 to conduct and/or cease conducting current from the voltage supply node 112.

In the illustrated example of FIG. 1, the second encoder 136 is coupled to the sensor 108 and the second capacitor 126. Additionally or alternatively, the second encoder 136 may be coupled to any number of sensors. The second encoder 136 is at least one circuit that encodes one or more signals from the sensor 108 and/or other sensors, modulates the one or more signals, and/or transmits the one or more signals across the isolation barrier 122 to the first decoder 130 via the second capacitor 126.

In the example of FIG. 1, the sensor 108 is a device that monitors the temperature of the switch 106 and/or the voltage of the voltage supply node 112. In FIG. 1, the sensor 108 is one or more thermal diodes. In additional or alternative examples, the sensor 108 can be one or more temperature sensing resistors. In further examples, the sensor 108 may be any suitable sensor that facilitates monitoring of a desired characteristic of the switch 106 by the computing system 102 via the isolated gate driver 104.

In the example illustrated in FIG. 1, the example switch 106 is a n-channel power MOSFET. The switch 106 is configured to conduct current between the voltage supply node 112 and the high voltage reference node 114. In alternative examples, the switch 106 may be an IGBT, a gallium nitride (GaN) transistor, a bipolar junction transistor (BJT), and/or any other suitable switching device. The gate 140 is coupled to the second decoder 134 and the biasing device 110. The drain 142 (e.g., a current terminal) is coupled to the voltage supply node 112. The source 144 (e.g., a current terminal) is coupled to the biasing device 110 and the high voltage reference node 114.

In the example of FIG. 1, the biasing device 110 is a capacitor that biases the gate-to-source voltage of the switch 106. For example, the isolated gate driver 104 can charge and/or discharge the voltage of the biasing device 110. In other examples, the biasing device 110 can be a resistor and/or any other suitable biasing device that can be utilized by the isolated gate driver 104 to control the gate-to-source voltage of the switch 106.

Figure 2A:
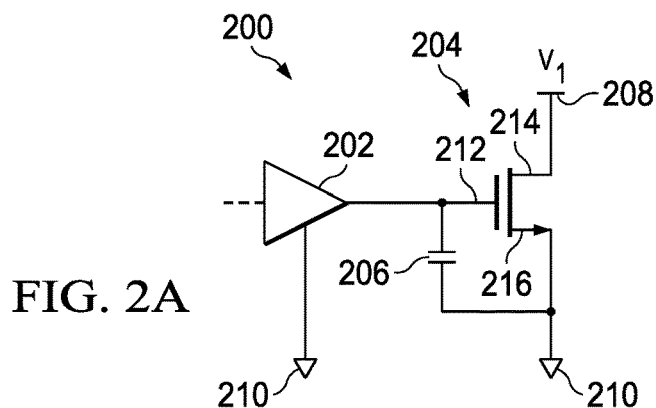
FIGS. 2A and 2B are schematic illustrations of an example gate driver system including soft turn off functionality
Figure 2B:
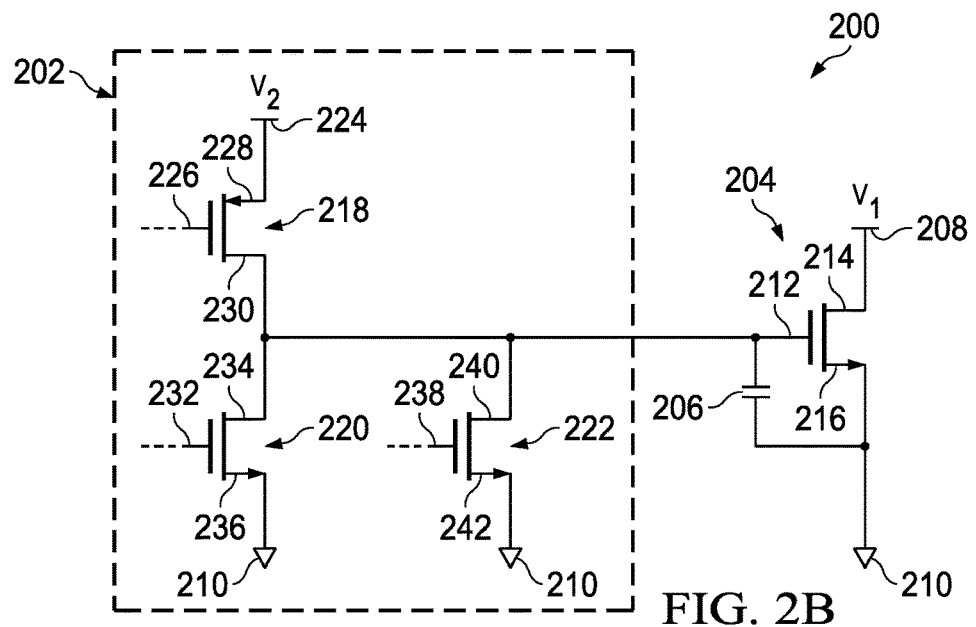

FIGS. 2A and 2B are schematic illustrations of an example gate driver system 200 including soft turn off functionality. In FIG. 2A, the gate driver system 200 includes an example driver 202, an example switch 204, an example biasing device 206, an example voltage supply node 208, and an example voltage reference node 210. The example switch 204 includes an example gate 212, an example drain 214, and an example source 216.

In the example of FIG. 2A, the voltage reference node 210 is at a voltage level of zero volts or a voltage level substantially similar thereto. In other examples, the voltage reference node 210 may be at any suitable voltage level for the application. The voltage supply node 208 is at a voltage level, $V_1$, of, for example, 800 volts. In other examples, the voltage supply node 208 may be at any suitable voltage level for the application.

In the illustrated example of FIG. 2A, the driver 202 is at least one circuit that provides high current to the gate 212 and/or the biasing device 206 to cause the switch 204 to conduct and/or cease conducting current from the voltage supply node 208. The driver 202 is coupled to the gate 212 and the voltage reference node 210. The driver 202 is configured to be controlled by an external device (e.g., a microcontroller). The driver 202 can implement hard turn off (HTO) of the switch 204 and/or soft turn off (STO) of the switch 204. For example hard turn off may be desirable during general operation and control of the switch 204 while during fault, under voltage, and/or other interrupt conditions, soft turn off may be desirable to prevent damage to the switch 204 and/or the driver 202 caused by high voltage overshoot spikes.

In the example illustrated in FIG. 2A, the example switch 204 is an n-channel power MOSFET. In alternative examples, the switch 204 may be an IGBT, a GaN transistor, a BJT, and/or any other suitable switching device. The gate 212 is coupled to the driver 202 and the biasing device 206. The drain 214 (e.g., a current terminal) is coupled to the voltage supply node 208. The source 216 (e.g., a current terminal) is coupled to the biasing device 206 and the voltage reference node 210.

In the example of FIG. 2A, the biasing device 206 is a capacitor that biases the gate-to-source voltage of the switch 204. For example, the driver 202 can charge and/or discharge the voltage of the biasing device 206. In other examples, the biasing device 206 can be a resistor and/or any other suitable biasing device that can be utilized by the driver 202 to control the gate-to-source voltage of the switch 204.

In examples disclosed herein, hard turn off corresponds to turning off a switching device (e.g., the switch 204) without first reducing the voltage of a corresponding biasing device (e.g., the biasing device 206). For example, hard turn off can correspond to drawing ten amps of current from the biasing device, thereby reducing the charge control voltage (e.g., gate-to-source voltage) of the switching device (e.g., the switch 204) below the threshold voltage level for conduction of the switching device (e.g., the switch 204). In examples disclosed herein, soft turn off corresponds to turning off the switching device (e.g., the switch 204) after first reducing the voltage of the corresponding biasing device (e.g., the biasing device 206). For example, soft turn off can correspond to first drawing half an amp from the biasing device (e.g., the biasing device 206) to reduce the charge control voltage (e.g., gate-to-source voltage) of the switching device (e.g., the switch 204), thereby reducing the current flowing through the switching device (e.g., the switch 204), and then drawing ten amps of current from the biasing device (e.g., the biasing device 206) to reduce the charge control voltage (e.g., gate-to-source voltage) of the switching device (e.g., the switch 204) below the threshold voltage level for conduction of the switching device (e.g., the switch 204).

FIG. 2B illustrates the example gate driver system 200 including additional detail of the example driver 202. In FIG. 2B, the example driver 202 includes an example pull up switch 218, an example pull down switch 220, an example soft turn off switch 222, an example driver voltage supply node 224, and the example voltage reference node 210. The example pull up switch 218 includes an example gate 226, an example source 228, and an example drain 230. The example pull down switch 220 includes an example gate 232, an example drain 234, and an example source 236. The example soft turn off switch 222 includes an example gate 238, an example drain 240, and an example source 242.

In the example of FIG. 2B, the driver voltage supply node 224 is at a voltage level, $V_2$, of, for example, 36 volts. In other examples, the driver voltage supply node 224 may be at any suitable voltage level for the application.

In the illustrated example of FIG. 2B, the pull up switch 218 is a p-channel MOSFET. In alternative examples, the pull up switch 218 may be an IGBT, a GaN transistor, a BJT, and/or any other suitable switching device. The pull up switch 218 is structured so that it will conduct a predetermined amount of current when enabled. For example, the width-to-length (W/L) ratio of the pull up switch 218 can be designed such that the pull up switch 218 conducts ten amps of current when enabled. The gate 226 is coupled to an external device (e.g., a microcontroller, a low voltage stage of an isolated gate driver, an encoder, etc.). The source 228 (e.g., a current terminal) is coupled to the driver voltage supply node 224. The drain 230 (e.g., a current terminal) is coupled to the gate 212, the drain 234, and the drain 240.

In the example illustrated in FIG. 2B, the pull down switch 220 is an n-channel MOSFET. In alternative examples, the pull down switch 220 may be an IGBT, a GaN transistor, a BJT, and/or any other suitable switching device. The pull down switch 220 is structured so that it will conduct a predetermined amount of current when enabled. For example, the W/L ratio of the pull down switch 220 can be designed such that the pull down switch 220 conducts ten amps of current when enabled. The gate 232 is coupled to an external device (e.g., a microcontroller, a low voltage stage of an isolated gate driver, an encoder, etc.). The drain 234 (e.g., a current terminal) is coupled to the gate 212, the drain 230, and the drain 240. The source 236 (e.g., a current terminal) is coupled to the voltage reference node 210.

In the example of FIG. 2B, the soft turn off switch 222 is an n-channel MOSFET. In alternative examples, the soft turn off switch 222 may be an IGBT, a GaN transistor, a BJT, and/or any other suitable switching device. The soft turn off switch 222 is structured so that it will conduct a predetermined amount of current when enabled. For example, the W/L ratio of the soft turn off switch 222 can be designed such that the soft turn off switch 222 conducts half an amp of current when enabled. The gate 238 is coupled to an external device (e.g., a microcontroller, a low voltage stage of an isolated gate driver, an encoder, etc.). The drain 240 (e.g., a current terminal) is coupled to the gate 212, the drain 230, and the drain 234. The source 242 (e.g., a current terminal) is coupled to the voltage reference node 210.

Figure 3:
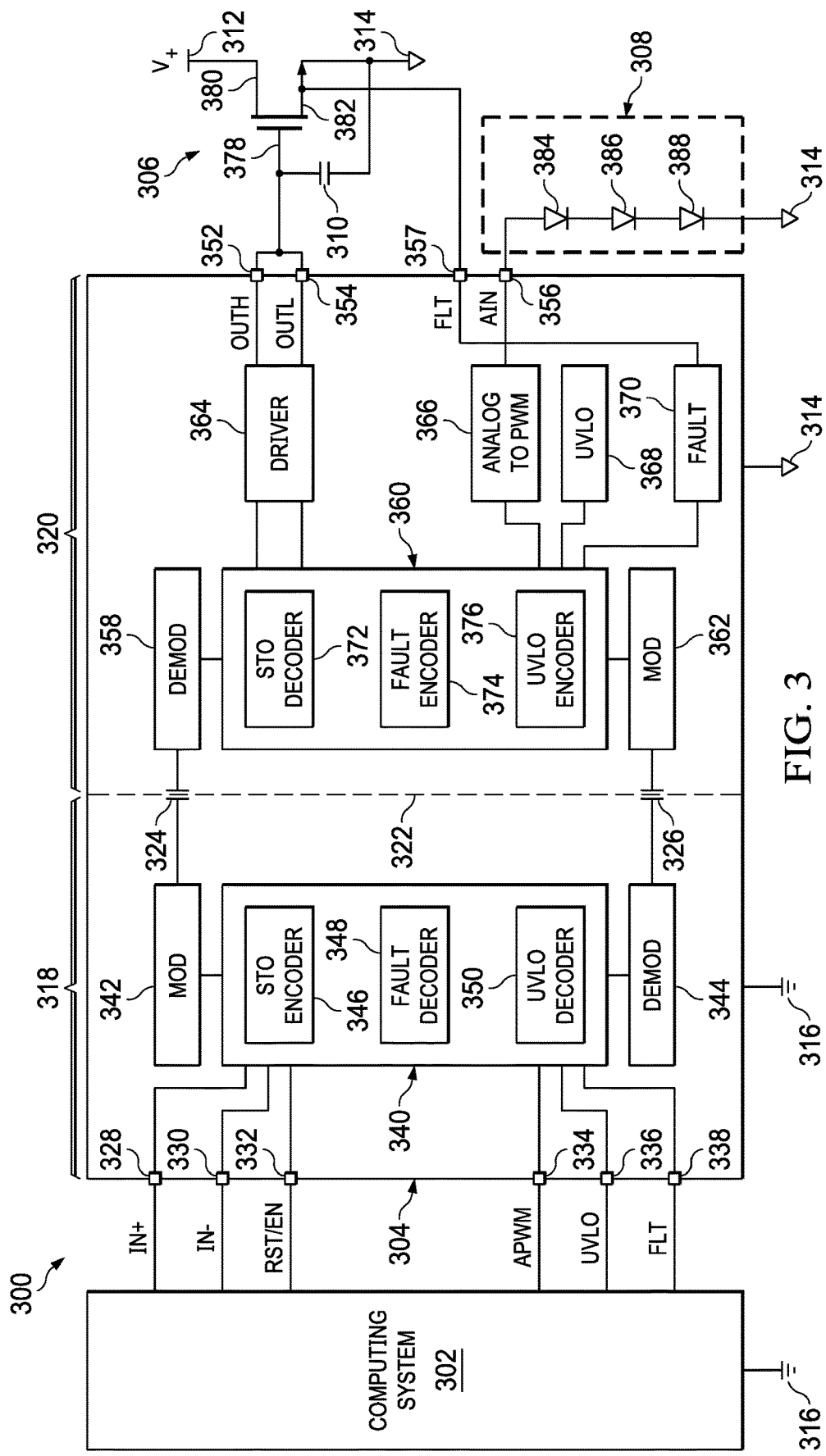
FIG. 3 is a schematic illustration showing an example implementation of the gate driver system of FIG. 1.

FIG. 3 is a schematic illustration showing an example implementation of the gate driver system 100 of FIG. 1. FIG. 3 illustrates an example gate driver system 300 including an example computing system 302, an example isolated gate driver 304, an example switch 306, an example sensor 308, an example biasing device 310, an example voltage supply node 312, an example high voltage reference node 314, and an example low voltage reference node 316.

In the example of FIG. 3, the computing system 302 is coupled to the isolated gate driver 304 and the low voltage reference node 316. The isolated gate driver 304 is coupled to the switch 306, the sensor 308, the biasing device 310, the high voltage reference node 314, and the low voltage reference node 316. The switch 306 is coupled to the biasing device 310, the voltage supply node 312, and the high voltage reference node 314. The sensor 308 is coupled to the isolated gate driver 304 and the high voltage reference node 314.

In the example illustrated in FIG. 3, the low voltage reference node 316 is at a voltage level of zero volts or a voltage level substantially similar thereto. In other examples, the low voltage reference node 316 may be at any suitable voltage level for the application. The high voltage reference node 314 is at a voltage level of zero volts or a voltage level substantially similar thereto. In other examples, the high voltage reference node 314 may be at any suitable voltage level for the application. The voltage supply node 312 is at a voltage level, $V_+$, of, for example, 800 volts. In other examples, the voltage supply node 312 may be at any suitable voltage level for the application.

In FIG. 3, the switch 306 includes an example gate 378, an example drain 380 (e.g., a current terminal), and an example source 382 (e.g., a current terminal). The sensor 308 includes an example first diode 384, an example second diode 386, and an example third diode 388.

In the example of FIG. 3, the computing system 302 is a device that controls, monitors, and/or otherwise manages the switch operations of the switch 306 to regulate the flow of current from the voltage supply node 312 to the high voltage reference node 314. More specifically, the computing system 302 may generate one or more signals to control the isolated gate driver 304 and/or the switch 306 and/or sense one or more signals indicative of the operating conditions of the isolated gate driver 304 and/or the switch 306. For example, the computing system 302 is a microcontroller that can transmit, to the isolated gate driver 304, signals to control the switching operations of the switch 306. Additionally, the computing system 302 can monitor the switch 306 via signals received from the isolated gate driver 304. In other examples, the computing system 302 may be implemented by a DSP or any other suitable processing element. Alternatively, the computing system 302 may be implemented using hardware logic, machine readable instructions, hardware implemented state machines, etc., and/or a combination thereof.

In the illustrated example of FIG. 3, the isolated gate driver 304 is a device that amplifies low power input signals from the computing system 302 and produces a high current output to drive (e.g., enable) the switch 306. The isolated gate driver 304 additionally facilitates the monitoring of the switch 306 by the computing system 302. In FIG. 3, the example isolated gate driver 304 includes an example low voltage stage 318, an example high voltage stage 320, and an example isolation barrier 322. The example isolation barrier 322 includes an example first capacitor 324 and an example second capacitor 326. Additionally or alternatively, in some examples the isolated gate driver 304 includes the sensor 308.

In the examples disclosed herein, the low voltage stage 318 is implemented on a first die (e.g., a silicon die) separate from the high voltage stage 320, within the isolated gate driver 304. The high voltage stage 320 is implemented on a second die (e.g., a silicon die) separate from the low voltage stage 318, within the isolated gate driver 304. In other examples, the low voltage stage 318 and the high voltage stage 320 may be implemented on a single die (e.g., a silicon die) within the isolated gate driver 304. In further examples, the low voltage stage 318 may be implemented on a plurality of dies (e.g., silicon dies) within the isolated gate driver 304. In additional examples, the high voltage stage 320 may be implemented on a plurality of dies (e.g., silicon dies) within the isolated gate driver 304. Alternatively, in some examples, the isolated gate driver 304 and/or any of the components shown in the isolated gate driver 304 may be implemented on a plurality of integrated circuits and/or any plurality of dies (e.g., silicon dies).

In the illustrated example of FIG. 3, the isolation barrier 322 is a capacitive isolation barrier that includes the first capacitor 324 and the second capacitor 326. In the example of FIG. 3, the first capacitor 324 can be implemented by a 70 femtofarad (fF) capacitor and the second capacitor 326 can be implemented by a 70 fF capacitor. In some examples, the first capacitor 324 can be implemented by any suitable capacitive value (50 fF, 25 fF, 35 fF, etc.) to implement the isolation barrier 322. In additional or alternative examples, the second capacitor 326 can be implemented by any suitable capacitive value (50 fF, 25 fF, 35 fF, etc.) to implement the isolation barrier 322. The isolation barrier 322 ensures that the electrical grounds between the low voltage stage 318 and the high voltage stage 320 are separated. In some examples disclosed herein, the isolation barrier 322 may be implemented as an inductive isolation barrier, an optocoupled isolation barrier, or any other suitable isolation barrier.

In some examples, the first capacitor 324 can be implemented as a first capacitor included in the low voltage stage 318 coupled to a second capacitor included in the high voltage stage 320 and the second capacitor 326 can be implemented as a first capacitor included in the high voltage stage 320 coupled to a second capacitor included in the low voltage stage 318. In additional or alternative examples, the first capacitor 324 and the second capacitor 326 can be implemented on a third die that is separate from the low voltage stage 318 and the high voltage stage 320. In further examples, the first capacitor 324 and the second capacitor 326 can be implemented on the low voltage stage 318. In additional or alternative examples, the first capacitor 324 and the second capacitor 326 can be implemented on the high voltage stage 320. In some examples, the first capacitor 324 can be implemented on the low voltage stage 318 and the second capacitor 326 can be implemented on the high voltage stage 320. In additional or alternative examples, the first capacitor 324 can be implemented on the high voltage stage 320 and the second capacitor 326 can be implemented on the low voltage stage 318.

In the example of FIG. 3, the example low voltage stage 318 includes an example first pin 328, an example second pin 330, an example third pin 332, an example fourth pin 334, an example fifth pin 336, an example sixth pin 338, an example low voltage stage signal converter 340, an example low voltage stage modulator 342, and an example low voltage stage demodulator 344. The example low voltage stage signal converter 340 includes an example STO encoder 346, an example fault decoder 348, and an example UVLO decoder 350.

In the illustrated example of FIG. 3, the high voltage stage 320 includes an example seventh pin 352, an example eighth pin 354, an example ninth pin 356, an example tenth pin 357, an example high voltage stage demodulator 358, an example high voltage stage signal converter 360, an example high voltage stage modulator 362, an example driver 364, an example APWM signal generator 366, an example UVLO sensor 368, and an example fault sensor 370.

In the example of FIG. 3, each of the first pin 328, the second pin 330, the third pin 332, the fourth pin 334, the fifth pin 336, and the sixth pin 338 is coupled to the computing system 302 and the low voltage stage signal converter 340. For example, the first pin 328 may receive an example first signal IN+ from the computing system 302, the second pin 330 may receive an example second signal IN− from the computing system 302, and the third pin 332 may receive an example third signal RST/EN from the computing system 302. For example, the isolated gate driver 304 can be configured such that the isolated gate driver 304 is disabled prior to receiving a logic high value as the third signal RST/EN. The isolated gate driver 304 is additionally configured such that when receiving subsequent logic low values as the third signal RST/EN, the isolated gate driver 304 implements STO of the switch 306. The low voltage stage signal converter 340 is coupled to the first pin 328, the second pin 330, the third pin 332, the fourth pin 334, the fifth pin 336, the sixth pin 338, the low voltage stage modulator 342, and the low voltage stage demodulator 344. Additionally, the fourth pin 334 may receive an example fourth signal APWM from the low voltage stage signal converter 340, the fifth pin 336 may receive an example fifth signal UVLO from the low voltage stage signal converter 340, and the sixth pin 338 may receive an example sixth signal FLT from the low voltage stage signal converter 340. The low voltage stage modulator 342 and the low voltage stage demodulator 344 are coupled to the low voltage stage signal converter 340 and respectively to the first capacitor 324, and the second capacitor 326.

In the illustrated example of FIG. 3, the low voltage stage modulator 342 is one or more circuits configured to modulate signals generated by the low voltage stage signal converter 340. In examples disclosed herein, the low voltage stage modulator 342 modulates signals generated by the low voltage stage signal converter 340 to a frequency value high enough to pass through the isolation barrier 322 (e.g., 500 MHz). For example, the low voltage stage modulator 342 can implement on-off keying to modulate signals generated by the low voltage stage signal converter 340. In other examples, the low voltage stage modulator 342 can implement any suitable modulation scheme.

In the illustrated example of FIG. 3, the low voltage stage demodulator 344 is one or more circuits configured to demodulate signals received from the high voltage stage 320 via the second capacitor 326. For example, the low voltage stage demodulator 344 can implement on-off keying to demodulate signals received from the high voltage stage modulator 362 via the second capacitor 326. In other examples, the low voltage stage demodulator 344 can implement any suitable demodulation scheme.

In the example illustrated in FIG. 3, the low voltage stage signal converter 340 encodes signals to be transmitted across the isolation barrier 322 to the high voltage stage 320 via the first capacitor 324 and/or decodes signals transmitted from the high voltage stage 320 via the second capacitor 326. For example, the STO encoder 346 can encode at least the first signal IN+, the second signal IN−, and the third signal RST/EN generated by, for example, the computing system 302 into a signal to be modulated by the low voltage stage modulator 342 and transmitted across the isolation barrier 322 to the high voltage stage 320 via the first capacitor 324. Additionally, the low voltage stage signal converter 340 decodes signals received from the high voltage stage 320 via the second capacitor 326 (e.g., the low voltage stage signal converter 340 is configured to decode signal received from the high voltage stage 320 via the second capacitor 326). For example, after a signal received from the high voltage stage 320 is demodulated by the low voltage stage demodulator 344, the fault decoder 348 and/or the UVLO decoder 350 can decode a signal received from the low voltage stage demodulator 344 into at least the fourth signal APWM, the fifth signal UVLO, and the sixth signal FLT. In some examples, the low voltage stage signal converter 340 can additionally filter the fourth signal APWM to remove high frequency noise.

In the illustrated example of FIG. 3, each of the seventh pin 352 and the eighth pin 354 are coupled to the driver 364 and the gate 378. The ninth pin 356 is coupled to the APWM signal generator 366 and the sensor 308. The high voltage stage demodulator 358 and the high voltage stage modulator 362 are coupled to the high voltage stage signal converter 360 and respectively to the first capacitor 324, and the second capacitor 326. For example, the seventh pin 352 may receive an example seventh signal OUTH from the driver 364, the eighth pin 354 may receive an example eighth signal OUTL from the driver 364, and the ninth pin 356 may receive an example ninth signal AIN from the sensor 308. The high voltage stage signal converter 360 is coupled to the high voltage stage demodulator 358, the high voltage stage modulator 362, the driver 364, the APWM signal generator 366, the UVLO sensor 368, and the fault sensor 370.

In the illustrated example of FIG. 3, the high voltage stage demodulator 358 is one or more circuits configured to demodulate signals received from the low voltage stage 318 via the first capacitor 324. For example, the high voltage stage demodulator 358 can implement on-off keying to demodulate signals received from the low voltage stage modulator 342 via the first capacitor 324. In other examples, the high voltage stage demodulator 358 can implement any suitable demodulation scheme.

In the illustrated example of FIG. 3, the high voltage stage modulator 362 is one or more circuits configured to modulate signals generated by the high voltage stage signal converter 360. In examples disclosed herein, the high voltage stage modulator 362 modulates signals generated by the high voltage stage signal converter 360 to a frequency value high enough to pass through the isolation barrier 322 (e.g., 500 MHz). For example, the high voltage stage modulator 362 can implement on-off keying to modulate signals generated by the high voltage stage signal converter 360. In other examples, the high voltage stage modulator 362 can implement any suitable modulation scheme.

In the example illustrated in FIG. 3, the high voltage stage signal converter 360 encodes signals to be transmitted across the isolation barrier 322 to the low voltage stage 318 via the second capacitor 326 and/or decodes signals transmitted from the low voltage stage 318 via the first capacitor 324 (e.g., the high voltage stage signal converter 360 is configured to decode signals received from the low voltage stage 318 via the first capacitor 324). For example, after a signal received from the low voltage stage 318 is demodulated by the high voltage stage demodulator 358, the STO decoder 372 can decode a signal received from the high voltage stage demodulator 358 into at least a signal corresponding to general operation of the switch 306 and a signal corresponding to STO of the switch 306. The signal corresponding to general operation of the switch 306 and the signal corresponding to STO of the switch 306 control the logic values of the seventh signal OUTH and/or the eighth signal OUTL. Additionally, the high voltage stage signal converter 360 encodes signals to be transmitted across the isolation barrier 322 to the low voltage stage 318 via the second capacitor 326. For example, the fault encoder 374 and/or the UVLO encoder 376 can encode signals received from the APWM signal generator 366, the UVLO sensor 368, and/or the fault sensor 370 into a signal to be modulated by the high voltage stage modulator 362 and transmitted across the isolation barrier 322 to the low voltage stage 318 via the second capacitor 326.

In the illustrated example of FIG. 3, the low voltage stage modulator 342, the first capacitor 324, and the high voltage stage demodulator 358 form a first transmission lane. Additionally, the high voltage stage modulator 362, the second capacitor 326, and the low voltage stage demodulator 344 form a second transmission lane.

In the example of FIG. 3, the driver 364 is at least one circuit that provides high current to the gate 378 and/or the biasing device 310 to cause the switch 306 to conduct and/or cease conducting current from the voltage supply node 312. The driver 364 can implement hard turn off of the switch 306 and/or STO of the switch 306. For example hard turn off may be desirable during general operation and control of the switch 306 while during fault, under voltage, and/or other interrupt conditions, STO may be desirable to prevent damage to the switch 306 and/or the isolated gate driver 304 caused by high voltage overshoot spikes. An example implementation of the driver 364 is discussed in further detail in FIGS. 2A and 2B.

In the illustrated example of FIG. 3, the isolated gate driver 304 is configured to output a logic high value from the seventh pin 352 as the seventh signal OUTH when the isolated gate driver 304 receives a logic high value as the first signal IN+. Additionally, the isolated gate driver 304 is configured to output a logic low value from the eighth pin 354 as the eighth signal OUTL when the isolated gate driver 304 receives a logic high value as the second signal IN−. Furthermore, the isolated gate driver 304 is configured to output a logic low value from the seventh pin 352 and/or eighth pin 354 as the seventh signal OUTH and/or the eighth signal OUTL, respectively, when the isolated gate driver 304 receives a logic low value as the third signal RST/EN.

In FIG. 3, the APWM signal generator 366 is coupled to the ninth pin 356 and the high voltage stage signal converter 360. In the example of FIG. 3, the APWM signal generator 366 can be one or more circuits that are configured to obtain an analog signal (e.g., the ninth signal AIN) corresponding to the temperature of the switch 306 and/or other operating condition of the switch 306 from the ninth pin 356 and converts the analog signal (e.g., the ninth signal AIN) to a digital signal (e.g., a PWM signal) to be transmitted across the isolation barrier 322 to low voltage stage signal converter 340 via the second capacitor 326. The digital signal (e.g., PWM signal) includes a duty cycle that corresponds to the temperature of the switch 306 (e.g., 90% duty cycle corresponds to 200 degrees Fahrenheit). The APWM signal generator 366 can generate the digital signal at a frequency, $f_1$, in the range of 100s of kHz (e.g., in the range of hundreds of kilohertz). For example, the APWM signal generator 366 can generate the digital signal at a frequency of 400 kHz.

In the example of FIG. 3, the UVLO sensor 368 is coupled to the high voltage stage signal converter 360. In the example of FIG. 3, the UVLO sensor 368 can be one or more circuits that sense the supply voltage of the high voltage stage 320 and/or are configured to monitor a voltage value (e.g., the supply voltage) associated with the high voltage stage 320. For example, if the supply voltage to the high voltage stage 320 is less than a threshold voltage (e.g., does not meet a threshold voltage), the UVLO sensor 368 can trigger an under voltage condition and cause the output of the isolated gate driver 304 (e.g., the seventh signal OUTH and/or eighth signal OUTL) to be set to a logic low value. In additional or alternative examples, the UVLO sensor 368 may be coupled to one or more circuits, pins, and/or external devices, circuits, and/or other components to sense the supply voltage of the high voltage stage 320.

In FIG. 3, the fault sensor 370 is coupled to the tenth pin 357 and the high voltage stage signal converter 360. In the example of FIG. 3, the fault sensor 370 can be one or more circuits that sense current flowing through the switch 306 and/or are configured to monitor current flowing through the switch 306. For example, when the current flowing through the switch exceeds a threshold value (e.g., does not meet a threshold value), the fault sensor 370 can trigger an over current condition. In additional or alternative examples, the fault sensor 370 may be coupled to one or more circuits, pins, and/or external devices, circuits, and/or other components to sense the supply voltage of the high voltage stage 320.

In the example illustrated in FIG. 3, the example switch 306 is a n-channel power MOSFET. In alternative examples, the switch 306 may be an IGBT, a GaN transistor, a BJT, and/or any other suitable switching device. The gate 378 is coupled to the seventh pin 352, the eighth pin 354, and the biasing device 310. The drain 380 (e.g., a current terminal) is coupled to the voltage supply node 312. The source 382 (e.g., a current terminal) is coupled to the biasing device 310, the high voltage reference node 314, and the tenth pin 357. In additional or alternative examples, the switch 306 may be a split source SiC MOSFET or a split emitter IGBT.

In the example of FIG. 3, the biasing device 310 is a capacitor that biases the gate-to-source voltage of the switch 306. For example, the driver 364 can charge and/or discharge the voltage of the biasing device 310. In other examples, the biasing device 310 can be a resistor and/or any other suitable biasing device that can be utilized by the driver 364 to control the gate-to-source voltage of the switch 306.

In the example of FIG. 3, the sensor 308 is a device that monitors the temperature of the switch 306 and/or the voltage of the voltage supply node 312. In FIG. 3, the sensor 308 includes the first diode 384, the second diode 386, and the third diode 388. Each of the first diode 384, the second diode 386, and the third diode 388 are temperature sensing diodes.

Figure 4:
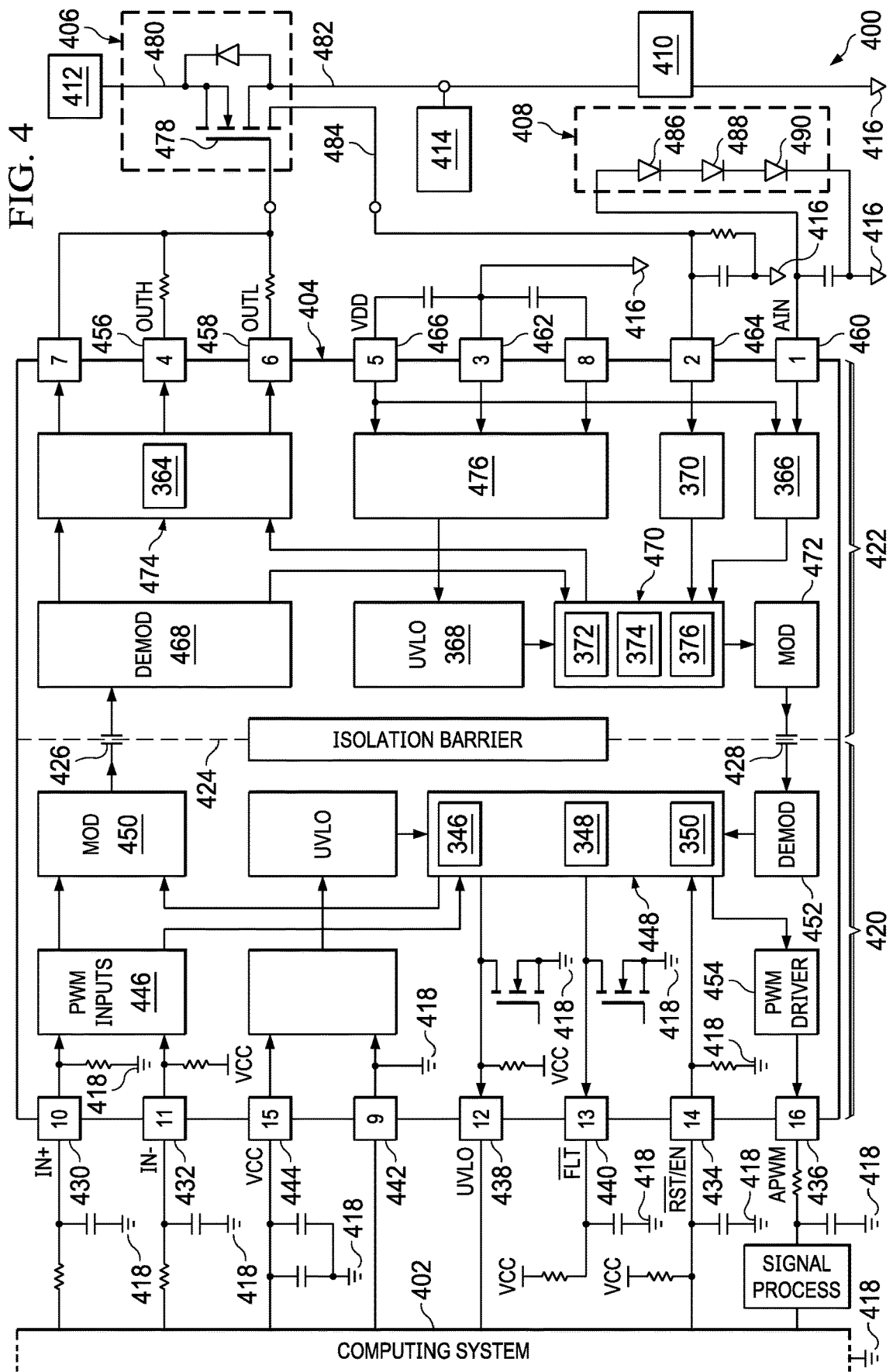
FIG. 4 is a schematic illustration showing an alternative example implementation of the gate driver system of FIG. 1.

FIG. 4 is a schematic illustration showing an alternative example implementation of the gate driver system 100 of FIG. 1. FIG. 4 illustrates an example gate driver system 400 including an example computing system 402, an example isolated gate driver 404, an example switch 406, an example sensor 408, an example intermediate switch 410, an example voltage source 412, an example load 414, an example high voltage reference node 416, and an example low voltage reference node 418.

In the example of FIG. 4, the isolated gate driver 404 is a high-voltage (e.g., 800-volt (V) rating) isolated gate driver to provide power to a high-voltage and/or a high-current load. For example, the gate driver system 400 may be used to provide power to a traction inverter or any other type of electrical device included in an EV, a HEV, etc. Alternatively, the gate driver system 400 may be used to provide power to any other electrical device.

In the illustrated example of FIG. 4, the computing system 402 is coupled to the isolated gate driver 404 and the low voltage reference node 418. The isolated gate driver 404 is coupled to the switch 406, the sensor 408, the high voltage reference node 416, and the low voltage reference node 418. The switch 406 is coupled to the voltage source 412, the intermediate switch 410, and the load 414. The sensor 408 is coupled to the isolated gate driver 404 and the high voltage reference node 416.

In the example illustrated in FIG. 4, the low voltage reference node 418 is at a voltage level of zero volts or a voltage level substantially similar thereto. In other examples, the low voltage reference node 418 may be at any suitable voltage level for the application. The high voltage reference node 416 is at a voltage level of zero volts or a voltage level substantially similar thereto. In other examples, the high voltage reference node 416 may be at any suitable voltage level for the application. In FIG. 4, the voltage source 412 is a battery. Alternatively, the voltage source 412 may be a capacitor, a direct current (DC) voltage source, etc. In the example of FIG. 4, the voltage source 412 is at a voltage level of, for example, 800 volts. In other examples, the voltage source 412 may be at any suitable voltage level for the application.

In the example of FIG. 4, by turning on the switch 406, isolated gate driver 404 provides power to the load 414. The load 414 can be an electric motor, a traction inverter, or any other type of electrical device included in an EV, an HEV, etc. Alternatively, the load 414 may be a battery, a power converter such as a half-bridge power converter (e.g., a boost converter, a buck converter, a buck-boost converter, etc.), etc. In FIG. 4, an example voltage source 412 is coupled to the switch 406.

In FIG. 4, the switch 406 includes an example gate 478, an example drain 480 (e.g., a current terminal), an example first source 482 (e.g., a current terminal), and an example second source 484 (e.g., a current terminal). Together, the first source 482 and the second source 484 form a split source of the switch 406. The sensor 408 includes an example first diode 486, an example second diode 488, and an example third diode 490.

In the example of FIG. 4, the computing system 402 is a device that controls, monitors, and/or otherwise manages the switch operations of the switch 406 to regulate the flow of current from the voltage source 412 to the load 414 and/or the high voltage reference node 416. Additionally, the computing system 402 may generate one or more signals to control the isolated gate driver 404 and/or the switch 406 and/or sense one or more signals indicative of the operating conditions of the isolated gate driver 404 and/or the switch 406. For example, the computing system 402 is a microcontroller that can transmit, to the isolated gate driver 404, signals to control the switching operations of the switch 406. Additionally, the computing system 402 can monitor the switch 406 via signals received from the isolated gate driver 404. In FIG. 4, the computing system 402 can control the isolated gate driver 404 and/or the switch 406 to provide power to the load 414. Moreover, the computing system 402 can control the isolated gate driver 404 and/or the switch 406 to provide a voltage in a range of 400-1000 V, a current in a range of 100-1000 Amperes (A), etc., and/or a combination thereof to the load 414. In other examples, the computing system 402 may be implemented by a DSP or any other suitable processing element. Alternatively, the computing system 402 may be implemented using hardware logic, machine readable instructions, hardware implemented state machines, etc., and/or a combination thereof.

In the illustrated example of FIG. 4, the isolated gate driver 404 is a device that amplifies low power input signals from the computing system 402 and produces a high current output to drive (e.g., enable) the switch 406. The isolated gate driver 404 additionally facilitates the monitoring of the switch 406 by the computing system 402. In FIG. 4, the example isolated gate driver 404 includes an example low voltage stage 420, an example high voltage stage 422, and an example isolation barrier 424. The example isolation barrier 424 includes an example first capacitor 426 and an example second capacitor 428. Additionally or alternatively, in some examples the isolated gate driver 404 includes the sensor 408.

In the example of FIG. 4, the low voltage stage 420 is isolated from the high voltage stage 422 by the isolation barrier 424. For example, an electrical fault that occurs on the example high voltage stage 422 is isolated from affecting (e.g., damaging, conducting current, etc.) the low voltage stage 420. In examples disclosed herein, the isolated gate driver 404 is implemented in an integrated circuit.

In the examples disclosed herein, the low voltage stage 420 is implemented on a first die (e.g., a silicon die) separate from the high voltage stage 422, within the isolated gate driver 404. The high voltage stage 422 is implemented on a second die (e.g., a silicon die) separate from the low voltage stage 420, within the isolated gate driver 404. In other examples, the low voltage stage 420 and the high voltage stage 422 may be implemented on a single die (e.g., a silicon die) within the isolated gate driver 404. In further examples, the low voltage stage 420 may be implemented on a plurality of dies (e.g., silicon dies) within the isolated gate driver 404. In additional examples, the high voltage stage 422 may be implemented on a plurality of dies (e.g., silicon dies) within the isolated gate driver 404. Alternatively, in some examples, the isolated gate driver 404 and/or any of the components shown in the isolated gate driver 404 may be implemented on a plurality of integrated circuits and/or any plurality of dies (e.g., silicon dies).

In the illustrated example of FIG. 4, the isolation barrier 424 is a capacitive isolation barrier that includes the first capacitor 426 and the second capacitor 428. In the example of FIG. 4, the first capacitor 426 can be implemented by a 70 femtofarad (fF) capacitor and the second capacitor 428 can be implemented by a 70 fF capacitor. In some examples, the first capacitor 426 can be implemented by any suitable capacitive value (50 fF, 25 fF, 35 fF, etc.) to implement the isolation barrier 424. In additional or alternative examples, the second capacitor 428 can be implemented by any suitable capacitive value (50 fF, 25 fF, 35 fF, etc.) to implement the isolation barrier 424. The isolation barrier 424 ensures that the electrical grounds between the low voltage stage 420 and the high voltage stage 422 are separated. In some examples disclosed herein, the isolation barrier 424 may be implemented as an inductive isolation barrier, an opto-coupled isolation barrier, or any other suitable isolation barrier.

In some examples, the first capacitor 426 can be implemented as a first capacitor included in the low voltage stage 420 coupled to a second capacitor included in the high voltage stage 422 and the second capacitor 428 can be implemented as a first capacitor included in the high voltage stage 422 coupled to a second capacitor included in the low voltage stage 420. In additional or alternative examples, the first capacitor 426 and the second capacitor 428 can be implemented on a third die that is separate from the low voltage stage 420 and the high voltage stage 422. In further examples, the first capacitor 426 and the second capacitor 428 can be implemented on the low voltage stage 420. In additional or alternative examples, the first capacitor 426 and the second capacitor 428 can be implemented on the high voltage stage 422. In some examples, the first capacitor 426 can be implemented on the low voltage stage 420 and the second capacitor 428 can be implemented on the high voltage stage 422. In additional or alternative examples, the first capacitor 426 can be implemented on the high voltage stage 422 and the second capacitor 428 can be implemented on the low voltage stage 420.

In the example of FIG. 4, the example low voltage stage 420 includes an example first pin 430, an example second pin 432, an example third pin 434, an example fourth pin 436, an example fifth pin 438, an example sixth pin 440, an example seventh pin 442, an example eighth pin 444, an example PWM inputs circuit 446, an example low voltage stage signal converter 448, an example low voltage stage modulator 450, an example low voltage stage demodulator 452, and an example PWM driver 454. The example low voltage stage signal converter 448 includes the example STO encoder 346, the example fault decoder 348, and the example UVLO decoder 350 of FIG. 3.

In the illustrated example of FIG. 4, the high voltage stage 422 includes an example ninth pin 456, an example tenth pin 458, an example eleventh pin 460, an example twelfth pin 462, an example thirteenth pin 464, an example fourteenth pin 466, an example high voltage stage demodulator 468, an example high voltage stage signal converter 470, an example high voltage stage modulator 472, an example output stage circuit 474, an example voltage regulator 476, the example APWM signal generator 366, the example UVLO sensor 368, and the example fault sensor 370. The example high voltage stage signal converter 470 includes the example STO decoder 372, the example fault encoder 374, and the UVLO encoder 376. The example output stage circuit 474 includes the example driver 364.

In the example of FIG. 4, each of the first pin 430 and the second pin 432 are coupled to the computing system 402 and the PWM inputs circuit 446. Each of the third pin 434, the fifth pin 438, and the sixth pin 440, is coupled to the computing system 402 and the low voltage stage signal converter 448. Additionally, the fourth pin 436 is coupled to the computing system 402 and the PWM driver 454. The seventh pin 442 is coupled to the low voltage reference node 418 and the eighth pin 444 is coupled to a voltage supply generated by the computing system 402.

In the example of FIG. 4, the first pin 430 may receive an example first signal IN+ from the computing system 402, the second pin 432 may receive an example second signal IN− from the computing system 402, and the third pin 434 may receive an example third signal RST/EN from the computing system 402. For example, the isolated gate driver 404 can be configured such that the isolated gate driver 404 is disabled prior to receiving a logic high value as the third signal RST/EN. The isolated gate driver 404 is additionally configured such that when receiving subsequent logic low values as the third signal RST/EN, the isolated gate driver 404 implements STO of the switch 406. Additionally, the fourth pin 436 may receive an example fourth signal APWM from the PWM driver 454, the fifth pin 438 may receive an example fifth signal UVLO from the low voltage stage signal converter 448, and the sixth pin 440 may receive an example sixth signal FLT from the low voltage stage signal converter 448.

In the illustrated example of FIG. 4, the PWM inputs circuit 446 is coupled to the first pin 430, the second pin 432, the low voltage stage modulator 450, and the low voltage stage signal converter 448. The PWM inputs circuit 446 generates and transmits a PWM signal (e.g., a PWM signal based on the first signal IN+ and/or the second signal IN−) to the low voltage stage signal converter 448 and/or the low voltage stage modulator 450 to encode and/or modulate the PWM signals. In some examples, the second signal may be held at a logic low value (e.g., 0 volts, '0', etc.) and the first signal IN+ may be alternated between a logic high value (e.g., 3.3 volts, '1', etc.) and a logic low value where a logic high value on the first signal IN+ corresponds to enabling the switch 406 and a logic low value on the first signal IN+ corresponds to disabling the switch. In additional or alternative examples, the first signal IN+ may be held at a logic high value and the second signal IN− may be alternated between a logic low value and a logic high value where a logic high value on the second signal IN− corresponds to disabling the switch 406 and a logic low value on the second signal IN− corresponds to enabling the switch 406. In FIG. 4, regardless of the configuration of the first signal IN+ and the second signal IN−, the PWM inputs circuit 446 is configured to combine the logic values received at the first pin 430 and the second pin 432 into a combined PWM control signal at a frequency $f_1$ (e.g., 50 Kilohertz (kHz)-2 Megahertz (MHz)).

In FIG. 4, the low voltage stage signal converter 448 is coupled to the third pin 434, the fifth pin 438, the sixth pin 440, the PWM inputs circuit 446, the low voltage stage modulator 450, the low voltage stage demodulator 452, and the PWM driver 454. The low voltage stage modulator 450 is coupled to first capacitor 426, the PWM inputs circuit 446, and the low voltage stage signal converter 448. The low voltage stage demodulator 452 is coupled to the second capacitor 428 and the low voltage stage signal converter 448.

In the illustrated example of FIG. 4, the low voltage stage modulator 450 is one or more circuits configured to modulate signals generated by the low voltage stage signal converter 448 and/or the PWM inputs circuit 446. In examples disclosed herein, the low voltage stage modulator 450 modulates signals generated by the low voltage stage signal converter 448 and/or the PWM inputs circuit 446 to a frequency value high enough to pass through the isolation barrier 424 (e.g., 500 MHz). For example, the low voltage stage modulator 450 can implement on-off keying to modulate signals generated by the low voltage stage signal converter 448. In other examples, the low voltage stage modulator 450 can implement any suitable modulation scheme.

In the illustrated example of FIG. 4, the low voltage stage demodulator 452 is one or more circuits configured to demodulate signals received from the high voltage stage 422 via the second capacitor 428. For example, the low voltage stage demodulator 452 can implement on-off keying to demodulate signals received from the high voltage stage modulator 472 via the second capacitor 428. In other examples, the low voltage stage demodulator 452 can implement any suitable demodulation scheme. In the illustrated example of FIG. 4, the PWM driver 454 is coupled to the fourth pin 436 and the low voltage stage signal converter 448.

In the example illustrated in FIG. 4, the low voltage stage signal converter 448 encodes signals to be transmitted across the isolation barrier 424 to the high voltage stage 422 via the first capacitor 426 and/or decodes signals transmitted from the high voltage stage 422 via the second capacitor 428. For example, the STO encoder 346 can encode at least the first signal IN+, the second signal IN−, a combination of the first signal IN+ and the second signal IN−, and the third signal RST/EN generated by, for example, the computing system 402 into a signal to be modulated by the low voltage stage modulator 450 and transmitted across the isolation barrier 424 to the high voltage stage 422 via the first capacitor 426. Additionally, the low voltage stage signal converter 448 decodes signals received from the high voltage stage 422 via the second capacitor 428 (e.g., the low voltage stage signal converter 448 is configured to decode signal received from the high voltage stage 422 via the second capacitor 428). For example, after a signal received from the high voltage stage 422 is demodulated by the low voltage stage demodulator 452, the fault decoder 348 and/or the UVLO decoder 350 can decode a signal received from the low voltage stage demodulator 452 into at least the fourth signal APWM, the fifth signal UVLO, and the sixth signal FLT. In some examples, the low voltage stage signal converter 448 can additionally filter the fourth signal APWM to remove high frequency noise.

In the illustrated example of FIG. 4, PWM driver 454 is one or more circuits configured to drive the fourth signal APWM received from the low voltage stage signal converter 448. For example, the PWM driver 454 can be implemented by one or more amplifiers. Additionally, in some examples, the PWM driver 454 may additionally include an RC filter to filter high frequency signals from the fourth signal APWM and/or average the fourth signal APWM. In the illustrated example of FIG. 4, the PWM driver 454 is coupled to the fourth pin 436 and the low voltage stage signal converter 448.

In the illustrated example of FIG. 4, each of the ninth pin 456 and the tenth pin 458 are coupled to the output stage circuit 474 and the gate 478. The eleventh pin 460 is coupled to the APWM signal generator 366 and the sensor 408. The twelfth pin 462 is coupled to the high voltage reference node 416 and the voltage regulator 476. The thirteenth pin 464 is coupled to the second source 484 and the fault sensor 370. The fourteenth pin 466 is coupled to a voltage source different than the computing system 402. For example, the ninth pin 456 may receive an example seventh signal OUTH from the output stage circuit 474 and/or the driver 364, the tenth pin 458 may receive an example eighth signal OUTL from the output stage circuit 474 and/or the driver 364, and the eleventh pin 460 may receive an example ninth signal AIN from the sensor 308.

In the example of FIG. 4, the high voltage stage demodulator 468 is coupled to the high voltage stage signal converter 470, the output stage circuit 474, and the first capacitor 426. The high voltage stage modulator 472 is coupled to the high voltage stage signal converter 470 and the second capacitor 428. The high voltage stage signal converter 470 is coupled to the high voltage stage demodulator 468, the high voltage stage modulator 472, the output stage circuit 474, the APWM signal generator 366, the UVLO sensor 368, and the fault sensor 370.

In the illustrated example of FIG. 4, the high voltage stage demodulator 468 is one or more circuits configured to demodulate signals received from the low voltage stage 420 via the first capacitor 426. For example, the high voltage stage demodulator 468 can implement on-off keying to demodulate signals received from the low voltage stage modulator 450 via the first capacitor 426. In other examples, the high voltage stage demodulator 468 can implement any suitable demodulation scheme. In the illustrated example of FIG. 4, the high voltage stage modulator 472 is one or more circuits configured to modulate signals generated by the high voltage stage signal converter 470. In examples disclosed herein, the high voltage stage modulator 472 modulates signals generated by the high voltage stage signal converter 470 to a frequency value high enough to pass through the isolation barrier 424 (e.g., 500 MHz). For example, the high voltage stage modulator 472 can implement on-off keying to modulate signals generated by the high voltage stage signal converter 470. In other examples, the high voltage stage modulator 472 can implement any suitable modulation scheme.

In the example illustrated in FIG. 4, the high voltage stage signal converter 470 encodes signals to be transmitted across the isolation barrier 424 to the low voltage stage 420 via the second capacitor 428 and/or decodes signals transmitted from the low voltage stage 420 via the first capacitor 426 (e.g., the high voltage stage signal converter 470 is configured to decode signals received from the low voltage stage 420 via the first capacitor 426). For example, after a signal received from the low voltage stage 420 is demodulated by the high voltage stage demodulator 468, the STO decoder 372 can decode a signal received from the high voltage stage demodulator 468 into at least a signal corresponding to general operation of the switch 406 and a signal corresponding to STO of the switch 406. The signal corresponding to general operation of the switch 406 and the signal corresponding to STO of the switch 406 control the logic values of the seventh signal OUTH and/or the eighth signal OUTL. Additionally, the high voltage stage signal converter 470 encodes signals to be transmitted across the isolation barrier 424 to the low voltage stage 420 via the second capacitor 428. For example, the fault encoder 374 and/or the UVLO encoder 376 can encode signals received from the APWM signal generator 366, the UVLO sensor 368, and/or the fault sensor 370 into a signal to be modulated by the high voltage stage modulator 472 and transmitted across the isolation barrier 424 to the low voltage stage 420 via the second capacitor 428.

In the illustrated example of FIG. 4, the low voltage stage modulator 450, the first capacitor 426, and the high voltage stage demodulator 468 form a first transmission channel (e.g., a transmission lane). Additionally, the high voltage stage modulator 472, the second capacitor 428, and the low voltage stage demodulator 452 form a second transmission channel.

In the example of FIG. 4, the APWM signal generator 366 is coupled to the eleventh pin 460 and the high voltage stage signal converter 470. The APWM signal generator 366 is one or more circuits that are configured to obtain an analog signal (e.g., the ninth signal AIN) corresponding to the temperature of the switch 406 and/or other operating condition of the switch 406 from the eleventh pin 460 and converts the analog signal (e.g., the ninth signal AIN) to a digital signal (e.g., a PWM signal) to be transmitted across the isolation barrier 424 to low voltage stage signal converter 448 via the second capacitor 428. The digital signal (e.g., PWM signal) includes a duty cycle that corresponds to the temperature of the switch 406 (e.g., 90% duty cycle corresponds to 200 degrees Fahrenheit).

In the example of FIG. 4, the UVLO sensor 368 is coupled to the voltage regulator 476 and the high voltage stage signal converter 470. The UVLO sensor 368 is one or more circuits that sense the supply voltage of the high voltage stage 422. For example, if the supply voltage to the high voltage stage 422 is less than a threshold voltage (e.g., does not meet a threshold voltage), the UVLO sensor 368 can trigger an under voltage condition and cause the output of the isolated gate driver 404 (e.g., the seventh signal OUTH and/or eighth signal OUTL) to be set to a logic low value.

In the example of FIG. 4, the fault sensor 370 is coupled to the thirteenth pin 464 and the high voltage stage signal converter 470. The fault sensor 370 is one or more circuits that sense current flowing through the switch 406. For example, when the current flowing through the switch 406 exceeds a threshold value (e.g., does not meet a threshold value), the fault sensor 370 can trigger an over current condition.

In the example of FIG. 4, the output stage circuit 474 includes any number of gate drivers (e.g., the driver 364) to turn on and/or turn off the switch 406. For example, the output stage circuit 474 may include an example high-side gate driver to turn on the switch 406 and an example low-side gate driver to turn off the switch 406. The output stage circuit 474 processes signals that have been demodulated by the high voltage stage demodulator 468 and decoded by the high voltage stage signal converter 470 to facilitate operation of at the switch 406. For example, the computing system 402 may generate one or more control signals in response to the output of at least one of the fourth pin 436, the fifth pin 438, or the sixth pin 440 to facilitate operation of the switch 406. In examples disclosed herein, the switching conditions (e.g., the switching speed, total overshoot) of the one or more control signals generated by the computing system 402 are improved (e.g., the undesirable switching speed or turn-on time occurring because of frequency compensation is reduced) based on the output of one or more of the fourth pin 436, the fifth pin 438, the sixth pin 440.

In the example of FIG. 4, the voltage regulator 476 is coupled to the twelfth pin 462, the fourteenth pin 466, and the UVLO sensor 368. In the example of FIG. 4, the voltage regulator 476 is a low dropout regulator that regulates the voltage supplies to the high voltage stage 422. For example, the voltage regulator 476 regulates the difference between the supply voltage to the high voltage stage 422 and the high voltage reference node 416.

In the illustrated example of FIG. 4, sensor 408 is coupled in proximity to the switch 406 (e.g., 1 millimeter apart, 1 micrometer apart, etc.). In the example of FIG. 4, the sensor 408 is a device that monitors the temperature of the switch 406 and/or the voltage of the voltage source 412. Each of the first diode 384, the second diode 386, and the third diode 388 are temperature sensing diodes. In operation, the sensor 408 senses and/or otherwise generates a signal (e.g., a voltage at the example first, second, and third diodes 486, 488, 490) representative of the temperature of the switch 406. Furthermore, the sensor 408 is coupled to the eleventh pin 460. In other examples disclosed herein, the sensor 408 may be implemented as any suitable temperature sensing device (e.g., a thermocouple, a thermally sensitive resistor, a resistance temperature detector (RTD), etc.).

In the illustrated example of FIG. 4, the isolated gate driver 404 is configured to output a logic high value from the ninth pin 456 as the seventh signal OUTH when the isolated gate driver 404 receives a logic high value as the first signal IN+ and/or output a logic low value from the tenth pin 458 as the eighth signal OUTL when the isolated gate driver 404 receives a logic low value as the first signal IN+. Additionally, the isolated gate driver 404 is configured to output a logic low value from the tenth pin 458 as the eighth signal OUTL when the isolated gate driver 404 receives a logic high value as the second signal IN−. Furthermore, the isolated gate driver 404 is configured to output a logic low value from the ninth pin 456 and/or tenth pin 458 as the seventh signal OUTH and/or the eighth signal OUTL, respectively, when the isolated gate driver 404 receives a logic low value as the third signal RST/EN.

In the example illustrated in FIG. 4, the example switch 406 is a n-channel SiC power MOSFET with a split source. In alternative examples, the switch 306 may be an IGBT, a GaN transistor, a BJT, and/or any other suitable switching device. The gate 478 is coupled to the ninth pin 456 and the tenth pin 458. The drain 480 (e.g., a current terminal) is coupled to the voltage source 412. The first source 482 (e.g., a current terminal) is coupled to the intermediate switch 410. The second source 484 (e.g., a current terminal) is coupled to the thirteenth pin 464. Together the first source 482 and the second source 484 form the split source of the switch 406. In additional or alternative examples, the switch 406 may be a split emitter IGBT.

Figure 5:
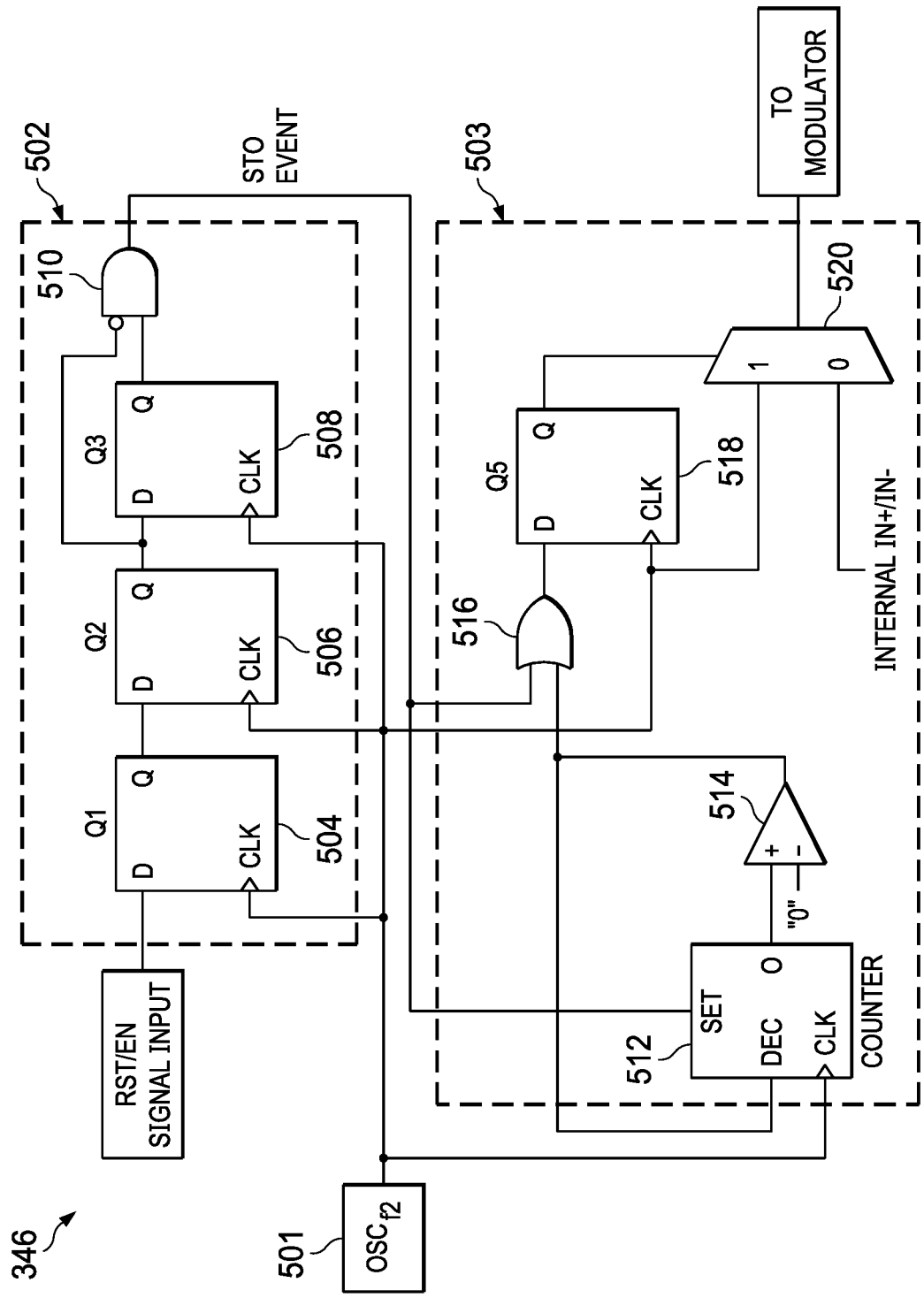
FIG. 5 is a schematic illustration of an example implementation of the STO encoder of FIGS. 3 and 4.

FIG. 5 is a schematic illustration of an example implementation of the STO encoder 346 of FIGS. 3 and 4. The STO encoder 346 is configured to receive a RST/EN signal input and a PWM control signal input, and output an encoded signal including at least one encoded STO event and the PWM control signal. The STO encoder 346 is to operate based an example oscillator 501 that is configured to operate at a frequency, $f_2$. Moreover, the STO encoder 346 is configured to encode 64 clock cycles of the oscillator 501 into the encoded signal. The STO encoder 346 transmits the encoded signal by encoding into the PWM control signal 64 clock cycles of the oscillator 501. The STO encoder 346 includes the oscillator 501, an example falling edge detector 502, and an example signal multiplexer 503. The example falling edge detector 502 includes an example first logic circuit 504, an example second logic circuit 506, an example third logic circuit 508, and an example first logic gate 510. The example signal multiplexer 503 includes an example fourth logic circuit 512, an example comparator 514, an example second logic gate 516, an example fifth logic circuit 518, and an example sixth logic circuit 520.

In the example of FIG. 5, the oscillator 501 is coupled to the first logic circuit 504, the second logic circuit 506, the third logic circuit 508, the fourth logic circuit 512, the fifth logic circuit 518, and the sixth logic circuit 520. The oscillator 501 is, for example, a device that controls the operating frequency of the STO encoder 346 and sets the frequency at which to encode an STO event. In the illustrated example of FIG. 5, the oscillator 501 is a resistor capacitor (RC) oscillator. In other examples, the oscillator 501 is a ring oscillator, a crystal oscillator, a phase locked loop oscillator, or any other suitable oscillator for the application. The oscillator 501 generates a clock signal at a desired frequency (e.g., a frequency $f_2$, in the range of 10s of MHz (e.g., in the range of hundreds of megahertz), etc.).

In the illustrated example of FIG. 5, each of the first logic circuit 504 (e.g., Q1), the second logic circuit 506 (e.g., Q2), the third logic circuit 508 (e.g., Q3), and the fifth logic circuit (e.g., Q4) is a D flip-flop and includes a first input (e.g., D), a second input (e.g., CLK), and an output (e.g., Q). In the example of FIG. 5, the first input of the first logic circuit 504 is coupled to the RST/EN signal input. For example, the first input of the first logic circuit 504 is coupled to the third pin 332 of FIG. 3. In other examples, the first input of the first logic circuit 504 is coupled to the third pin 434 of FIG. 4. The second input of the first logic circuit 504 is coupled to the oscillator 501, and the output of the first logic circuit 504 is coupled to the first input of second logic circuit 506.

In the example of FIG. 5, the first logic circuit 504 receives the RST/EN signal and the output of the oscillator 501. In this manner, the output of the first logic circuit 504 is set by the RST/EN signal at the rising edge of the signal at the output of the oscillator 501. The output of the first logic circuit 504 is updated with the logic value on the RST/EN signal at the frequency of the signal output from the oscillator 501.

In the illustrated example of FIG. 5, the first input of the second logic circuit 506 is coupled to the output of the first logic circuit 504. The second input of the second logic circuit 506 is coupled to the oscillator 501, and the output of the second logic circuit 506 is coupled to the first input of the third logic circuit 508 and the first logic gate 510. In the example of FIG. 5, the second logic circuit 506 receives the output of the first logic circuit 504 and the output of the oscillator 501. In this manner, the output of the second logic circuit 506 is set by the output of the first logic circuit 504 at the rising edge of the signal at the output of the oscillator 501. The output of the second logic circuit 506 is updated with the logic value of the output of the first logic circuit 504 at the frequency of the signal output from the oscillator 501.

In the illustrated example of FIG. 5, the first input of the third logic circuit 508 is coupled to the output of the second logic circuit 506. The second input of the third logic circuit 508 is coupled to the oscillator 501, and the output of the third logic circuit 508 is coupled to the first input of the first logic gate 510. In the example of FIG. 5, the third logic circuit 508 receives the output of the second logic circuit 506 and the output of the oscillator 501. In this manner, the output of the third logic circuit 508 is set by the output of the second logic circuit 506 at the rising edge of the signal at the output of the oscillator 501. The output of the third logic circuit 508 is updated with the logic value of the output of the second logic circuit 506 at the frequency of the signal output from the oscillator 501.

In the illustrated example of FIG. 5, the first logic gate 510 is an AND gate with one terminal inverted and includes a first input, a second input, and an output. In the example of FIG. 5, the first input of the first logic gate 510 is inverted and coupled to the output of the second logic circuit 506, the second input of the first logic gate 510 is coupled to the output of the third logic circuit 508, and the output of the first logic gate 510 is coupled to the fourth logic circuit 512 and the second logic gate 516. In operation, the first logic gate 510 outputs a logic high value when the output of the third logic circuit 508 is a logic high value and the output of the second logic circuit 506 is a logic low value.

In the illustrated example of FIG. 5, the fourth logic circuit 512 is a counter including a first input (e.g., DEC), a second input (e.g., CLK), a third input (e.g., SET), and an output (e.g., O). The first input of the fourth logic circuit 512 is coupled to the comparator 514, the second input of the fourth logic circuit 512 is coupled to the oscillator 501, the third input of the fourth logic circuit 512 is coupled to the output of the first logic gate 510, and the output of the fourth logic circuit 512 is coupled to the comparator 514. In the example of FIG. 5, the fourth logic circuit 512 is a 7-bit counter that is initialized with a logic value corresponding to a decimal value of 64 at the rising edge of the signal at the output of the comparator 514. The count value of the fourth logic circuit 512 is set a binary value corresponding to a decimal value of 64 when there is a logic high value at the output of the first logic gate 510 at the rising edge of the signal at the output of the oscillator 501.

In the example of FIG. 5, in operation, the output of the fourth logic circuit 512 starts at a binary value corresponding to a decimal value of 64. For example, the binary value corresponding to the decimal value of 64 can correspond to a predetermined number of rising edges of the signal at the output of the oscillator 501. At each rising edge of the signal at the output of the oscillator 501, the output of the fourth logic circuit 512 is updated based on the output of the comparator 514. For example, when the output of the comparator 514 is a logic high value, the output of the fourth logic circuit 512 can be decremented. In the example illustrated in FIG. 5, the fourth logic circuit 512 may be implemented by one or more combinational logic circuit and/or one or more sequential logic circuits that decrements from a predetermined number to control the number of clock cycles encoded into a signal for an STO event. For example, the fourth logic circuit 512 may be implemented as a ripple counter using 7 D flip-flops.

In the example of FIG. 5, the comparator 514 is a digital comparator that compares the output of the fourth logic circuit 512 to a logic value corresponding to a decimal value of 0. The comparator 514 of FIG. 5 includes a first input, a second input, and an output. The first input of the comparator 514 corresponds to a non-inverting input of the comparator 514 while the second input of the comparator 514 corresponds to an inverting input of the comparator 514. The first input of the comparator 514 is coupled to the output of the fourth logic circuit 512, the second input of the comparator 514 is coupled to the logic value corresponding to the decimal value of 0, and the output of the comparator 514 is coupled to the second logic gate 516 and the first input of the fourth logic circuit 512.

In the illustrated example of FIG. 5, in operation, the comparator 514 compares the output of the fourth logic circuit 512 to the logic value corresponding to the decimal value of 0. When the output of the fourth logic circuit 512 is greater than the logic value corresponding to the decimal value of 0 (e.g., when the output of the fourth logic circuit 512 meets a predetermined number), the comparator 514 outputs a logic high value. When the output of the fourth logic circuit 512 is less than the logic value corresponding to the decimal value of 0, the comparator 514 outputs a logic low value.

In the examples disclosed herein, the frequency of the oscillator 501 is much greater than the frequency of the PWM input control signal (e.g., the frequency $f_2 \gg$ the frequency $f_1$). Additionally, in examples disclosed herein, the value of the frequency of the oscillator 501 (e.g., the frequency $f_2$) has a direct relationship with the speed at which the STO decoder 372 can detect an STO event. For example, higher frequency of the oscillator 501 (e.g., the frequency $f_2$) corresponds to faster detection of STO events by the STO decoder 372. In the examples disclosed herein, the frequency of the oscillator 501 (e.g., the frequency $f_2$, 10s of MHz) corresponds to detection time of 100s of nanoseconds. The upper threshold for the frequency of the oscillator 501 (e.g., the frequency $f_2$) is set by the frequency of operation of one or more of the low voltage stage modulator 342, the first capacitor 324, or the high voltage stage demodulator 358 of FIG. 3 and/or the low voltage stage modulator 450, the first capacitor 426, or the high voltage stage demodulator 468 of FIG. 4.

In the illustrated example of FIG. 5, the second logic gate 516 is an OR gate and includes a first input, a second input, and an output. In the example of FIG. 5, the first input of the second logic gate 516 is coupled to the output of the first logic gate 510, the second input of the second logic gate 516 is coupled to the output of the comparator 514, and the output of the second logic gate 516 is coupled to the first input of the fifth logic circuit 518. In operation, the second logic gate 516 outputs a logic high value when the output of the first logic gate 510 and/or the output of the comparator 514 is a logic high value.

In the example of FIG. 5, the first input of the fifth logic circuit 518 is coupled to the output of the second logic gate 516. The second input of the fifth logic circuit 518 is coupled to the oscillator 501, and the output of the fifth logic circuit 518 is coupled to the sixth logic circuit 520. In the example of FIG. 5, the fifth logic circuit 518 receives the output of the second logic gate 516 and the output of the oscillator 501. In this manner, the output of the fifth logic circuit 518 is set by the output of the second logic gate 516 at the rising edge of the signal at the output of the oscillator 501. The output of the fifth logic circuit 518 is updated with the logic value of the output of the second logic gate at the frequency of the signal output from the oscillator 501.

In the illustrated example of FIG. 5, the sixth logic circuit 520 is a 2 to 1 multiplexer that includes a first input, a second input, a third input, and an output. In FIG. 5, the first input of the sixth logic circuit 520 is coupled to the output of the oscillator 501, the second input of the sixth logic circuit 520 is coupled to the PWM control signal input, the third input of the sixth logic circuit 520 is coupled to the output of the fifth logic circuit 518, and the output of the sixth logic circuit 520 is coupled to the a modulator. The modulator is, for example, the low voltage stage modulator 342 of FIG. 3. In other examples, the modulator is, the low voltage stage modulator 450 of FIG. 4.

In the example of FIG. 5, the sixth logic circuit 520 receives the output of the fifth logic circuit 518, the output of the oscillator 501, and the PWM control signal from the PWM control signal input. When the output of the fifth logic circuit 518 is a logic low value, the output of the sixth logic circuit 520 is set to the logic value of the PWM control signal. When the output of the fifth logic circuit 518 is a logic high value, the output of the sixth logic circuit 520 is set to the logic value at the output of the oscillator 501. In this manner, when the output of the fifth logic circuit 518 is a logic high value, the frequency of the output of the sixth logic circuit 520 is set by the frequency of the oscillator 501 (e.g., the frequency $f_2$).

In the illustrated example of FIG. 5, in operation, the logic value of the RST/EN signal at the RST/EN signal input is generally a logic high value. When a controller (e.g., the computing system 302 of FIG. 3, the computing system 402 of FIG. 4, etc.) triggers an STO event, the logic value of the RST/EN signal at the RST/EN signal input is set to a logic low value. Moreover, when a controller (e.g., the computing system 302 of FIG. 3, the computing system 402 of FIG. 4, etc.) triggers an STO event, the controller holds the logic value of the RST/EN signal at the RST/EN signal input at a logic low value for a period of time equal to or greater than the a period of time substantially similar to 64 clock cycles of the oscillator 501. Four clock cycles of the oscillator 501 after the falling edge of the RST/EN signal, the sixth logic circuit 520 outputs the logic value at the output of the oscillator 501. Because the oscillator 501 is at the frequency $f_2$, the output of the sixth logic circuit 520 is at the frequency of the oscillator 501 (e.g., the frequency $f_2$). In this manner, when an STO event is triggered by a controller (e.g., the computing system 302 of FIG. 3, the computing system 402 of FIG. 4, etc.), a signal at the frequency of the oscillator 501 (e.g., the frequency $f_2$) is output from the sixth logic circuit 520 until the fourth logic circuit 512 reaches a logic value that corresponds to a decimal value of 0. When the logic value of the RST/EN signal at the RST/EN signal input returns to a logic high value, the output of the sixth logic circuit 520 is set to the logic value of the PWM control signal.

Figure 6:
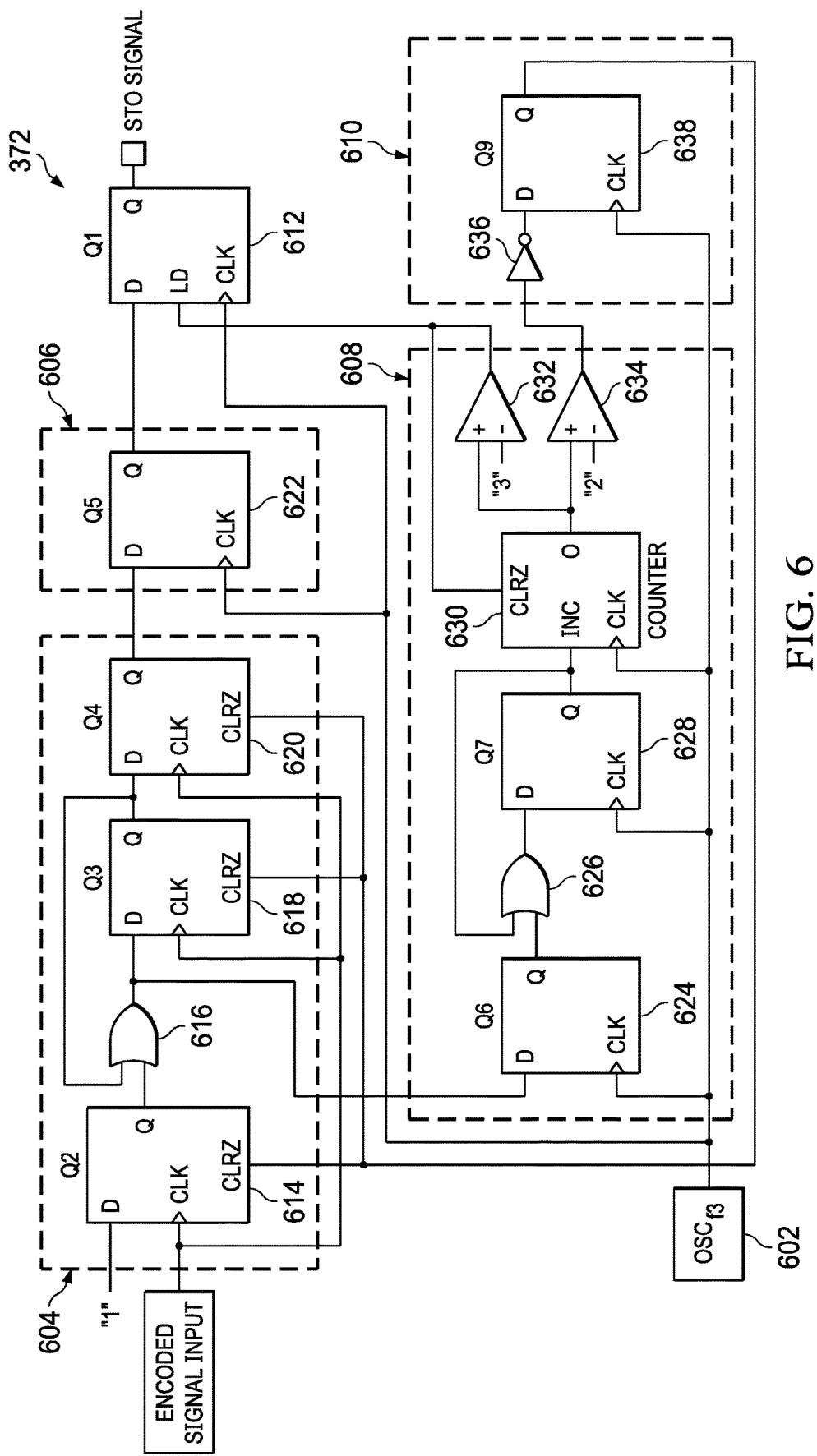
FIG. 6 is a schematic illustration of an example implementation of the STO decoder of FIGS. 3 and 4.

FIG. 6 is a schematic illustration of an example implementation of the STO decoder 372 of FIGS. 3 and 4. The STO decoder 372 is configured to receive an encoded signal input and output an STO control signal at an STO signal output. The STO decoder 372 is to operate based an example oscillator 602 that is configured to operate at a frequency, $f_3$. The STO decoder 372 is also configured to detect three rising edges on the encoded signal in a window of six clock cycles of the oscillator 602 in order to detect an STO event. The STO decoder 372 includes the example oscillator 602, an example rising edge counter 604, an example synchronizer 606, an example timer 608, an example reset circuit 610, and an example first logic circuit 612.

In the example of FIG. 6, the example rising edge counter 604 includes an example second logic circuit 614, an example first logic gate 616, an example third logic circuit 618, and an example fourth logic circuit 620. The example synchronizer 606 includes an example fifth logic circuit 622. In additional or alternative examples, the synchronizer 606 can include any number of additional logic circuits that is suitable. The example timer 608 includes an example sixth logic circuit 624, an example second logic gate 626, an example seventh logic circuit 628, an example eighth logic circuit 630, an example first comparator 632, and an example second comparator 634. The example reset circuit 610 includes an example third logic gate 636 and an example ninth logic circuit 638.

In the example of FIG. 6, the oscillator 602 is coupled to the first logic circuit 612, the fifth logic circuit 622, the sixth logic circuit 624, the seventh logic circuit 628, the eighth logic circuit 630, and the ninth logic circuit 638. The oscillator 602 is, for example, a device that controls the operating frequency of the STO decoder 372. In the illustrated example of FIG. 6, the oscillator 602 is a RC oscillator. In other examples, the oscillator 602 is a ring oscillator, a crystal oscillator, a phase locked loop oscillator, or any other suitable oscillator for the application. The oscillator 602 generates a clock signal at a desired frequency (e.g., a frequency $f_3$, in the range of 10s of MHz, etc.). In examples disclosed herein, the frequency of the oscillator 602 (e.g., the frequency $f_3$) is greater than the frequency of the PWM control signal.

In the illustrated example of FIG. 6, the first logic circuit 612 (e.g., Q1) is a D flip-flop and includes a first input (e.g., D), a second input (e.g., LD), a third input (e.g., CLK), and an output (e.g., Q). Additionally, each of the second logic circuit 614 (e.g., Q2), the third logic circuit 618 (e.g., Q3), and the fourth logic circuit 620 (e.g., Q4) is a D flip-flop and includes a first input (e.g., D), a second input (e.g., CLK), a third input (e.g., CLRZ), and an output (e.g., Q). Furthermore, each of the fifth logic circuit 622 (e.g., Q5), the sixth logic circuit 624 (e.g., Q6), the seventh logic circuit 628 (e.g., Q7), and the ninth logic circuit 638 (e.g., Q9) is a D flip-flop and includes a first input (e.g., D), a second input (e.g., CLK), and an output (e.g., Q).

In the example illustrated in FIG. 6, each of the first logic gate 616 and the second logic gate 626 is an OR gate and includes a first input, a second input, and an output and the third logic gate 636 is an NOT gate and includes an input and an output. Additionally, each of the first comparator 632 and the second comparator 634 is a digital comparator and includes a first input, a second input, and an output. The first input of the first comparator 632 corresponds to a non-inverting input of the first comparator 632 while the second input of the first comparator 632 corresponds to an inverting input of the first comparator 632. The first input of the second comparator 634 corresponds to a non-inverting input of the second comparator 634 while the second input of the second comparator 634 corresponds to an inverting input of the second comparator 634. Furthermore, the eighth logic circuit 630 is a counter and includes a first input (e.g., INC), a second input (e.g., CLK), a third input (e.g., CLRZ), and an output (e.g., O).

In the illustrated example of FIG. 6, the first input of the first logic circuit 612 is coupled to the output of the fifth logic circuit 622. The second input of the first logic circuit 612 is coupled to the output of the first comparator 632, the third input of the first logic circuit 612 is coupled to the oscillator 602, and the output of the first logic circuit 612 is coupled to the STO signal output. For example, the STO signal output can correspond to the driver 364 of FIGS. 3 and 4 and/or the output stage circuit 474 of FIG. 4.

In the example of FIG. 6, the first logic circuit 612 receives the output of the fifth logic circuit 622, the output of the first comparator 632, and the output of the oscillator 602. In this manner, the output of the first logic circuit 612 is set by the output of the fifth logic circuit 622 at the rising edge of the signal at the output of the oscillator 602. The output of the first logic circuit 612 is updated with the logic value of the output of the fifth logic circuit 622 at the frequency of the signal output from the oscillator 602. The output of the first logic circuit 612 is set to (e.g., loaded with) a logic high value (e.g., '1', etc.) when there is a logic high value at the output of the first comparator 632.

In the example of FIG. 6, the first input of the second logic circuit 614 is coupled to a logic value corresponding to a decimal value of 1. The second input of the second logic circuit 614 is coupled to the encoded signal input. For example, the second input of the second logic circuit 614 is coupled to the high voltage stage demodulator 358 of FIG. 3. In other examples, the second input of the second logic circuit 614 is coupled to the high voltage stage demodulator 468 of FIG. 4. The third input of the second logic circuit 614 is coupled to the output of the ninth logic circuit 638 and the output of the second logic circuit 614 is coupled to the first input of the first logic gate 616.

In the example of FIG. 6, the second logic circuit 614 receives the logic value corresponding to the decimal value of 1, the encoded signal, and the output of the ninth logic circuit 638. In this manner, the output of the second logic circuit 614 is set by the logic value corresponding to the decimal value of 1 at the rising edge of the encoded signal.

The output of the second logic circuit 614 is updated with the logic value corresponding to the decimal value of 1 at the frequency of the encoded signal. The output of the second logic circuit 614 is reset to a logic low value (e.g., '0', etc.) when there is a logic high value at the output of the ninth logic circuit 638.

In the illustrated example of FIG. 6, the first logic gate 616 is an OR gate. In the example of FIG. 6, the first input of the first logic gate 616 is coupled to the output of the third logic circuit 618, the second input of the first logic gate 616 is coupled to the output of the second logic circuit 614, and the output of the first logic gate 616 is coupled to the first input of the third logic circuit 618 and the first input of the sixth logic circuit 624. In operation, the first logic gate 616 outputs a logic high value when the output of the third logic circuit 618 is a logic high value and/or the output of the second logic circuit 614 is a logic high value.

In the illustrated example of FIG. 6, the first input of the third logic circuit 618 is coupled to the output of the first logic gate 616. The second input of the third logic circuit 618 is coupled to the encoded signal, the third input of the third logic circuit 618 is coupled to the output of the ninth logic circuit 838, and the output of the third logic circuit 618 is coupled to the first input of the first logic gate 616 and the first input of the fourth logic circuit 620.

In the example of FIG. 6, the third logic circuit 618 receives the output of the first logic gate 616, the encoded signal, and the output of the ninth logic circuit 638. In this manner, the output of the third logic circuit 618 is set by the output of the first logic gate 616 at the rising edge of the encoded signal. The output of the third logic circuit 618 is updated with the output of the first logic gate 616 at the frequency of the encoded signal. The output of the third logic circuit 618 is reset to a logic low value (e.g., '0', etc.) when there is a logic high value at the output of the ninth logic circuit 638.

In the illustrated example of FIG. 6, the first input of the fourth logic circuit 620 is coupled to the output of the third logic circuit 618. The second input of the fourth logic circuit 620 is coupled to the encoded signal, the third input of the fourth logic circuit 620 is coupled to the output of the ninth logic circuit 638, and the output of the fourth logic circuit 620 is coupled to the first input of the fifth logic circuit 622.

In the example of FIG. 6, the fourth logic circuit 620 receives the output of the third logic circuit 618, the encoded signal, and the output of the ninth logic circuit 638. In this manner, the output of the fourth logic circuit 620 is set by the output of the third logic circuit 618 at the rising edge of the encoded signal. The output of the fourth logic circuit 620 is updated with the output of the third logic circuit 618 at the frequency of the encoded signal. The output of the fourth logic circuit 620 is reset to a logic low value (e.g., '0', etc.) when there is a logic high value at the output of the ninth logic circuit 638.

In the illustrated example of FIG. 6, the first input of the fifth logic circuit 622 is coupled to the output of the fourth logic circuit 620. The second input of the fifth logic circuit 622 is coupled to the oscillator 602, and the output of the fifth logic circuit 622 is coupled to the first input of the first logic circuit 612. In the example of FIG. 6, the fifth logic circuit 622 receives the output of the fourth logic circuit 620 and the output of the oscillator 602. In this manner, the output of the fifth logic circuit 622 is set by the output of the fourth logic circuit 620 at the rising edge of the signal at the output of the oscillator 602. The output of the fifth logic circuit 622 is updated with the logic value of the output of the fourth logic circuit 620 at the frequency of the signal output from the oscillator 602.

In the illustrated example of FIG. 6, the first input of the sixth logic circuit 624 is coupled to the output of the first logic gate 616. The second input of the sixth logic circuit 624 is coupled to the oscillator 602, and the output of the sixth logic circuit 624 is coupled to the first input of the second logic gate 626. In the example of FIG. 6, the sixth logic circuit 624 receives the output of the first logic gate 616 and the output of the oscillator 602. In this manner, the output of the sixth logic circuit 624 is set by the output of the first logic gate 616 at the rising edge of the signal at the output of the oscillator 602. The output of the sixth logic circuit 624 is updated with the logic value of the output of the first logic gate 616 at the frequency of the signal output from the oscillator 602.

In the illustrated example of FIG. 6, the second logic gate 626 is an OR gate. In the example of FIG. 6, the first input of the second logic gate 626 is coupled to the output of the seventh logic circuit 628, the second input of the second logic gate 626 is coupled to the output of the sixth logic circuit 624, and the output of the second logic gate 626 is coupled to the first input of the seventh logic circuit 628. In operation, the second logic gate 626 outputs a logic high value when the output of the seventh logic circuit 628 is a logic high value and/or the output of the sixth logic circuit 624 is a logic high value.

In the illustrated example of FIG. 6, the first input of the seventh logic circuit 628 is coupled to the output of the second logic gate 626. The second input of the seventh logic circuit 628 is coupled to the oscillator 602, and the output of the seventh logic circuit 628 is coupled to the first input of the eighth logic circuit 630. In the example of FIG. 6, the seventh logic circuit 628 receives the output of the second logic gate 626 and the output of the oscillator 602. In this manner, the output of the seventh logic circuit 628 is set by the output of the second logic gate 626 at the rising edge of the signal at the output of the oscillator 602. The output of the seventh logic circuit 628 is updated with the logic value of the output of the second logic gate 626 at the frequency of the signal output from the oscillator 602.

In the illustrated example of FIG. 6, the eighth logic circuit 630 is a counter. The first input of the eighth logic circuit 630 is coupled to the output of the seventh logic circuit 628, the second input of the eighth logic circuit 630 is coupled to the oscillator 602, the third input of the eighth logic circuit 630 is coupled to the output of the first comparator 632, and the output of the eighth logic circuit 630 is coupled to the first input of the first comparator 632 and the first input of the second comparator 634. In the example of FIG. 6, the eighth logic circuit 630 is a 2-bit counter that is initialized at a logic value corresponding to a decimal value of 0. In the example of FIG. 6, in operation, the output of the eighth logic circuit 630 starts at a binary value corresponding to a decimal value of 0. At each rising edge of the signal at the output of the oscillator 602, the output of the eighth logic circuit 630 is updated based on the output of the seventh logic circuit 628. For example, when the output of the seventh logic circuit 628 is a logic high value, the output of the eighth logic circuit 630 can be incremented. The output of the eighth logic circuit 630 is reset to a logic low value (e.g., '0', etc.) when there is a logic high value at the output of the first comparator 632.

In the example of FIG. 6, the first comparator 632 is a digital comparator that compares the output of the eighth logic circuit 630 to a logic value corresponding to a decimal value of 3. The first input of the first comparator 632 is coupled to the output of the eighth logic circuit 630, the second input of the first comparator 632 is coupled to the logic value corresponding to the decimal value of 3, and the output of the first comparator 632 is coupled to the second input of the first logic circuit 612 and the third input of the eighth logic circuit 630.

In the illustrated example of FIG. 6, in operation, the first comparator 632 compares the output of the eighth logic circuit 630 to the logic value corresponding to the decimal value of 3. When the output of the eighth logic circuit 630 is equal to the logic value corresponding to the decimal value of 3 (or substantially equal thereto), the first comparator 632 outputs a logic high value. When the output of the eighth logic circuit 630 is less than the logic value corresponding to the decimal value of 3, the first comparator 632 outputs a logic low value.

In the example of FIG. 6, the second comparator 634 is a digital comparator that compares the output of the eighth logic circuit 630 to a logic value corresponding to a decimal value of 2. The first input of the second comparator 634 is coupled to the output of the eighth logic circuit 630, the second input of the second comparator 634 is coupled to the logic value corresponding to the decimal value of 2, and the output of the second comparator 634 is coupled to the first input of the third logic gate 636.

In the illustrated example of FIG. 6, in operation, the second comparator 634 compares the output of the eighth logic circuit 630 to the logic value corresponding to the decimal value of 2. When the output of the eighth logic circuit 630 is equal to the logic value corresponding to the decimal value of 2 (or substantially equal thereto), the second comparator 634 outputs a logic high value. When the output of the eighth logic circuit 630 is less than the logic value corresponding to the decimal value of 2, the second comparator 634 outputs a logic low value.

In the example of FIG. 6, the third logic gate 636 is a NOT gate. The input of the third logic gate 636 is coupled to the output of the second comparator 634 and the output of the third logic gate 636 is coupled to the first input of the ninth logic circuit 638. In operation, the third logic gate 636 outputs a logic high value when there is a logic low value at the output of the second comparator 634. Additionally, the third logic gate 636 outputs a logic low value when there is a logic high value at the output of the second comparator 634.

In the illustrated example of FIG. 6, the first input of the ninth logic circuit 638 is coupled to the output of the third logic gate 636. The second input of the ninth logic circuit 638 is coupled to the oscillator 602, and the output of the ninth logic circuit 638 is coupled to the third input of each of the second logic circuit 614, the third logic circuit 618, and the fourth logic circuit 620.

In the example of FIG. 6, the ninth logic circuit 638 receives the output of the third logic gate 636 and the output of the oscillator 602. In this manner, the output of the ninth logic circuit 638 is set by the output of the third logic gate 636 at the rising edge of the signal at the output of the oscillator 602. The output of the ninth logic circuit 638 is updated with the logic value of the output of the third logic gate 636 at the frequency of the signal output from the oscillator 602.

In the illustrated example of FIG. 6, in operation, the encoded signal at the encoded signal input is generally oscillating at the frequency of the PWM control signal (e.g., the frequency $f_1$). Because the frequency of the oscillator 602 (e.g., the frequency $f_2$) is greater than the frequency of the PWM control signal (e.g., the frequency $f_1$), the STO decoder 372 can accurately detect STO events and avoid false detection caused by the PWM control signals.

In the example of FIG. 6, in operation, the rising edge counter 604 counts the rising edges on the encoded signal received at the encoded signal input. Additionally, the timer 608 counts the rising edges of the oscillator 602 (e.g., counts the periods of the oscillator 602). For example, in response to the rising edge counter 604 detecting a rising edge on the encoded signal, the rising edge counter 604 can increment a count value associated with rising edges on the encoded signal and the timer 608 can increment a count value associated with rising edges on the signal at the output of the oscillator 602. If the rising edge count of the timer 608 is five or more (e.g., five or more periods of the oscillator 602 have elapsed), the reset circuit 610 resets the rising edge counter 604 and the timer 608 to zero. When the timer 608 counts five rising edges on the signal at the output of the oscillator 602 (e.g., the count value of the eighth logic circuit 630 counts three periods of the oscillator 602), the timer 608 sets the output of the first logic circuit 612 to a logic high value. For example, in response to the timer 608 meeting a threshold corresponding to a number of rising edges on the signal at the output of the oscillator 602 and the count value of the rising edge counter 604 meeting a threshold corresponding to a number of rising edges on the encoded signal, the timer 608 and/or the rising edge counter 604 can set the output of the first logic circuit 612 to a logic high value (e.g., generate an indication).

Figure 7:
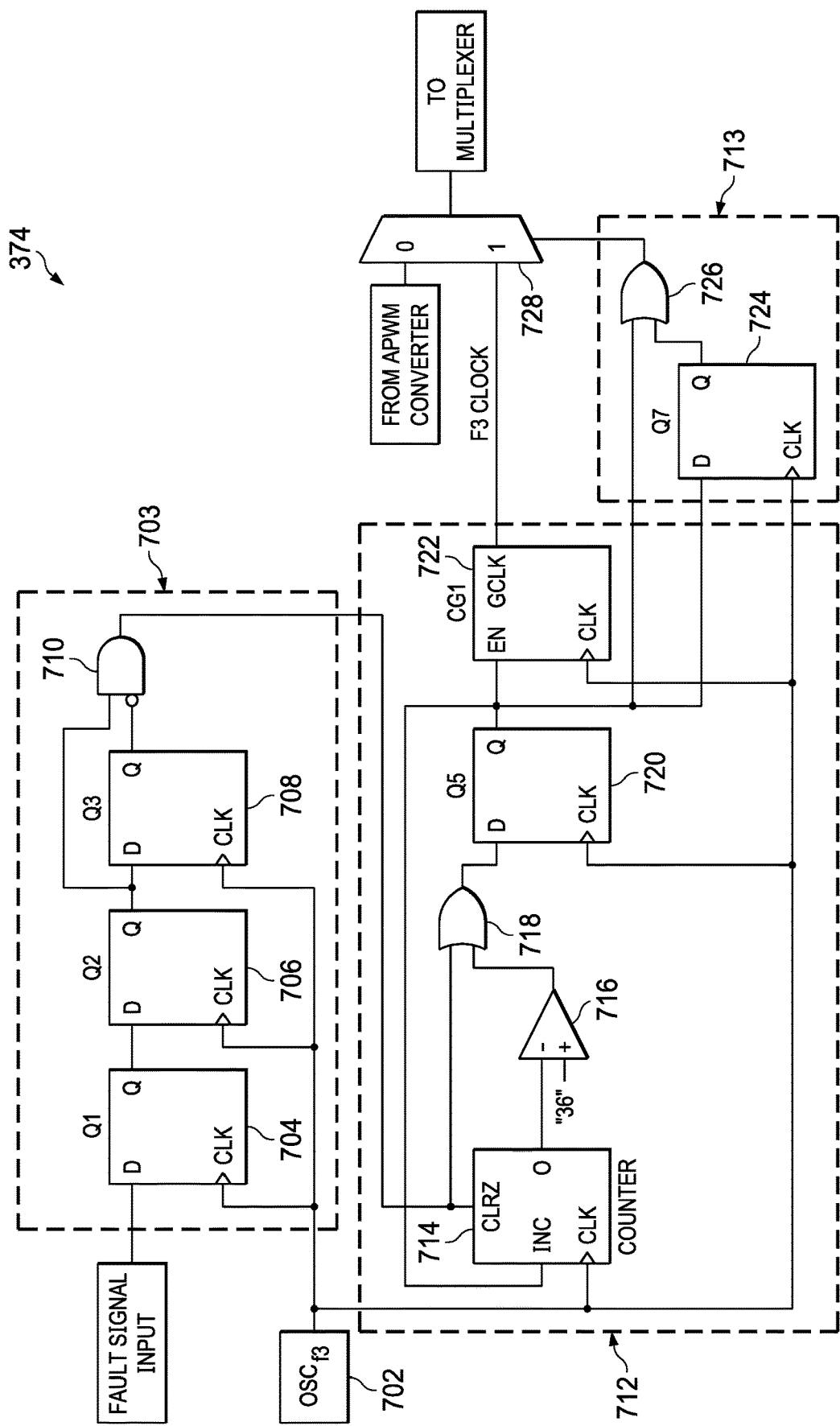
FIG. 7 is a schematic illustration of an example implementation of the fault encoder of FIGS. 3 and 4.

FIG. 7 is a schematic illustration of an example implementation of the fault encoder 374 of FIGS. 3 and 4. The fault encoder 374 is configured to receive a FLT signal at an FLT signal input and an APWM signal at an APWM signal input. The FLT signal is indicative of a fault corresponding to the switch 306 of FIG. 3 and/or the switch 406 of FIG. 4 generated by the fault sensor 370 of FIGS. 3 and 4. The APWM signal is indicative of a characteristic of the switch 306 of FIG. 3 and/or the switch 406 of FIG. 4, such as, the temperature of the switch 306 and/or the switch 406. The fault encoder 374 is to operate based on an example oscillator 702 that is configured to operate at a frequency, $f_3$. In some examples, the fault sensor 370 of FIGS. 3 and 4 generates the signal indicative of a fault as a logic high value. The fault encoder 374 is configured to encode 36 clock cycles of the oscillator 702 into the encoded signal. The fault encoder 374 transmits the encoded signal by encoding into the APWM control signal 36 clock cycles of the oscillator 702.

In the example of FIG. 7, the example fault encoder 374 includes the example oscillator 702, an example edge detector 703, an example first logic circuit 704, an example second logic circuit 706, an example third logic circuit 708, an example first logic gate 710, an example clock counter 712, an example signal selector 713, an example fourth logic circuit 714, an example comparator 716, an example second logic gate 718, an example fifth logic circuit 720, an example sixth logic circuit 722, an example seventh logic circuit 724, an example third logic gate 726, and an example eighth logic circuit 728. The example edge detector 703 includes the first logic circuit 704, the second logic circuit 706, the third logic circuit 708, and the first logic gate 710. The example clock counter 712 includes the fourth logic circuit 714, the comparator 716, the second logic gate 718, the fifth logic circuit 720, and the sixth logic circuit 722. The example signal selector 713 includes the seventh logic circuit 724 and the third logic gate 726.

In the example of FIG. 7, the oscillator 702 is coupled to the first logic circuit 704, the second logic circuit 706, the third logic circuit 708, the fourth logic circuit 714, the fifth logic circuit 720, the sixth logic circuit 722, and the seventh logic circuit 724. The oscillator 702 is, for example, a device that controls the operating frequency of the fault encoder 374. In the illustrated example of FIG. 7, the oscillator 702 is an RC oscillator. In other examples, the oscillator 702 is a ring oscillator, a crystal oscillator, a phase locked loop oscillator, or any other suitable oscillator for the application. The oscillator 702 generates a clock signal at a desired frequency (e.g., a frequency $f_3$, in the range of 10s of MHz, etc.).

In the illustrated example of FIG. 7, each of the first logic circuit 704 (e.g., Q1), the second logic circuit 706 (e.g., Q2), the third logic circuit 708 (e.g., Q3), the fifth logic circuit 720 (e.g., Q5), and the seventh logic circuit 724 (e.g., Q7) is a D flip-flop and includes a first input (e.g., D), a second input (e.g., CLK), and an output (e.g., Q). In the example of FIG. 7, the first input of the first logic circuit 704 is coupled to the FLT signal input. For example, the first input of the first logic circuit 704 is coupled to the fault sensor 370 of FIGS. 3 and/or 4. The second input of the first logic circuit 704 is coupled to the oscillator 702, and the output of the first logic circuit 704 is coupled to the first input of second logic circuit 706.

In the example of FIG. 7, the first logic circuit 704 receives the FLT signal and the output of the oscillator 702. In this manner, the output of the first logic circuit 704 is set by the logic value on the FLT signal at the rising edge of the signal at the output of the oscillator 702. The output of the first logic circuit 704 is updated with the logic value on the FLT signal at the frequency of the signal output from the oscillator 702.

In the illustrated example of FIG. 7, the first input of the second logic circuit 706 is coupled to the output of the first logic circuit 704. The second input of the second logic circuit 706 is coupled to the oscillator 702, and the output of the second logic circuit 706 is coupled to the first input of the third logic circuit 708 and the first logic gate 710.

In the example of FIG. 7, the second logic circuit 706 receives the output of the first logic circuit 704 and the output of the oscillator 702. In this manner, the output of the second logic circuit 706 is set by the output of the first logic circuit 704 at the rising edge of the signal at the output of the oscillator 702. The output of the second logic circuit 706 is updated with the logic value of the output of the first logic circuit 704 at the frequency of the signal output from the oscillator 702.

In the illustrated example of FIG. 7, the first input of the third logic circuit 708 is coupled to the output of the second logic circuit 706. The second input of the third logic circuit 708 is coupled to the oscillator 702, and the output of the third logic circuit 708 is coupled to the first logic gate 710.

In the example of FIG. 7, the third logic circuit 708 receives the output of the second logic circuit 706 and the output of the oscillator 702. In this manner, the output of the third logic circuit 708 is set by the output of the second logic circuit 706 at the rising edge of the signal at the output of the oscillator 702. The output of the third logic circuit 708 is updated with the logic value of the output of the second logic circuit 706 at the frequency of the signal output from the oscillator 702. In the illustrated example of FIG. 7, the first logic gate 710 is an AND gate with one terminal inverted and includes a first input, a second input, and an output. In the example of FIG. 7, the first input of the first logic gate 710 is coupled to the output of the second logic circuit 706, the second input of the first logic gate 710 is inverted and coupled to the output of the third logic circuit 708, and the output of the first logic gate 710 is coupled to the fourth logic circuit 714 and the second logic gate 718. In operation, the first logic gate 710 outputs a logic high value when the output of the second logic circuit 706 is a logic high value and the output of the third logic circuit 708 is a logic low value.

In the illustrated example of FIG. 7, the fourth logic circuit 714 is a counter including a first input (e.g., INC), a second input (e.g., CLK), a third input (e.g., CLRZ), and an output (e.g., 0). The first input of the fourth logic circuit 714 is coupled to the output of the fifth logic circuit 720, the second input of the fourth logic circuit 714 is coupled to the oscillator 702, the third input of the fourth logic circuit 714 is coupled to the output of the first logic gate 710, and the output of the fourth logic circuit 714 is coupled to the comparator 716. In the example of FIG. 7, the fourth logic circuit 714 is an 8-bit counter.

In the example of FIG. 7, in operation, the output of the fourth logic circuit 714 starts at a binary value corresponding to a decimal value of 0. At each rising edge of the signal at the output of the oscillator 702, the output of the fourth logic circuit 714 is updated based on the output of the fifth logic circuit 720. For example, when the output of the fifth logic circuit 720 is at a logic high value, the output of the fourth logic circuit 714 can be incremented. If the fourth logic circuit 714 receives a logic high value at the third input of the fourth logic circuit 714, the count value of the fourth logic circuit 714 is cleared and/or otherwise reset to a logic value corresponding to a decimal value of zero.

In the example illustrated in FIG. 7, the fourth logic circuit 714 may be implemented by one or more combinational logic circuit and/or one or more sequential logic circuits that increments from zero to a predetermined number to control the number of clock cycles encoded into a signal for a fault event. For example, the fourth logic circuit 714 may be implemented as a ripple counter using 8 D flip-flops.

In the example of FIG. 7, the comparator 716 is a digital comparator that compares the output of the fourth logic circuit 714 to a logic value corresponding to a decimal value of 36. The comparator 716 of FIG. 7 includes a first input, a second input, and an output. The first input of the comparator 716 corresponds to a non-inverting input of the comparator 716 while the second input of the comparator 716 corresponds to an inverting input of the comparator 716. The first input of the comparator 716 is coupled to the logic value corresponding to the decimal value of 36, the second input of the comparator 716 is coupled to the output of the fourth logic circuit 714, and the output of the comparator 716 is coupled to the second logic gate 718. In the illustrated example of FIG. 7, in operation, the comparator 716 compares the output of the fourth logic circuit 714 to the logic value corresponding to the decimal value of 36. When the output of the fourth logic circuit 714 is less than the logic value corresponding to the decimal value of 36 (e.g., the output of the fourth logic circuit 714 meets a predetermined number), the comparator 716 outputs a logic high value. For example, the logic value corresponding to the decimal value of 36 can correspond to a predetermined number of rising edges of the signal at the output of the oscillator 702. When the output of the fourth logic circuit 714 is greater than or equal to the logic value corresponding to the decimal value of 36, the comparator 716 outputs a logic low value.

In the illustrated example of FIG. 7, the second logic gate 718 is an OR gate including a first input, a second input, and an output. In the example of FIG. 7, the first input of the second logic gate 718 is coupled to the output of the first logic gate 710, the second input of the second logic gate 718 is coupled to the output of the comparator 716, and the output of the second logic gate 718 is coupled to the first input of the fifth logic circuit 720. In operation, the second logic gate 718 outputs a logic high value when the output of the first logic gate 710 is a logic high value and/or the output of the comparator 716 is a logic high value.

In the illustrated example of FIG. 7, the first input of the fifth logic circuit 720 is coupled to the output of the second logic gate 718. The second input of the fifth logic circuit 720 is coupled to the oscillator 702, and the output of the fifth logic circuit 720 is coupled to the first input of the fourth logic circuit 714, the sixth logic circuit 722, the first input of the seventh logic circuit 724, and the third logic gate 726.

In the example of FIG. 7, the fifth logic circuit 720 receives the output of the second logic gate 718 and the output of the oscillator 702. In this manner, the output of the fifth logic circuit 720 is set by the output of the second logic gate 718 at the rising edge of the signal at the output of the oscillator 702. The output of the fifth logic circuit 720 is updated with the logic value of the output of the second logic gate 718 at the frequency of the signal output from the oscillator 702.

In the example of FIG. 7, the sixth logic circuit 722 includes a first input, a second input, and an output. The first input of the sixth logic circuit 722 is coupled to the output of the fifth logic circuit 720, the second input of the sixth logic circuit 722 is coupled to oscillator 702, and the output of the sixth logic circuit 722 is coupled to the eighth logic circuit 728. The sixth logic circuit 722 is, for example, a device that controls the conduction of the signal at the output of the oscillator 702 between the oscillator 702 and the eighth logic circuit 728. In the illustrated example of FIG. 7, the sixth logic circuit 722 may be implemented by one or more combinational logic circuit and/or one or more sequential logic circuits. In operation, when the sixth logic circuit 722 receives a logic high at the first input of the sixth logic circuit 722, the sixth logic circuit 722 outputs the signal generated by the oscillator 702 to the eighth logic circuit 728. Additionally, in operation, when the sixth logic circuit 722 receives a logic low at the first input of the sixth logic circuit 722, the sixth logic circuit 722 does not output the signal generated by the oscillator 702 to the eighth logic circuit 728.

In the examples disclosed herein, the frequency of the oscillator 702 is much greater than the frequency of the APWM signal (e.g., the frequency $f_3$>>the frequency $f_1$). Additionally, in examples disclosed herein, the value frequency of the oscillator 702 (e.g., the frequency $f_3$) has a direct relationship with the speed at which the fault decoder 348 can detect a fault event. For example, higher frequency of the oscillator 702 (e.g., the frequency $f_3$) corresponds to faster detection of fault events by the fault decoder 348. In the examples disclosed herein, the frequency of the oscillator 702 (e.g., the frequency $f_3$, 10s of MHz) corresponds to detection time of 100s of nanoseconds. The upper threshold for the frequency of the oscillator 702 (e.g., the frequency $f_3$) is set by the frequency of operation of one or more of the high voltage stage modulator 362, the second capacitor 326, or the low voltage stage demodulator 344 of FIG. 3 and/or the high voltage stage modulator 472, the second capacitor 428, or the low voltage stage demodulator 452 of FIG. 4.

In the illustrated example of FIG. 7, the first input of the seventh logic circuit 724 is coupled to the output of the fifth logic circuit 720. The second input of the seventh logic circuit 724 is coupled to the oscillator 702, and the output of the seventh logic circuit 724 is coupled to the third logic gate 726.

In the example of FIG. 7, the seventh logic circuit 724 receives the output of the fifth logic circuit 720 and the output of the oscillator 702. In this manner, the output of the seventh logic circuit 724 is set by the output of the fifth logic circuit 720 at the rising edge of the signal at the output of the oscillator 702. The output of the seventh logic circuit 724 is updated with the logic value of the output of the fifth logic circuit 720 at the frequency of the signal output from the oscillator 702.

In the illustrated example of FIG. 7, the third logic gate 726 is an OR gate including a first input, a second input, and an output. In the example of FIG. 7, the first input of the third logic gate 726 is coupled to the output of the fifth logic circuit 720, the second input of the third logic gate 726 is coupled to the output of the seventh logic circuit 724, and the output of the third logic gate 726 is coupled to the eighth logic circuit 728. In operation, the third logic gate 726 outputs a logic high value when the output of the fifth logic circuit 720 is a logic high value and/or the output of the seventh logic circuit 724 is a logic high value.

In the illustrated example of FIG. 7, the eighth logic circuit 728 is a 2 to 1 multiplexer that includes a first input, a second input, a third input, and an output. In FIG. 7, the first input of the eighth logic circuit 728 is coupled to the APWM signal input, the second input of the eighth logic circuit 728 is coupled to the output of the sixth logic circuit 722, the third input of the eighth logic circuit 728 is coupled to the output of the third logic gate 726, and the output of the eighth logic circuit 728 is coupled to a multiplexer. The multiplexer is, for example, the seventh logic circuit 928 of FIG. 9. In some examples, the eighth logic circuit 728 and the seventh logic circuit 928 of FIG. 9 can be implemented by a 3 to 1 multiplexer.

In the example of FIG. 7, the eighth logic circuit 728 receives the output of the sixth logic circuit 722, the output of the third logic gate 726, and the APWM signal from the APWM signal input. When the output of the third logic gate 726 is a logic high value, the output of the eighth logic circuit 728 is set to the logic value at the output of the sixth logic circuit 722. When the output of the third logic gate 726 is a logic low value, the output of the eighth logic circuit 728 is set to the logic value of the APWM signal.

In the illustrated example of FIG. 7, in operation, the logic value of the FLT signal at the FLT signal input is generally a logic low value. When a fault occurs that is associated with the operation of the switch 306 of FIG. 3 and/or the switch 406 of FIG. 4, the fault sensor 370 is configured to generate a logic high value on the FLT signal at the FLT signal input. The edge detector 703 monitors the FLT signal at the FLT input to determine whether a fault has occurred. Five clock cycles of the oscillator 702 after the edge detector 703 detects the rising edge of the FLT signal, the signal selector 713 causes the eighth logic circuit 728 to output the logic value at the output of the sixth logic circuit 722 (e.g., the output of the clock counter 712). For example, in response to the edge detector 703 detecting a rising edge on the FLT signal at the FLT signal input, the signal selector 713 can cause the eighth logic circuit 728 to output the signal at the output of the sixth logic circuit 722. Because the output of the sixth logic circuit 722 (e.g., the output of the clock counter 712) is at the frequency, $f_3$, the output of the eighth logic circuit 728 is at the frequency of the oscillator 702. In this manner, when the fault sensor 370 triggers a fault, the signal selector 713 causes the eighth logic circuit 728 to output a signal at the frequency of the oscillator 702 (e.g., the frequency $f_3$) until the fourth logic circuit 714 (e.g., the clock counter 712) reaches a logic value that corresponds to a decimal value of 36. One clock cycle of the oscillator 702 after the fourth logic circuit 714 (e.g., the clock counter 712) reaches a logic value that corresponds to a decimal value of 36, the signal selector 713 causes the output of the eighth logic circuit 728 to be set to the logic value of the APWM signal. Additionally, when the fourth logic circuit 714 (e.g., the clock counter 712) reaches a logic value that corresponds to a decimal value of 36, the comparator 716 indicates to the fifth logic circuit 720 to disable the sixth logic circuit 722. On the next clock cycle of the oscillator 702, the sixth logic circuit 722 is disabled. The addition of the seventh logic circuit 724 allows for an extra clock cycle between disabling the sixth logic circuit 722 and transmission of the APWM signal to prevent glitches and/or other errors from occurring.

Figure 8:
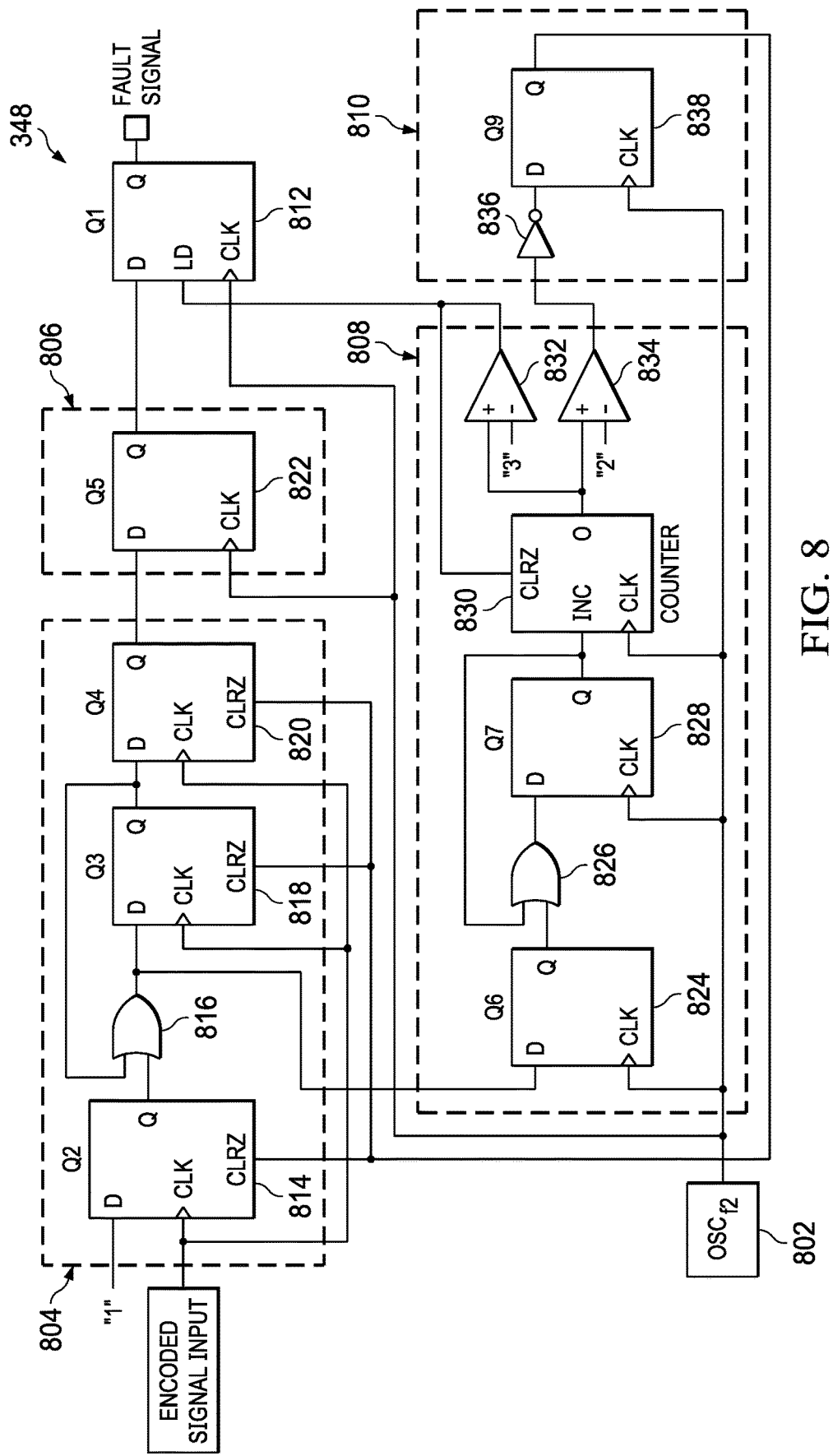
FIG. 8 is a schematic illustration of an example implementation of the fault decoder of FIGS. 3 and 4.

FIG. 8 is a schematic illustration of an example implementation of the fault decoder 348 of FIGS. 3 and 4. The fault decoder 348 is configured to receive an encoded signal input and output an FLT signal at an FLT signal output. The fault decoder 348 is to operate based an example oscillator 802 that is configured to operate at a frequency, $f_2$. The fault decoder 348 includes the example oscillator 802, an example rising edge counter 804, an example synchronizer 806, an example timer 808, an example reset circuit 810, and an example first logic circuit 812.

In the example of FIG. 8, the example rising edge counter 804 includes an example second logic circuit 814, an example first logic gate 816, an example third logic circuit 818, and an example fourth logic circuit 820. The example synchronizer 806 includes an example fifth logic circuit 822. In additional or alternative examples, the synchronizer 806 can include any number of additional logic circuits that is suitable. The example timer 808 includes an example sixth logic circuit 824, an example second logic gate 826, an example seventh logic circuit 828, an example eighth logic circuit 830, an example first comparator 832, and an example second comparator 834. The example reset circuit 810 includes an example third logic gate 836 and an example ninth logic circuit 838.

In the example of FIG. 8, the oscillator 802 is coupled to the first logic circuit 812, the fifth logic circuit 822, the sixth logic circuit 824, the seventh logic circuit 828, the eighth logic circuit 830, and the ninth logic circuit 838. The oscillator 802 is, for example, a device that controls the operating frequency of the fault decoder 348. In the illustrated example of FIG. 8, the oscillator 802 is a RC oscillator. In other examples, the oscillator 802 is a ring oscillator, a crystal oscillator, a phase locked loop oscillator, or any other suitable oscillator for the application. The oscillator 802 generates a clock signal at a desired frequency (e.g., a frequency $f_2$, in the range of 10s of MHz, etc.). In examples disclosed herein, the frequency of the oscillator 802 (e.g., the frequency $f_2$) is greater than the frequency of the APWM signal.

In the illustrated example of FIG. 8, the first logic circuit 812 (e.g., Q1) is a D flip-flop and includes a first input (e.g., D), a second input (e.g., LD), a third input (e.g., CLK), and an output (e.g., Q). Additionally, each of the second logic circuit 814 (e.g., Q2), the third logic circuit 818 (e.g., Q3), and the fourth logic circuit 820 (e.g., Q4) is a D flip-flop and includes a first input (e.g., D), a second input (e.g., CLK), a third input (e.g., CLRZ), and an output (e.g., Q). Furthermore, each of the fifth logic circuit 822 (e.g., Q5), the sixth logic circuit 824 (e.g., Q6), the seventh logic circuit 828 (e.g., Q7), and the ninth logic circuit 838 (e.g., Q9) is a D flip-flop and includes a first input (e.g., D), a second input (e.g., CLK), and an output (e.g., Q).

In the example illustrated in FIG. 8, each of the first logic gate 816 and the second logic gate 826 is an OR gate and includes a first input, a second input, and an output and the third logic gate 836 is an NOT gate and includes an input and an output. Additionally, each of the first comparator 832 and the second comparator 834 is a digital comparator and includes a first input, a second input, and an output. The first input of the first comparator 832 corresponds to a non-inverting input of the first comparator 832 while the second input of the first comparator 832 corresponds to an inverting input of the first comparator 832. The first input of the second comparator 834 corresponds to a non-inverting input of the second comparator 834 while the second input of the second comparator 834 corresponds to an inverting input of the second comparator 834. Furthermore, the eighth logic circuit 830 is a counter and includes a first input (e.g., INC), a second input (e.g., CLK), a third input (e.g., CLRZ), and an output (e.g., O).

In the illustrated example of FIG. 8, the first input of the first logic circuit 812 is coupled to the output of the fifth logic circuit 822. The second input of the first logic circuit 812 is coupled to the output of the first comparator 832, the third input of the first logic circuit 812 is coupled to the oscillator 802, and the output of the first logic circuit 812 is coupled to the FLT signal output. For example, the FLT signal output can correspond to the sixth pin 338 of FIG. 3 and/or the sixth pin 440 of FIG. 4.

In the example of FIG. 8, the first logic circuit 812 receives the output of the fifth logic circuit 822, the output of the first comparator 832, and the output of the oscillator 802. In this manner, the output of the first logic circuit 812 is set by the output of the fifth logic circuit 822 at the rising edge of the signal at the output of the oscillator 802. The output of the first logic circuit 812 is updated with the logic value of the output of the fifth logic circuit 822 at the frequency of the signal output from the oscillator 802. The output of the first logic circuit 812 is set to (e.g., loaded with) a logic high value (e.g., '1', etc.) when there is a logic high value at the output of the first comparator 832.

In the example of FIG. 8, the first input of the second logic circuit 814 is coupled to a logic value corresponding to a decimal value of 1. The second input of the second logic circuit 814 is coupled to the encoded signal input. For example, the second input of the second logic circuit 814 is coupled to the low voltage stage demodulator 344 of FIG. 3. In other examples, the second input of the second logic circuit 814 is coupled to the low voltage stage demodulator 452 of FIG. 4. The third input of the second logic circuit 814 is coupled to the output of the ninth logic circuit 838 and the output of the second logic circuit 814 is coupled to the first input of the first logic gate 816.

In the example of FIG. 8, the second logic circuit 814 receives the logic value corresponding to the decimal value of 1, the encoded signal, and the output of the ninth logic circuit 838. In this manner, the output of the second logic circuit 814 is set by the logic value corresponding to the decimal value of 1 at the rising edge of the encoded signal. The output of the second logic circuit 814 is updated with the logic value corresponding to the decimal value of 1 at the frequency of the encoded signal. The output of the second logic circuit 814 is reset to a logic low value (e.g., '0', etc.) when there is a logic high value at the output of the ninth logic circuit 838.

In the illustrated example of FIG. 8, the first logic gate 816 is an OR gate. In the example of FIG. 8, the first input of the first logic gate 816 is coupled to the output of the third logic circuit 818, the second input of the first logic gate 816 is coupled to the output of the second logic circuit 814, and the output of the first logic gate 816 is coupled to the first input of the third logic circuit 818 and the first input of the sixth logic circuit 824. In operation, the first logic gate 816 outputs a logic high value when the output of the third logic circuit 818 is a logic high value and/or the output of the second logic circuit 814 is a logic high value.

In the illustrated example of FIG. 8, the first input of the third logic circuit 818 is coupled to the output of the first logic gate 816. The second input of the third logic circuit 818 is coupled to the encoded signal, the third input of the third logic circuit 818 is coupled to the output of the ninth logic circuit 838, and the output of the third logic circuit 818 is coupled to the first input of the first logic gate 816 and the first input of the fourth logic circuit 820.

In the example of FIG. 8, the third logic circuit 818 receives the output of the first logic gate 816, the encoded signal, and the output of the ninth logic circuit 838. In this manner, the output of the third logic circuit 818 is set by the output of the first logic gate 816 at the rising edge of the encoded signal. The output of the third logic circuit 818 is updated with the output of the first logic gate 816 at the frequency of the encoded signal. The output of the third logic circuit 818 is reset to a logic low value (e.g., '0', etc.) when there is a logic high value at the output of the ninth logic circuit 838.

In the illustrated example of FIG. 8, the first input of the fourth logic circuit 820 is coupled to the output of the third logic circuit 818. The second input of the fourth logic circuit 820 is coupled to the encoded signal, the third input of the fourth logic circuit 820 is coupled to the output of the ninth logic circuit 838, and the output of the fourth logic circuit 820 is coupled to the first input of the fifth logic circuit 822.

In the example of FIG. 8, the fourth logic circuit 820 receives the output of the third logic circuit 818, the encoded signal, and the output of the ninth logic circuit 838. In this manner, the output of the fourth logic circuit 820 is set by the output of the third logic circuit 818 at the rising edge of the encoded signal. The output of the fourth logic circuit 820 is updated with the output of the third logic circuit 818 at the frequency of the encoded signal. The output of the fourth logic circuit 820 is reset to a logic low value (e.g., '0', etc.) when there is a logic high value at the output of the ninth logic circuit 838.

In the illustrated example of FIG. 8, the first input of the fifth logic circuit 822 is coupled to the output of the fourth logic circuit 820. The second input of the fifth logic circuit 822 is coupled to the oscillator 802, and the output of the fifth logic circuit 822 is coupled to the first input of the first logic circuit 812. In the example of FIG. 8, the fifth logic circuit 822 receives the output of the fourth logic circuit 820 and the output of the oscillator 802. In this manner, the output of the fifth logic circuit 822 is set by the output of the fourth logic circuit 820 at the rising edge of the signal at the output of the oscillator 802. The output of the fifth logic circuit 822 is updated with the logic value of the output of the fourth logic circuit 820 at the frequency of the signal output from the oscillator 802.

In the illustrated example of FIG. 8, the first input of the sixth logic circuit 824 is coupled to the output of the first logic gate 816. The second input of the sixth logic circuit 824 is coupled to the oscillator 802, and the output of the sixth logic circuit 824 is coupled to the first input of the second logic gate 826. In the example of FIG. 8, the sixth logic circuit 824 receives the output of the first logic gate 816 and the output of the oscillator 802. In this manner, the output of the sixth logic circuit 824 is set by the output of the first logic gate 816 at the rising edge of the signal at the output of the oscillator 802. The output of the sixth logic circuit 824 is updated with the logic value of the output of the first logic gate 816 at the frequency of the signal output from the oscillator 802.

In the illustrated example of FIG. 8, the second logic gate 826 is an OR gate. In the example of FIG. 8, the first input of the second logic gate 826 is coupled to the output of the seventh logic circuit 828, the second input of the second logic gate 826 is coupled to the output of the sixth logic circuit 824, and the output of the second logic gate 826 is coupled to the first input of the seventh logic circuit 828. In operation, the second logic gate 826 outputs a logic high value when the output of the seventh logic circuit 828 is a logic high value and/or the output of the sixth logic circuit 824 is a logic high value.

In the illustrated example of FIG. 8, the first input of the seventh logic circuit 828 is coupled to the output of the second logic gate 826. The second input of the seventh logic circuit 828 is coupled to the oscillator 802, and the output of the seventh logic circuit 828 is coupled to the first input of the eighth logic circuit 830. In the example of FIG. 8, the seventh logic circuit 828 receives the output of the second logic gate 826 and the output of the oscillator 802. In this manner, the output of the seventh logic circuit 828 is set by the output of the second logic gate 826 at the rising edge of the signal at the output of the oscillator 802. The output of the seventh logic circuit 828 is updated with the logic value of the output of the second logic gate 826 at the frequency of the signal output from the oscillator 802.

In the illustrated example of FIG. 8, the eighth logic circuit 830 is a counter. The first input of the eighth logic circuit 830 is coupled to the output of the seventh logic circuit 828, the second input of the eighth logic circuit 830 is coupled to the oscillator 802, the third input of the eighth logic circuit 830 is coupled to the output of the first comparator 832, and the output of the eighth logic circuit 830 is coupled to the first input of the first comparator 832 and the first input of the second comparator 834. In the example of FIG. 8, the eighth logic circuit 830 is a 2-bit counter that is initialized at a logic value corresponding to a decimal value of 0.

In the example of FIG. 8, in operation, the output of the eighth logic circuit 830 starts at a binary value corresponding to a decimal value of 0. At each rising edge of the signal at the output of the oscillator 802, the output of the eighth logic circuit 830 is updated based on the output of the seventh logic circuit 828. For example, when the output of the seventh logic circuit 828 is a logic high value, the output of the eighth logic circuit 830 can be incremented. The output of the eighth logic circuit 830 is reset to a logic low value (e.g., '0', etc.) when there is a logic high value at the output of the first comparator 832.

In the example of FIG. 8, the first comparator 832 is a digital comparator that compares the output of the eighth logic circuit 830 to a logic value corresponding to a decimal value of 3. The first input of the first comparator 832 is coupled to the output of the eighth logic circuit 830, the second input of the first comparator 832 is coupled to the logic value corresponding to the decimal value of 3, and the output of the first comparator 832 is coupled to the second input of the first logic circuit 812 and the third input of the eighth logic circuit 830. In the illustrated example of FIG. 8, in operation, the first comparator 832 compares the output of the eighth logic circuit 830 to the logic value corresponding to the decimal value of 3. When the output of the eighth logic circuit 830 is equal to the logic value corresponding to the decimal value of 3 (or substantially equal thereto), the first comparator 832 outputs a logic high value. When the output of the eighth logic circuit 830 is less than the logic value corresponding to the decimal value of 3, the first comparator 832 outputs a logic low value.

In the example of FIG. 8, the second comparator 834 is a digital comparator that compares the output of the eighth logic circuit 830 to a logic value corresponding to a decimal value of 2. The first input of the second comparator 834 is coupled to the output of the eighth logic circuit 830, the second input of the second comparator 834 is coupled to the logic value corresponding to the decimal value of 2, and the output of the second comparator 834 is coupled to the first input of the third logic gate 836. In the illustrated example of FIG. 8, in operation, the second comparator 834 compares the output of the eighth logic circuit 830 to the logic value corresponding to the decimal value of 2. When the output of the eighth logic circuit 830 is equal to the logic value corresponding to the decimal value of 2 (or substantially equal thereto), the second comparator 834 outputs a logic high value. When the output of the eighth logic circuit 830 is less than the logic value corresponding to the decimal value of 2, the second comparator 834 outputs a logic low value.

In the example of FIG. 8, the third logic gate 836 is a NOT gate. The input of the third logic gate 836 is coupled to the output of the second comparator 834 and the output of the third logic gate 836 is coupled to the first input of the ninth logic circuit 838. In operation, the third logic gate 836 outputs a logic high value when there is a logic low value at the output of the second comparator 834. Additionally, the third logic gate 836 outputs a logic low value when there is a logic high value at the output of the second comparator 834.

In the illustrated example of FIG. 8, the first input of the ninth logic circuit 838 is coupled to the output of the third logic gate 836. The second input of the ninth logic circuit 838 is coupled to the oscillator 802, and the output of the ninth logic circuit 838 is coupled to the third input of each of the second logic circuit 814, the third logic circuit 818, and the fourth logic circuit 820. In the example of FIG. 8, the ninth logic circuit 838 receives the output of the third logic gate 836 and the output of the oscillator 802. In this manner, the output of the ninth logic circuit 838 is set by the output of the third logic gate 836 at the rising edge of the signal at the output of the oscillator 802. The output of the ninth logic circuit 838 is updated with the logic value of the output of the third logic gate 836 at the frequency of the signal output from the oscillator 802.

In the illustrated example of FIG. 8, in operation, the encoded signal at the encoded signal input is generally oscillating at the frequency of the APWM signal (e.g., the frequency $f_1$). Because the frequency of the oscillator 802 is greater than the frequency of the APWM signal (e.g., the frequency $f_1$), the fault decoder 348 can accurately detect fault events and avoid false detection caused by the APWM signal.

In the example of FIG. 8, in operation, the rising edge counter 804 counts the rising edges on the encoded signal received at the encoded signal input. Additionally, the timer 808 counts the rising edges of the oscillator 802 (e.g., counts the periods of the oscillator 802). For example, in response to the rising edge counter 804 detecting a rising edge on the encoded signal, the rising edge counter 804 can increment a count value associated with rising edges on the encoded signal and the timer 808 can increment a count value associated with rising edges on the signal at the output of the oscillator 802. If the rising edge count of the timer 808 is five or more (e.g., five or more periods of the oscillator 802 have elapsed), the reset circuit 810 resets the rising edge counter 804 and the timer 808 to zero. When the timer 808 counts five rising edges on the signal at the output of the oscillator 802 (e.g., the count value of the eighth logic circuit 830 counts three periods of the oscillator 802), the timer 808 sets the output of the first logic circuit 812 to a logic high value. For example, in response to the timer 808 meeting a threshold corresponding to a number of rising edges on the signal at the output of the oscillator 802 and the count value of the rising edge counter 804 meeting a threshold corresponding to a number of rising edges on the encoded signal, the timer 808 and/or the rising edge counter 804 can set the output of the first logic circuit 812 to a logic high value (e.g., generate an indication).

Figure 9:
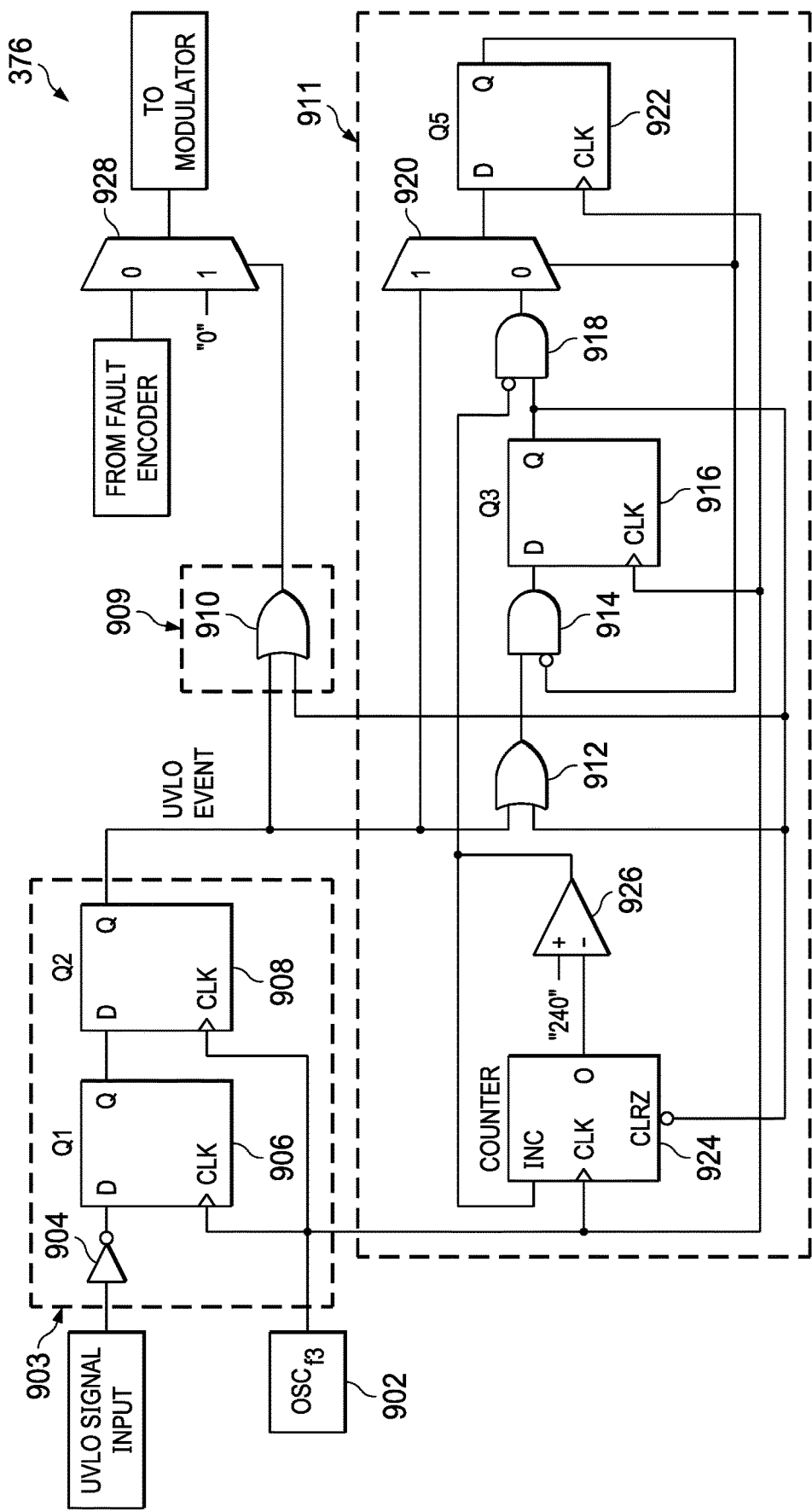
FIG. 9 is schematic illustration of an example implementation of the UVLO encoder of FIGS. 3 and 4.

FIG. 9 is schematic illustration of an example implementation of the UVLO encoder 376 of FIGS. 3 and 4. The UVLO encoder 376 is configured to receive a UVLO signal at an UVLO signal input and an APWM signal at an APWM signal input. The UVLO signal is indicative of an undervoltage condition corresponding to the isolated gate driver 304 of FIG. 3 and/or the isolated gate driver 404 of FIG. 4 generated by the UVLO sensor 368 of FIGS. 3 and 4. The APWM signal is indicative of a characteristic of the switch 306 of FIG. 3 and/or the switch 406 of FIG. 4, such as, the temperature of the switch 306 and/or the switch 406. The UVLO encoder 376 is to operate based on an example oscillator 902 that is configured to operate at a frequency, $f_3$. In some examples, the UVLO sensor 368 of FIGS. 3 and 4 generates the signal indicative of an undervoltage condition as a logic high value. The UVLO encoder 376 is configured to encode 240 clock cycles of the oscillator 902 into the encoded signal. The UVLO encoder 376 transmits the encoded signal by encoding into the APWM control signal 240 clock cycles of the oscillator 902.

In the example of FIG. 9, the example UVLO encoder 376 includes the example oscillator 902, an example level detector 903, an example first logic gate 904, an example first logic circuit 906, an example second logic circuit 908, an example signal selector 909, an example second logic gate 910, an example clock counter 911, an example third logic gate 912, an example fourth logic gate 914, an example third logic circuit 916, an example fifth logic gate 918, an example fourth logic circuit 920, an example fifth logic circuit 922, an example sixth logic circuit 924, an example comparator 926, and an example seventh logic circuit 928. The example level detector 903 includes the first logic gate 904, the first logic circuit 906 and the second logic circuit 908. The example signal selector 909 includes the second logic gate 910. The example clock counter 911 includes the third logic gate 912, the fourth logic gate 914, the third logic circuit 916, the fifth logic gate 918, the fourth logic circuit 920, the fifth logic circuit 922, the sixth logic circuit 924, and the comparator 926.

In the example of FIG. 9, the oscillator 902 is coupled to the first logic circuit 906, the second logic circuit 908, the third logic circuit 916, the fifth logic circuit 922, and the sixth logic circuit 924. The oscillator 902 is, for example, a device that controls the operating frequency of the UVLO encoder 376. In the illustrated example of FIG. 9, the oscillator 902 is an RC oscillator. In other examples, the oscillator 902 is a ring oscillator, a crystal oscillator, a phase locked loop oscillator, or any other suitable oscillator for the application. The oscillator 902 generates a clock signal at a desired frequency (e.g., a frequency $f_3$, in the range of 10s of MHz, etc.).

In the example of FIG. 9, the first logic gate 904 is a NOT gate including an input and an output. The input of the first logic gate 904 is coupled to the UVLO signal input. For example, the input of the first logic gate 904 is coupled to the UVLO sensor 368 of FIGS. 3 and/or 4. The output of the first logic gate 904 is coupled to the first logic circuit 906. In operation, the first logic gate 904 outputs a logic high value when there is a logic low value on the UVLO signal at the UVLO signal input. Additionally, the first logic gate 904 outputs a logic low value when there is a logic high value on the UVLO signal at the UVLO signal input.

In the illustrated example of FIG. 9, each of the first logic circuit 906 (e.g., Q1), the second logic circuit 908 (e.g., Q2), the third logic circuit 916 (e.g., Q3), and the fifth logic circuit 922 (e.g., Q5) is a D flip-flop and includes a first input (e.g., D), a second input (e.g., CLK), and an output (e.g., Q). In the example of FIG. 9, the first input of the first logic circuit 906 is coupled to the output of the first logic gate 904, the second input of the first logic circuit 906 is coupled to the oscillator 902, and the output of the first logic circuit 906 is coupled to the first input of second logic circuit 908.

In the example of FIG. 9, the first logic circuit 906 receives the output of the first logic gate 904 and the output of the oscillator 902. In this manner, the output of the first logic circuit 906 is set by the logic value at the output of the first logic gate 904 at the rising edge of the signal at the output of the oscillator 902. The output of the first logic circuit 906 is updated with the logic value at the output of the first logic gate 904 at the frequency of the signal output from the oscillator 902.

In the example of FIG. 9, the first input of the second logic circuit 908 is coupled to the output of the first logic circuit 906. The second input of the second logic circuit 908 is coupled to the oscillator 902. The output of the second logic circuit 908 is coupled to the second logic gate 910, the third logic gate 912, and the fourth logic circuit 920.

In the example of FIG. 9, the second logic circuit 908 receives the output of the first logic circuit 906 and the signal at the output of the oscillator 902. In this manner, the output of the second logic circuit 908 is set by the logic value of the output of the first logic circuit 906 at the rising edge of the signal at the output of the oscillator 902. The output of the second logic circuit 908 is updated with the logic value of the output of the first logic circuit 906 at the frequency of the signal at the output of the oscillator 902.

In the example illustrated in FIG. 9, the second logic gate 910 is an OR gate and includes a first input, a second input, and an output. In the example of FIG. 9, the first input of the second logic gate 910 is coupled to the output of the second logic circuit 908, the second input of the second logic gate 910 is coupled to the output of the third logic circuit 916, and the output of the second logic gate 910 is coupled to the seventh logic circuit 928. In operation, the second logic gate 910 outputs a logic high value when the output of the second logic circuit 908 is a logic high value and/or the output of the third logic circuit 916 is a logic high value.

In the example illustrated in FIG. 9, the third logic gate 912 is an OR gate and includes a first input, a second input, and an output. In the example of FIG. 9, the first input of the third logic gate 912 is coupled to the output of the second logic circuit 908, the second input of the third logic gate 912 is coupled to the output of the fifth logic circuit 922, and the output of the third logic gate 912 is coupled to the fourth logic gate 914. In operation, the third logic gate 912 outputs a logic high value when the output of the second logic circuit 908 is a logic high value and/or the output of the fifth logic circuit 922 is a logic high value.

In the illustrated example of FIG. 9, the fourth logic gate 914 is an AND gate with one terminal inverted and includes a first input, a second input, and an output. In the example of FIG. 9, the first input of the fourth logic gate 914 is coupled to the output of the third logic gate 912, the second input of the fourth logic gate 914 is inverted and coupled to the output of the fifth logic circuit 922, and the output of the fourth logic gate 914 is coupled to the first input of the third logic circuit 916. In operation, the fourth logic gate 914 outputs a logic high value when the output of the third logic gate 912 is a logic high value and the output of the fifth logic circuit 922 is a logic low value.

In the example of FIG. 9, the first input of the third logic circuit 916 is coupled to the output of the fourth logic gate 914. The second input of the third logic circuit 916 is coupled to the oscillator 902. The output of the third logic circuit 916 is coupled to the second input of the second logic gate 910, the second input of the third logic gate 912, and the sixth logic circuit 924.

In the example of FIG. 9, the third logic circuit 916 receives the output of the fourth logic gate 914 and the signal at the output of the oscillator 902. In this manner, the output of the third logic circuit 916 is set by the logic value of the output of the fourth logic gate 914 at the rising edge of the signal at the output of the oscillator 902. The output of the third logic circuit 916 is updated with the logic value of the output of the fourth logic gate 914 at the frequency of the signal at the output of the oscillator 902. In the examples disclosed herein, a logic high value at the output of the third logic circuit 916 corresponds to a pending flag that indicates an UVLO event is pending and a logic low value is being transmitted from the seventh logic circuit 928 to the modulator.

In the illustrated example of FIG. 9, the fifth logic gate 918 is an AND gate with one terminal inverted and includes a first input, a second input, and an output. In the example of FIG. 9, the first input of the fifth logic gate 918 is inverted and coupled to the output of the comparator 926, the second input of the fifth logic gate 918 is coupled to the output of the third logic circuit 916, and the output of the fifth logic gate 918 is coupled to the fourth logic circuit 920. In operation, the fifth logic gate 918 outputs a logic high value when the output of the comparator 926 is a logic low value and the output of the third logic circuit 916 is a logic high value.

In the illustrated example of FIG. 9, the fourth logic circuit 920 is a 2 to 1 multiplexer that includes a first input, a second input, a third input, and an output. In FIG. 9, the first input of the fourth logic circuit 920 is coupled to the output of the fifth logic gate 918, the second input of the fourth logic circuit 920 is coupled to the output of the second logic circuit 908, the third input of the fourth logic circuit 920 is coupled to the output of the fifth logic circuit 922, and the output of the fourth logic circuit 920 is coupled to the first input of the fifth logic circuit 922.

In the example of FIG. 9, the fourth logic circuit 920 receives the output of the fifth logic gate 918, the output of second logic circuit 908, and the output of the fifth logic circuit 922. When the output of the fifth logic circuit 922 is a logic high value, the output of the fourth logic circuit 920 is set to the logic value at the output of the second logic circuit 908. When the output of the fifth logic circuit 922 is a logic low value, the output of the fourth logic circuit 920 is set to the logic value at the output of the fifth logic gate 918.

In the example of FIG. 9, the first input of the fifth logic circuit 922 is coupled to the output of the fourth logic circuit 920. The second input of the fifth logic circuit 922 is coupled to the oscillator 902. The output of the fifth logic circuit 922 is coupled to the second input of the fourth logic gate 914 and the third input of the fourth logic circuit 920.

In the example of FIG. 9, the fifth logic circuit 922 receives the output of the fourth logic circuit 920 and the signal at the output of the oscillator 902. In this manner, the output of the fifth logic circuit 922 is set by the logic value of the output of the fourth logic circuit 920 at the rising edge of the signal at the output of the oscillator 902. The output of the fifth logic circuit 922 is updated with the logic value of the output of the fourth logic circuit 920 at the frequency of the signal at the output of the oscillator 902.

In the illustrated example of FIG. 9, the sixth logic circuit 924 is a counter and includes a first input (e.g., INC), a second input (e.g., CLK), a third input (e.g., CLRZ), and an output (e.g., 0). In the example of FIG. 9, the first input of the sixth logic circuit 924 is coupled to the output of the comparator 926, the second input of the sixth logic circuit 924 is coupled to the oscillator 902, the third input of the sixth logic circuit 924 is coupled to the output of the fifth logic circuit 922, and the output of the sixth logic circuit 924 is coupled to the comparator 926. In the example of FIG. 9, the sixth logic circuit 924 is an 8-bit counter.

In the example of FIG. 9, in operation, the output of the sixth logic circuit 924 starts at a binary value corresponding to a decimal value of 0. At each rising edge of the signal at the output of the oscillator 902, the output of the sixth logic circuit 924 is updated based on the output of the comparator 926. For example, when the output of the comparator 926 is at a logic high value, the output of the sixth logic circuit 924 can be incremented. If the sixth logic circuit 924 receives a logic low value at the third input of the sixth logic circuit 924, the count value of the sixth logic circuit 924 is cleared and/or otherwise reset to a logic value corresponding to a decimal value of zero. In the example illustrated in FIG. 9, the sixth logic circuit 924 may be implemented by one or more combinational logic circuit and/or one or more sequential logic circuits that increments from zero to a predetermined number to ensure that UVLO events are accurately detected. For example, the sixth logic circuit 924 may be implemented as a ripple counter using 8 D flip-flops.

In the example of FIG. 9, the comparator 926 is a digital comparator that compares the output of the sixth logic circuit 924 to a logic value corresponding to a decimal value of 240. The first input of the comparator 926 corresponds to a non-inverting input of the comparator 926 while the second input of the comparator 926 corresponds to an inverting input of the comparator 926. The first input of the comparator 926 is coupled to the logic value corresponding to the decimal value of 240, the second input of the comparator 926 is coupled to the output of the sixth logic circuit 924, and the output of the comparator 926 is coupled to the first input of the fifth logic gate 918 and the first input of the sixth logic circuit 924.

In the illustrated example of FIG. 9, in operation, the comparator 926 compares the output of the sixth logic circuit 924 to the logic value corresponding to the decimal value of 240. When the output of the sixth logic circuit 924 is less than the logic value corresponding to the decimal value of 240 (e.g., the output of the sixth logic circuit 924 meets a predetermined number), the comparator 926 outputs a logic high value. For example, the logic value corresponding to the decimal value of 240 can correspond to a predetermined number of rising edges of the signal at the output of the oscillator 902. When the output of the sixth logic circuit 924 is greater than or equal to the logic value corresponding to the decimal value of 240, the comparator 926 outputs a logic low value.

In the illustrated example of FIG. 9, the seventh logic circuit 928 is a 2 to 1 multiplexer that includes a first input, a second input, a third input, and an output. In FIG. 9, the first input of the seventh logic circuit 928 is coupled to the output of a fault encoder. For example, the fault encoder can be the fault encoder 374 and the output of the fault encoder can be the output of the eighth logic circuit 728 of FIG. 7 (e.g., the output of a multiplexer). In the example of FIG. 9, the second input of the seventh logic circuit 928 is coupled to a logic value corresponding to a decimal value of zero. In some examples, the second input of the seventh logic circuit 928 is coupled to ground or another reference voltage generator. In FIG. 9, the third input of the seventh logic circuit 928 is coupled to the output of the second logic gate 910 and the output of the seventh logic circuit 928 is coupled to a modulator. The modulator is, for example, the high voltage stage modulator 362 of FIG. 3. In other examples, the modulator is, the high voltage stage modulator 472 of FIG. 4. In some examples, the seventh logic circuit 928 can be implemented by a 3 to 1 multiplexer that additionally implements the eighth logic circuit 728 of FIG. 7.

In the example of FIG. 9, the seventh logic circuit 928 receives the output of the logic value corresponding to the decimal value of zero, the output of the second logic gate 910, and the output of a fault encoder (e.g., the output of the eighth logic circuit 728 of FIG. 7). For example, the seventh logic circuit 928 is configured to obtain a reference voltage, a signal at the output of the second logic gate 910, and at signal at the output of the fault encoder (e.g., the output of the eighth logic circuit 728 of FIG. 7). When the output of the second logic gate 910 is a logic high value, the output of the seventh logic circuit 928 is set to a logic value corresponding to the decimal value of zero. When the output of the second logic gate 910 is a logic low value, the output of the seventh logic circuit 928 is set to the logic value at the output of the multiplexer (e.g., at the output of the eighth logic circuit 728 of FIG. 7).

In the illustrated example of FIG. 9, in operation, the logic value of the UVLO signal at the UVLO signal input is generally a logic high value. When an undervoltage condition occurs that is associated with the supply voltage to the isolated gate driver 304 of FIG. 3 and/or the isolated gate driver 404 of FIG. 4, the UVLO sensor 368 is configured to generate a logic low value on the UVLO signal at the UVLO signal input. The level detector 903 monitors the UVLO signal at the UVLO signal input to determine whether a UVLO event has occurred. Two clock cycles of the oscillator 902 after the level detector 903 detects the logic low value on the UVLO signal, the signal selector 909 (e.g., the second logic gate 910) causes the seventh logic circuit 928 to output the logic value corresponding to the decimal value of zero. For example, in response to the level detector 903 detecting a logic low value on the UVLO signal at the UVLO signal input, the signal selector 909 can cause the seventh logic circuit 928 to output the logic value corresponding to the decimal value of 0 (e.g., a reference voltage). In this manner, when the UVLO sensor 368 triggers a UVLO event, the signal selector 909 (e.g., the second logic gate 910) causes the seventh logic circuit 928 to output a logic value corresponding to a decimal value of zero until the sixth logic circuit 924 (e.g., the clock counter 911) reaches a logic value that corresponds to a decimal value of 240. If the output of the second logic circuit 908 (e.g., the output of the level detector 903) is at a logic low value when the sixth logic circuit 924 (e.g., the clock counter 911) reaches a logic value that corresponds to a decimal value of 240, the signal selector 909 (e.g., the second logic gate 910) causes the output of the seventh logic circuit 928 to be set to the logic value at the output of an encoder (e.g., the output of the eighth logic circuit 728 of FIG. 7). Conversely, if the output of the second logic circuit 908 (e.g., the output of the level detector 903) is at a logic high value when the sixth logic circuit 924 (e.g., the clock counter 911) reaches a logic value that corresponds to a decimal value of 240, the signal selector 909 (e.g., the second logic gate 910) causes the output of the seventh logic circuit 928 to remain at a logic low value until the output of the second logic circuit 908 (e.g., the output of the level detector 903) transitions to a logic high value. Moreover, after the sixth logic circuit 924 (e.g., the clock counter 911) reaches a logic value that corresponds to a decimal value of 240, the signal selector 909 (e.g., the second logic gate 910) causes the seventh logic circuit 928 to output a logic value corresponding to a decimal value of zero until the second logic circuit 908 (e.g., the level detector 903) outputs a logic low value. Additionally, when the sixth logic circuit 924 reaches a logic value that corresponds to a decimal value of 240, the comparator 926 outputs a logic low value to the first input of the sixth logic circuit 924 and the first input of the fifth logic gate 918. In this manner, the UVLO encoder 376 outputs a logic low value for the longer of (1) a UVLO event on the UVLO signal or (2) the 240 cycles of the oscillator 902.

Figure 10:
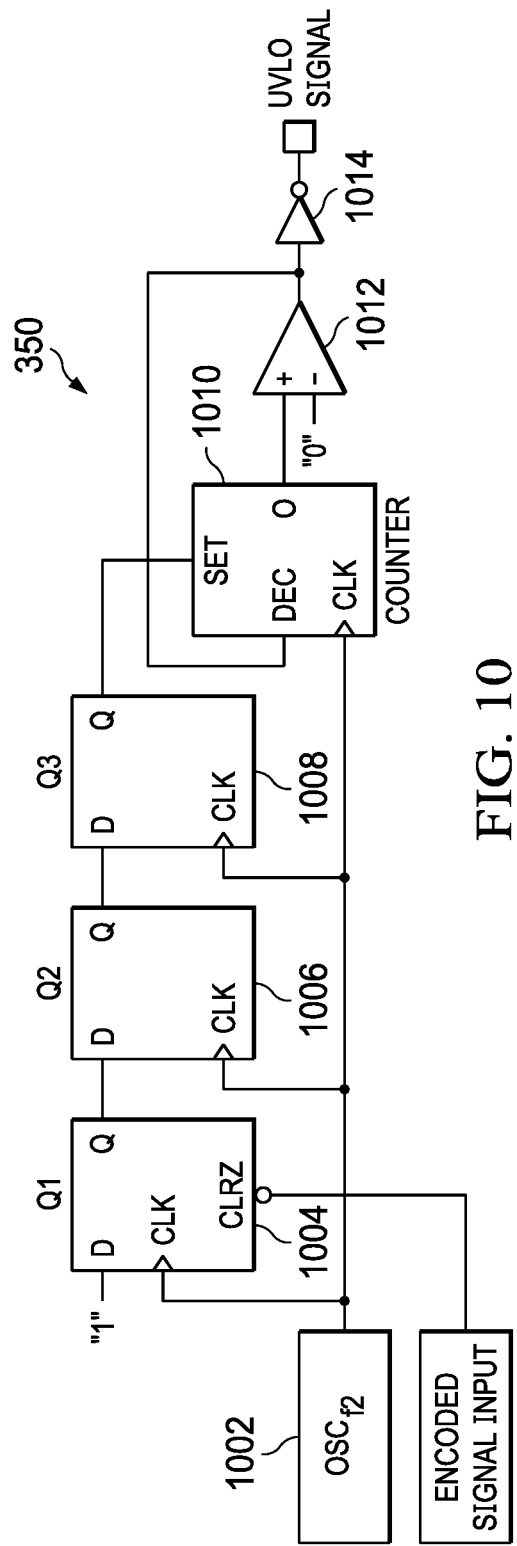
FIG. 10 is a schematic illustration of an example implementation of the UVLO decoder of FIGS. 3 and 4.

FIG. 10 is a schematic illustration of an example implementation of the UVLO decoder 350 of FIGS. 3 and 4. The UVLO decoder 350 is configured to receive an encoded signal input and output a UVLO signal at a UVLO signal output. The UVLO decoder 350 is to operate based an example oscillator 1002 that is configured to operate at a frequency, $f_2$. The UVLO decoder 350 includes the example oscillator 1002, an example first logic circuit 1004, an example second logic circuit 1006, an example third logic circuit 1008, an example fourth logic circuit 1010, an example comparator 1012, and an example logic gate 1014.

In the example of FIG. 10, the oscillator 1002 is coupled to the first logic circuit 1004, the second logic circuit 1006, the third logic circuit 1008, and the fourth logic circuit 1010. The oscillator 1002 is, for example, a device that controls the operating frequency of the UVLO decoder 350. In the illustrated example of FIG. 10, the oscillator 1002 is a RC oscillator. In other examples, the oscillator 1002 is a ring oscillator, a crystal oscillator, a phase locked loop oscillator, or any other suitable oscillator for the application. The oscillator 1002 generates a clock signal at a desired frequency (e.g., a frequency $f_2$, in the range of 10s of MHz, etc.). In examples disclosed herein, the frequency of the oscillator 1002 (e.g., the frequency $f_2$) is greater than the frequency of the APWM signal.

In the illustrated example of FIG. 10, the first logic circuit 1004 (e.g., Q1) is a D flip-flop an includes a first input (e.g., D), a second input (e.g., CLK), a third input (e.g., CLRZ) that is inverted, and an output (e.g., Q). each of the second logic circuit 1006 (e.g., Q2) and the third logic circuit 1008 (e.g., Q3) is a D flip-flop and includes a first input (e.g., D), a second input (e.g., CLK), and an output (e.g., Q). Additionally, the fourth logic circuit 1010 is a counter and includes a first input (e.g., DEC), a second input (e.g., CLK), a third input (e.g., SET), and an output (e.g., O). Moreover, the comparator 1012 is a digital comparator and includes a first input, a second input, and an output. The first input of the comparator 1012 corresponds to a non-inverting input of the comparator 1012 while the second input of the comparator 1012 corresponds to an inverting input of the comparator 1012. Furthermore, the logic gate 1014 is a NOT gate and includes an input and an output.

In the example of FIG. 10, the first input of the first logic circuit 1004 is coupled to a logic value corresponding to a decimal value of one and the second input of the first logic circuit 1004 is coupled to the oscillator 1002. The third input of the first logic circuit 1004 is coupled to the encoded signal input. For example, the third input of the first logic circuit 1004 is coupled to the low voltage stage demodulator 344 of FIG. 3. In other examples, the third input of the first logic circuit 1004 is coupled to the low voltage stage demodulator 452 of FIG. 4. The output of the first logic circuit 1004 is coupled to the first input of second logic circuit 1006.

In the example of FIG. 10, the first logic circuit 1004 receives the encoded signal, the logic value corresponding to the decimal value of one, and the signal at the output of the oscillator 1002. In this manner, the output of the first logic circuit 1004 is set to a logic high value at the rising edge of the signal at the output of the oscillator 1002. The output of the first logic circuit 1004 is updated with a logic high value at the frequency of the signal at the output of the oscillator 1002. Additionally, when there is a logic low value on the encoded signal, the output of the first logic circuit 1004 is reset and/or otherwise cleared to a logic low value.

In the example of FIG. 10, the first input of the second logic circuit 1006 is coupled to the output of the first logic circuit 1004. The second input of the second logic circuit 1006 is coupled to the oscillator 1002. The output of the second logic circuit 1006 is coupled to the first input of third logic circuit 1008.

In the example of FIG. 10, the second logic circuit 1006 receives the output of the first logic circuit 1004 and the signal at the output of the oscillator 1002. In this manner, the output of the second logic circuit 1006 is set by the logic value of the output of the first logic circuit 1004 at the rising edge of the signal at the output of the oscillator 1002. The output of the second logic circuit 1006 is updated with the logic value of the output of the first logic circuit 1004 at the frequency of the signal at the output of the oscillator 1002.

In the example of FIG. 10, the first input of the third logic circuit 1008 is coupled to the output of the second logic circuit 1006. The second input of the third logic circuit 1008 is coupled to the oscillator 1002. The output of the third logic circuit 1008 is coupled to the third input of fourth logic circuit 1010.

In the example of FIG. 10, the third logic circuit 1008 receives the output of the second logic circuit 1006 and the signal at the output of the oscillator 1002. In this manner, the output of the third logic circuit 1008 is set by the logic value of the output of the second logic circuit 1006 at the rising edge of the signal at the output of the oscillator 1002. The output of the third logic circuit 1008 is updated with the logic value of the output of the second logic circuit 1006 at the frequency of the signal at the output of the oscillator 1002.

In the illustrated example of FIG. 10, the first input of the fourth logic circuit 1010 is coupled to the output of the comparator 1012, the second input of the fourth logic circuit 1010 is coupled to the oscillator 1002, the third input of the fourth logic circuit 1010 is coupled to the output of the third logic circuit 1008, and the output of the fourth logic circuit 1010 is coupled to the input of the comparator 1012. In the example of FIG. 10, the fourth logic circuit 1010 is an 8-bit counter.

In the example of FIG. 10, in operation, the output of the fourth logic circuit 1010 is initialized to a binary value corresponding to a decimal value of 146. At each rising edge of the signal at the output of the oscillator 1002, the output of the fourth logic circuit 1010 is updated based on the output of the comparator 1012. For example, when the output of the comparator 1012 is at a logic high value, the output of the fourth logic circuit 1010 can be decremented. If the fourth logic circuit 1010 receives a logic high value at the third input of the fourth logic circuit 1010, the count value of the fourth logic circuit 1010 is set to a logic value corresponding to a decimal value of 146.

In the example illustrated in FIG. 10, the fourth logic circuit 1010 may be implemented by one or more combinational logic circuit and/or one or more sequential logic circuits that decrements from a predetermined number to ensure that false UVLO events are not detected. For example, the fourth logic circuit 1010 may be implemented as a ripple counter using 8 D flip-flops.

In the example of FIG. 10, the comparator 1012 is a digital comparator that compares the output of the fourth logic circuit 1010 to a logic value corresponding to a decimal value of zero. The first input of the comparator 1012 is coupled to the output of the fourth logic circuit 1010, the second input of the comparator 1012 is coupled to the logic value corresponding to the decimal value of zero, and the output of the comparator 1012 is coupled to the first input of the fourth logic circuit 1010 and the input of the logic gate 1014.

In the illustrated example of FIG. 10, in operation, the comparator 1012 compares the output of the fourth logic circuit 1010 to the logic value corresponding to the decimal value of zero. When the output of the fourth logic circuit 1010 is greater than the logic value corresponding to the decimal value of zero, the comparator 1012 outputs a logic high value. When the output of the fourth logic circuit 1010 is less than or equal to the logic value corresponding to the decimal value of zero, the comparator 1012 outputs a logic low value.

In the example of FIG. 10, the logic gate 1014 is a NOT gate. The input of the logic gate 1014 is coupled to the output of the comparator 1012 and the output of the logic gate 1014 is coupled to the UVLO signal output. In operation, the logic gate 1014 outputs a logic high value when there is a logic low value at the output of the comparator 1012. Additionally, the logic gate 1014 outputs a logic low value when there is a logic high value at the output of the comparator 1012.

In the illustrated example of FIG. 10, in operation, the encoded signal at the encoded signal input is generally oscillating at the frequency of the APWM signal (e.g., the frequency $f_1$). As the comparator 1012 compares the output of the fourth logic circuit 1010 (e.g., a count value) to the logic value corresponding to the decimal value of zero, the UVLO decoder 350 implements a timer that ensures that a period of time greater than the period of the APWM signal passes before indicating a UVLO event. If the UVLO decoder 350 detects a rising edge on the encoded signal before the timer reaches (e.g., decrements to) the logic value corresponding to the decimal value of zero, the output of the fourth logic circuit 1010 (e.g., the count value) is set to a logic value of corresponding to a decimal value of 146. As such, the UVLO decoder 350 can accurately detect UVLO events and avoid false detection caused by the APWM signal.

In the example of FIG. 10, in operation, the UVLO decoder 350 starts a timer greater than one period of the APWM signal when there is a logic low value on the encoded signal. For example, in response to the first logic circuit 1004 detecting a logic low value on the encoded signal, the fourth logic circuit 1010 can decrement the count value of the fourth logic circuit 1010. If the UVLO decoder 350 detects a rising edge and/or a logic high value on the encoded signal before the timer expires (e.g., the output of the fourth logic circuit 1010 reaches a logic value corresponding to a decimal value of zero), the UVLO decoder 350 resets the timer and monitors the encoded signal for the next logic low value. If the UVLO decoder 350 does not detect a rising edge and/or logic high value before the timer expires, the UVLO decoder 350 indicates that a UVLO event has been detected. For example, in response to the count value of the fourth logic circuit 1010 meeting a threshold corresponding to a number of rising edges on the signal at the output of the oscillator 1002, the comparator 1012 can set the output of the logic gate 1014 to a logic high value (e.g., generate an indication) by outputting a logic low value.

Figure 11:
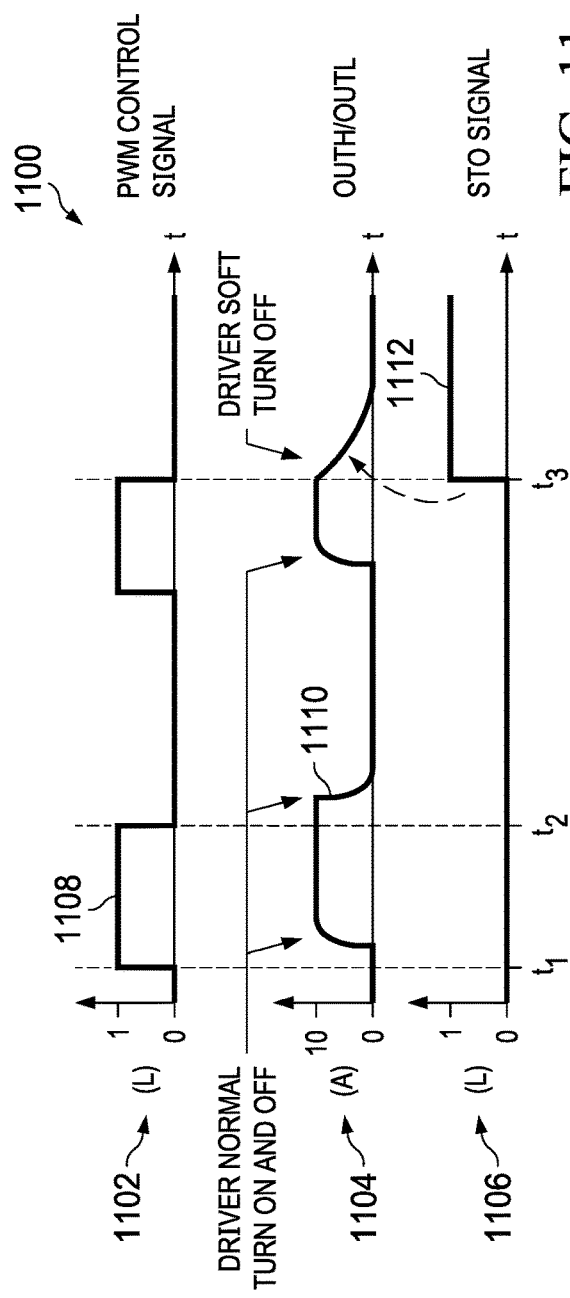
FIG. 11 is a graphical illustration depicting the operation of a power switching device controlled utilizing a gate driver system.

FIG. 11 is a graphical illustration 1100 depicting the operation of a power switching device controlled utilizing a gate driver system. For example, the gate driver system may be implemented by the gate driver system 300 of FIG. 3 and/or the gate driver system 400 of FIG. 4. Additionally, the power switching device may be implemented by, for example, the switch 306 of FIG. 3 and/or the switch 406 of FIG. 4. The graphical illustration 1100 includes an example first plot 1102, an example second plot 1104, and an example third plot 1106.

In the example of FIG. 11, the first plot 1102 is a plot of the PWM control signal versus time. The first plot 1102 includes a logic value axis (L) and a time axis (t). The example first plot 1102 includes an example first line 1108 that corresponds to the logical value of the signal input to at least one driver associated with the power switching device to enable PWM control (e.g., the PWM control signal). For example, the at least one driver may correspond to the driver 202 of FIG. 2, the driver 364 of FIG. 3 and/or FIG. 4, and/or the output stage circuit 474 of FIG. 4.

In the illustrated example of FIG. 11, the second plot 1104 is a plot of the output of a gate driver of the gate driver system versus time. The second plot 1104 includes a current value axis (A) and a time axis (t). The example second plot 1104 includes an example second line 1110 that corresponds to the value of the current output from the gate driver of the gate driver system. For example, the second line 1110 may correspond to the value of the current output from the seventh pin 352 and/or the eighth pin 354 of FIG. 3 and/or the ninth pin 456 and/or the tenth pin 458 of FIG. 4.

In the illustrated example of FIG. 11, the third plot 1106 is a plot of the output of an STO signal to the gate driver of the gate driver system versus time. The third plot 1106 includes a logic value axis (L) and a time axis (t). The example third plot 1106 includes an example third line 1112 that corresponds to the logical value of the signal input to at least one driver associated with the power switching device to enable STO of the power switching device (e.g., the STO signal). For example, the STO signal can be generated by the STO decoder 372 of FIGS. 3, 4, and 6.

In the example of FIG. 11, each of the first plot 1102, the second plot 1104, and the third plot 1106 includes a first time, t₁, a second time, t₂, and a third time, t₃. At the first time, the first line 1108 transitions from a logic low value to a logic high value, the second line 1110 is at a current value of zero amps, and the third line 1112 is at a logic low value. As a result of the rising edge of the first line 1108 at the first time, the at least one gate driver of the gate driver system (e.g., the driver 364) outputs ten amps of current to the power switching device (e.g., the switch 306 of FIG. 3 and/or the switch 406 of FIG. 4).

In the example illustrated in FIG. 11, at the second time, the first line 1108 transitions from a logic high value to a logic low value, the second line 1110 is a current value of ten amps, and the third line 1112 is at a logic low value. As a result of the falling edge of the first line 1108 at the second time, the at least one gate driver of the gate driver system (e.g., the driver 364) sinks ten amps of current to the power switching device (e.g., the switch 306 of FIG. 3 and/or the switch 406 of FIG. 4). Such a sinking of the current from the power switching device corresponds to hard turn off of the power switching device.

In the example of FIG. 11, at the third time, the third line 1112 transitions from a logic low value to a logic high value. In response to the rising edge on the third line 1112, the first line 1108 transitions from a logic high value to a logic low value and the second line 1110 begins to decrease from a current value of ten amps to a current value of zero amps. As a result of the rising edge of the third line 1112 at the third time, the at least one gate driver of the gate driver system (e.g., the driver 364) sinks ten amps of current to the power switching device (e.g., the switch 306 of FIG. 3 and/or the switch 406 of FIG. 4). Such a sinking of the current from the power switching device corresponds to soft turn off of the power switching device. For example, the at least one gate driver of the gate driver system can first draw half an amp from the power switching device (e.g., the switch 306 of FIG. 3 and/or the switch 406 of FIG. 4) to reduce the charge control voltage (e.g., gate-to-source voltage) of the power switching device (e.g., the switch 306 of FIG. 3 and/or the switch 406 of FIG. 4), thereby reducing the current flowing through the power switching device (e.g., the switch 306 of FIG. 3 and/or the switch 406 of FIG. 4), and then draw ten amps of current from the power switching device (e.g., the switch 306 of FIG. 3 and/or the switch 406 of FIG. 4) to reduce the charge control voltage (e.g., gate-to-source voltage) of the power switching device (e.g., the switch 306 of FIG. 3 and/or the switch 406 of FIG. 4) below the threshold voltage level for conduction of the power switching device (e.g., the switch 306 of FIG. 3 and/or the switch 406 of FIG. 4).

Figure 12:
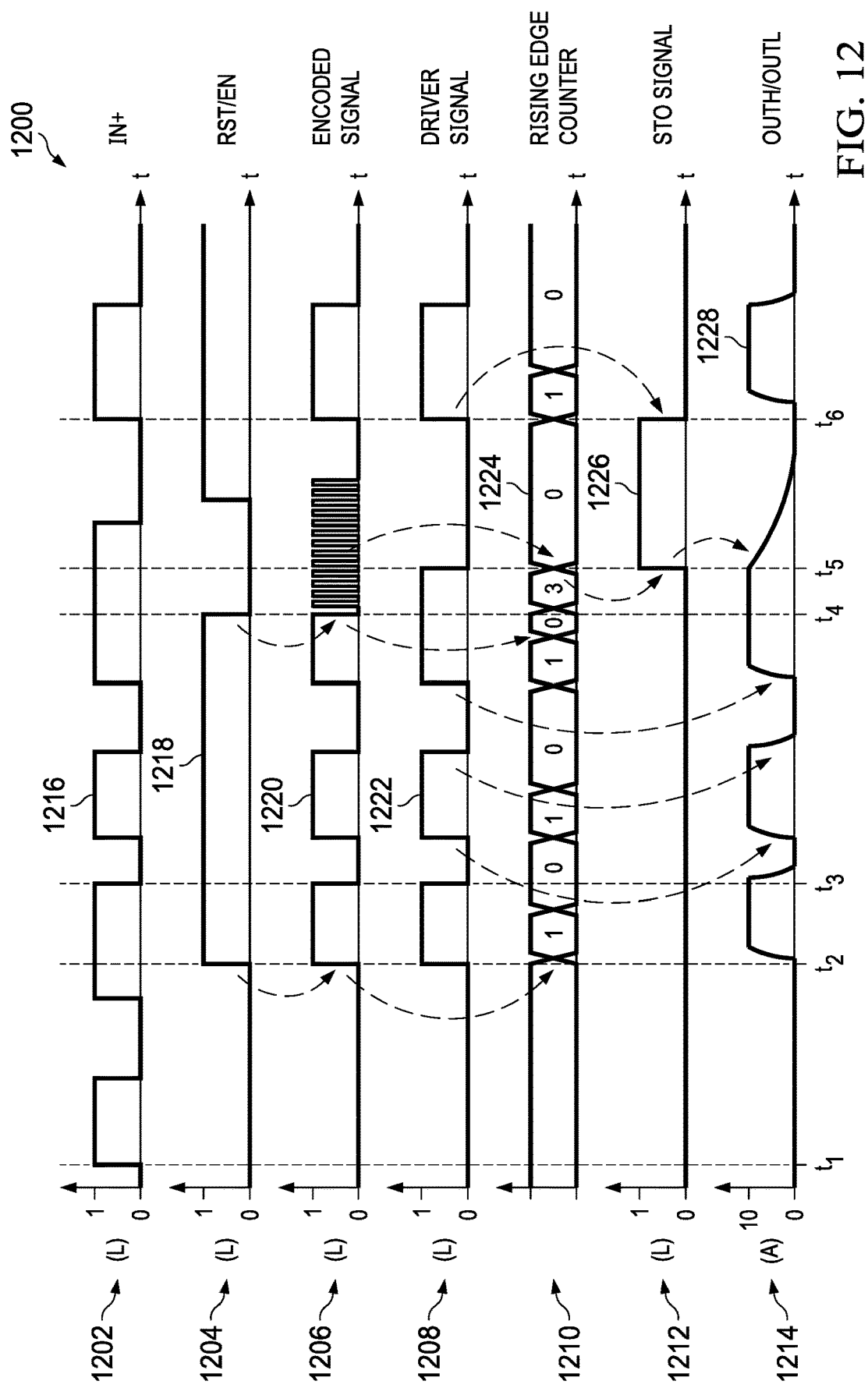
FIG. 12 is a graphical illustration depicting the operation of a power switching device and an isolated gate driver when utilizing multiple encoded signals to control the power switching device.

FIG. 12 is a graphical illustration 1200 depicting the operation of a power switching device and an isolated gate driver when utilizing multiple encoded signals to control the power switching device. For example, the isolated gate driver may be implemented by the isolated gate driver 304 of FIG. 3 and/or the isolated gate driver 404 of FIG. 4. Additionally, the power switching device may be implemented by, for example, the switch 306 of FIG. 3 and/or the switch 406 of FIG. 4. The graphical illustration 1200 includes an example first plot 1202, an example second plot 1204, an example third plot 1206, an example fourth plot 1208, an example fifth plot 1210, an example sixth plot 1212, and an example seventh plot 1214.

In the example of FIG. 12, the first plot 1202 is a plot of a PWM input signal from a computing system to the isolated gate driver versus time. The first plot 1202 includes a logic value axis (L) and a time axis (t). The example first plot 1202 includes an example first line 1216 that corresponds to the logical value of the signal input to at least one PWM input of the isolated gate driver (e.g., the first signal IN+). For example, the at least one PWM input of the isolated gate driver may correspond to the first pin 328 of the isolated gate driver 304 of FIG. 3 and/or the first pin 430 of the isolated gate driver 404 of FIG. 4.

In the illustrated example of FIG. 12, the second plot 1204 is a plot of the logic value at the RST/EN pin of the isolated gate driver versus time. For example, the RST/EN pin may be implemented by the third pin 332 of FIG. 3 and/or the third pin 434 of FIG. 4. The second plot 1204 includes a logic value axis (L) and a time axis (t). The example second plot 1204 includes an example second line 1218 that corresponds to the logic value at the RST/EN pin of the isolated gate driver. For example, the second line 1218 may correspond to the logic value at the third pin 332 and/or the third pin 434 of FIG. 4.

In the illustrated example of FIG. 12, the third plot 1206 is a plot of an encoded signal to be transmitted between a low voltage stage and a high voltage stage of the isolated gate driver versus time. The third plot 1206 includes a logic value axis (L) and a time axis (t). The example third plot 1206 includes an example third line 1220 that corresponds to the logical value of the encoded signal. For example, the low voltage stage signal converter 340 of FIG. 3 and/or the low voltage stage signal converter 448 of FIG. 4 can generate the encoded signal (e.g., the third line 1220).

In the illustrated example of FIG. 12, the fourth plot 1208 is a plot of a signal processed by at least one driver in the isolated gate driver (e.g., the driver 364) versus time. The fourth plot 1208 includes a logic value axis (L) and a time axis (t). The example fourth plot 1208 includes an example fourth line 1222 that corresponds to the logical value of the encoded signal after it is processed by the at least one driver of the isolated gate driver. For example, driver 364 of FIGS. 3 and 4 includes a deglitch filter to filter high frequencies (e.g., the frequency $f_2$, the frequency $f_3$, frequencies in the range of 10s of MHz, etc.) from the encoded signal (e.g., the third line 1220).

In the illustrated example of FIG. 12, the fifth plot 1210 is a plot of a count value of a rising edge counter (e.g., the rising edge counter 604 of FIG. 6) versus time. The example fifth plot 1210 includes an example fifth line 1224 that corresponds to the count value of a rising edge counter in an STO decoder of the isolated gate driver (e.g., the STO decoder 372 of FIGS. 3, 4, and 6). For example, the rising edge counter 604 of FIG. 6 counts the rising edges of the encoded signal over a predetermined period of time.

In the example of FIG. 12, the sixth plot 1212 is a plot of an STO signal generated by an STO decoder of the isolated gate driver (e.g., the STO decoder 372 of FIGS. 3, 4, and 6) versus time. The example sixth plot 1212 includes an example sixth line 1226 that corresponds to the logic value of the STO signal. For example, the STO decoder 372 of FIGS. 3, 4, and 6 can generate the STO signal (e.g., the sixth line 1226).

In the illustrated example of FIG. 12, the seventh plot 1214 is a plot of the output of at least one driver of the isolated gate driver versus time. The seventh plot 1214 includes a current value axis (A) and a time axis (t). The example seventh plot 1214 includes an example seventh line 1228 that corresponds to the value of the current output from the at least one driver of the isolated gate driver. For example, the seventh line 1228 may correspond to the value of the current output from the seventh pin 352 and/or the eighth pin 354 of FIG. 3 and/or the ninth pin 456 and/or the tenth pin 458 of FIG. 4.

In the example of FIG. 12, each of the first plot 1202, the second plot 1204, the third plot 1206, the fourth plot 1208, the fifth plot 1210, the sixth plot 1212, and the seventh plot 1214 includes a first time, $t_1$, a second time, $t_2$, a third time, $t_3$, a fourth time, $t_4$, a fifth time, $t_5$, and a sixth time, $t_6$. At the first time, the first line 1216 transitions from a logic low value to a logic high value, the second line 1218 is at a logic low value, the third line 1220 is at a logic low value, the fourth line 1222 is at a logic low value, the fifth line 1224 is at a count value of zero, the sixth line 1226 is at a logic low value, and the seventh line 1228 is at a current value of zero amps. Because the second line 1218 (e.g., the RST/EN signal) is at a logic low value, the isolated gate driver (e.g., the isolated gate driver 304 of FIG. 3 and/or the isolated gate driver 404 of FIG. 4) is disabled and the rising edge on the first line 1216 does not affect the operation of the isolated gate driver.

In the example illustrated in FIG. 12, at the second time, the first line 1216 is at a logic high value, the second line 1218 transitions from a logic low value to a logic high value, the third line 1220 transitions from a logic low value to a logic high value, the fourth line 1222 transitions from a logic low value to a logic high value, the fifth line 1224 is at a count value of one, the sixth line 1226 is at a logic low value, and the seventh line 1228 is at a current value of zero amps. As a result of the rising edge of the second line 1218 at the second time, the isolated gate driver (e.g., the isolated gate driver 304 of FIG. 3 and/or the isolated gate driver 404 of FIG. 4) is enabled and the logic high value on the first line 1216 causes the at least one driver (e.g., the driver 364) outputs ten amps to the power switching device (e.g., the switch 306 of FIG. 3 and/or the switch 406 of FIG. 4).

In the example of FIG. 12, at the third time, the first line 1216 transitions from a logic high value to a logic low value, the second line 1218 is at a logic high value, the third line 1220 transitions from a logic high value to a logic low value, the fourth line 1222 transitions from a logic high value to a logic low value, the fifth line 1224 is at a count value of zero, the sixth line 1226 is at a logic low value, and the seventh line 1228 is at a current value of ten amps. As a result of the falling edge of the first line 1216 at the third time, the at least one gate driver of the isolated gate driver (e.g., the driver 364) sinks ten amps of current to the power switching device (e.g., the switch 306 of FIG. 3 and/or the switch 406 of FIG. 4). Such a sinking of the current from the power switching device corresponds to hard turn off of the power switching device.

In the illustrated example of FIG. 12, at the fourth time, the first line 1216 is at a logic high value, the second line 1218 transitions from a logic high value to a logic low value, the third line 1220 transitions from a logic low value to a logic high value, the fourth line 1222 is at a logic high value, the fifth line 1224 is at a count value of zero, the sixth line 1226 is at a logic low value, and the seventh line 1228 is at a current value of ten amps. As a result of the falling edge of the second line 1218 at the fourth time, the STO encoder of the isolated gate driver (e.g., the STO encoder 346 of FIGS. 3, 4, and 5) encodes an STO event into the encoded signal (e.g., the third line 1220). For example, the STO encoder 346 encodes the STO event as a predetermined number of pulses (e.g., 64) at the frequency $f_2$.

In the example of FIG. 12, at the fifth time, the first line 1216 is at a logic high value, the second line 1218 is at a logic low value, the third line 1220 is at a logic low value, the fourth line 1222 transitions from a logic high value to a logic low value, the fifth line 1224 is at a count value of three, the sixth line 1226 transitions from a logic low value to a logic high value, and the seventh line 1228 begins to decrease from a current value of ten amps to a current value of zero amps. As a result of the count value of three on the fifth line 1224 at the fifth time, the STO decoder of the isolated gate driver (e.g., the STO decoder 372 of FIGS. 3, 4, and 6) decodes the STO event and generates a logic high value on the sixth line 1226. For example, the STO decoder 372 generates a logic high value on the STO signal (e.g., the sixth line 1226). Additionally, as a result of the rising edge of the sixth line 1226 at the fifth time, the at least one driver of the isolated gate driver (e.g., the driver 364) sinks ten amps of current to the power switching device (e.g., the switch 306 of FIG. 3 and/or the switch 406 of FIG. 4). Such a sinking of the current from the power switching device corresponds to soft turn off of the power switching device. For example, the at least one driver of the isolated gate driver can first draw half an amp from the power switching device (e.g., the switch 306 of FIG. 3 and/or the switch 406 of FIG. 4) to reduce the charge control voltage (e.g., gate-to-source voltage) of the power switching device (e.g., the switch 306 of FIG. 3 and/or the switch 406 of FIG. 4), thereby reducing the current flowing through the power switching device (e.g., the switch 306 of FIG. 3 and/or the switch 406 of FIG. 4), and then draw ten amps of current from the power switching device (e.g., the switch 306 of FIG. 3 and/or the switch 406 of FIG. 4) to reduce the charge control voltage (e.g., gate-to-source voltage) of the power switching device (e.g., the switch 306 of FIG. 3 and/or the switch 406 of FIG. 4) below the threshold voltage level for conduction of the power switching device (e.g., the switch 306 of FIG. 3 and/or the switch 406 of FIG. 4).

In the illustrated example of FIG. 12, at the sixth time, the first line 1216 transitions from a logic low value to a logic high value, the second line 1218 is at a logic high value, the third line 1220 transitions from a logic low value to a logic high value, the fourth line 1222 transitions from a logic low value to a logic high value, the fifth line 1224 is at a count value of zero, the sixth line 1226 transitions from a logic high value to a logic low value, and the seventh line 1228 is at a current value of zero amps. As a result of the rising edge on the first line 1216 at the sixth time, the at least one driver of the isolated gate driver (e.g., the driver 364) outputs ten amps of current to the power switching device (e.g., the switch 306 of FIG. 3 and/or the switch 406 of FIG. 4).

Figure 13:
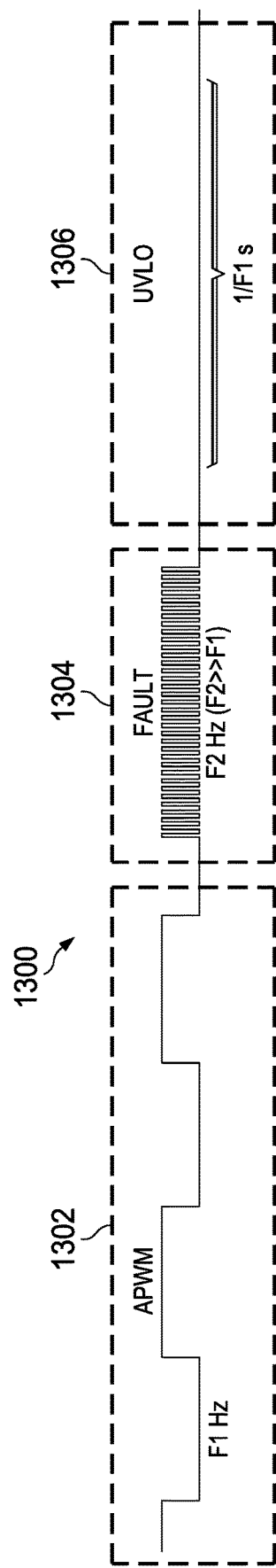
FIG. 13 is a graphical illustration depicting an example signal including multiple encoded signal encoded by an isolated gate driver to sense a power switching device.

FIG. 13 is a graphical illustration depicting an example signal 1300 including multiple encoded signal encoded by an isolated gate driver to sense a power switching device. For example, the isolated gate driver may be implemented by the isolated gate driver 304 of FIG. 3 and/or the isolated gate driver 404 of FIG. 4. Additionally, the power switching device may be implemented by, for example, the switch 306 of FIG. 3 and/or the switch 406 of FIG. 4. The example signal 1300 includes an example first encoded signal 1302, an example second encoded signal 1304, and an example third encoded signal 1306.

In the example of FIG. 13, the first encoded signal 1302 corresponds to an APWM signal representative of a characteristic of the power switching device (e.g., the switch 306 of FIG. 3 and/or the switch 406 of FIG. 4). The APWM signal is representative of a voltage value converted into a PWM signal (e.g., a pulse width modulated signal). The first encoded signal 1302 includes a frequency, $f_1$. The frequency of the first encoded signal 1302 is in the range of 100s of kHz, for example, the frequency of the first encoded signal 1302 is 400 kHz.

In the illustrated example of FIG. 13, the second encoded signal 1304 corresponds to a fault signal (e.g., an FLT signal) representative of a fault corresponding to the power switching device (e.g., the switch 306 of FIG. 3 and/or the switch 406 of FIG. 4). For example, the fault can correspond to an over current condition of the power switching device. The second encoded signal 1304 includes a frequency, $f_2$. The frequency of the second encoded signal 1304 is much greater than the frequency of the first encoded signal 1302. For example, the frequency of the second encoded signal 1304 is in the range of 10s of MHz Furthermore, the second encoded signal 1304 is encoded at the frequency $f_2$, for 36 cycles to reduce the distortion in the first encoded signal (e.g., the APWM signal).

In the example of FIG. 13, the third encoded signal 1306 corresponds to an UVLO signal representative of an under-voltage condition of the supply voltage of the isolated gate driver (e.g., the isolated gate driver 304 of FIG. 3 and/or the isolated gate driver 404 of FIG. 4). The third encoded signal 1306 is at a voltage level and/or logic value of zero. The third encoded signal 1306 is in held at the voltage level and/or logic value of zero for a predetermined number of clock cycles. For example, the third encoded signal 1306 is in held at the voltage level and/or logic value of zero for 240 clock cycles of a clock at the frequency of the second encoded signal 1304.

Figure 14:
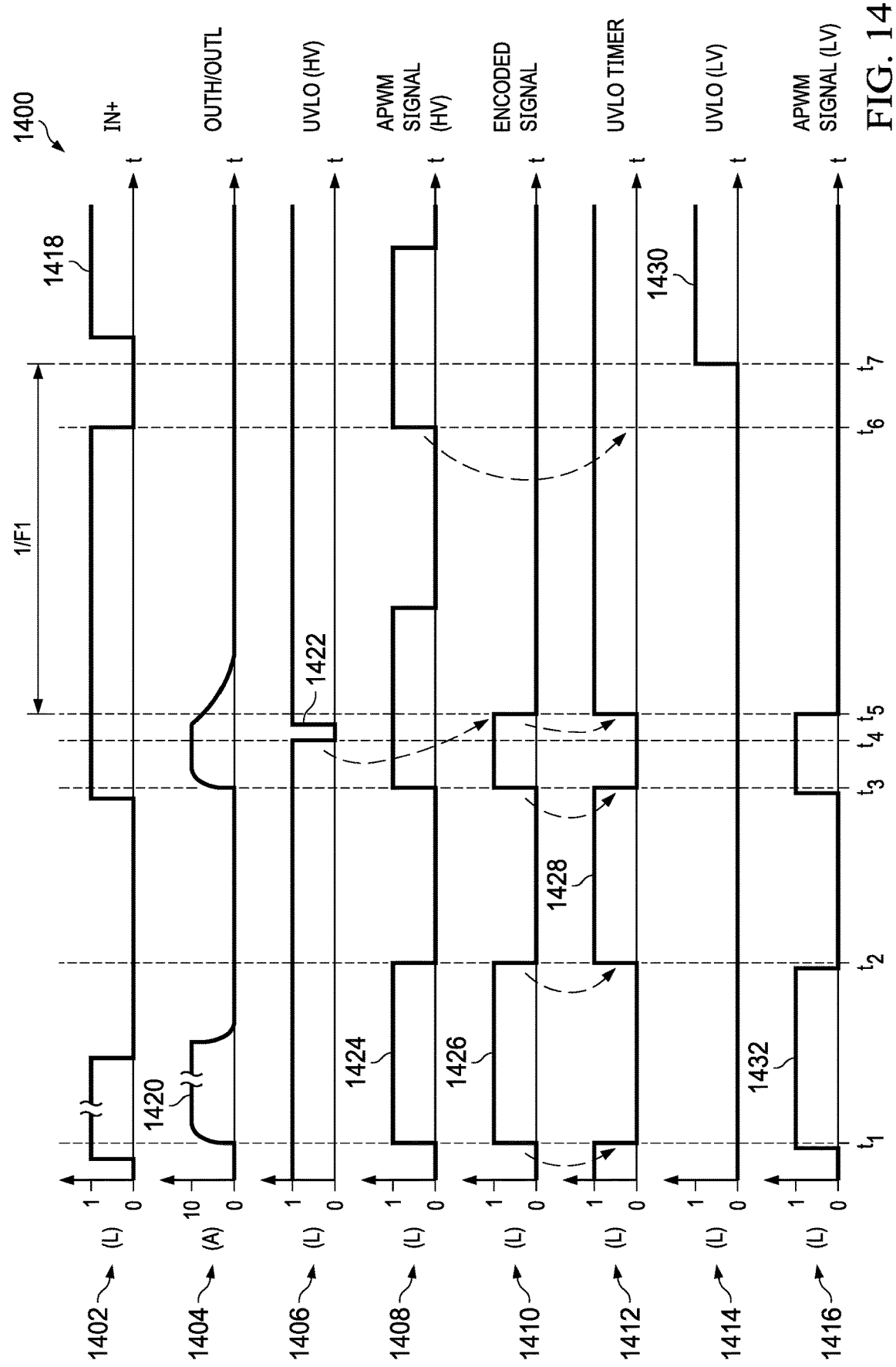
FIG. 14 is a graphical illustration depicting the operation of an isolated gate driver when sensing under voltage condition of the isolated gate driver.

FIG. 14 is a graphical illustration 1400 depicting the operation of an isolated gate driver when sensing under voltage condition of the isolated gate driver. For example, the isolated gate driver may be implemented by the isolated gate driver 304 of FIG. 3 and/or the isolated gate driver 404 of FIG. 4. The graphical illustration 1400 includes an example first plot 1402, an example second plot 1404, an example third plot 1406, an example fourth plot 1408, an example fifth plot 1410, an example sixth plot 1412, an example seventh plot 1414, and an example eighth plot 1416.

In the example of FIG. 14, the first plot 1402 is a plot of a PWM input signal from a computing system to the isolated gate driver versus time. The first plot 1402 includes a logic value axis (L) and a time axis (t). The example first plot 1402 includes an example first line 1418 that corresponds to the logical value of the signal input to at least one PWM input of the isolated gate driver (e.g., the first signal IN+). For example, the at least one PWM input of the isolated gate driver may correspond to the first pin 328 of the isolated gate driver 304 of FIG. 3 and/or the first pin 430 of the isolated gate driver 404 of FIG. 4.

In the illustrated example of FIG. 14, the second plot 1404 is a plot of the output of at least one driver of the isolated gate driver versus time. The second plot 1404 includes a current value axis (A) and a time axis (t). The example second plot 1404 includes an example second line 1420 that corresponds to the value of the current output from the at least one driver of the isolated gate driver. For example, the second line 1420 may correspond to the value of the current output from the seventh pin 352 and/or the eighth pin 354 of FIG. 3 and/or the ninth pin 456 and/or the tenth pin 458 of FIG. 4.

In the illustrated example of FIG. 14, the third plot 1406 is a plot of the logic value of a UVLO signal generated by a UVLO sensor of the isolated gate driver versus time. For example, the UVLO sensor may be implemented by the UVLO sensor 368 of FIGS. 3 and 4. The third plot 1406 includes a logic value axis (L) and a time axis (t). The example third plot 1406 includes an example third line 1422 that corresponds to the logic value of the UVLO signal generated by the UVLO sensor of the isolated gate driver. For example, the UVLO sensor 368 of FIGS. 3 and 4 can generate the UVLO signal (e.g., the third line 1422).

In the illustrated example of FIG. 14, the fourth plot 1408 is a plot of an APWM signal generated by an APWM converter of the isolated gate driver versus time. The fourth plot 1408 includes a logic value axis (L) and a time axis (t). The example fourth plot 1408 includes an example fourth line 1424 that corresponds to the logical value of the APWM signal of the APWM converter of the isolated gate driver. For example, the APWM signal generator 366 of FIGS. 3 and 4 can generate the APWM signal (e.g., the fourth line 1424).

In the illustrated example of FIG. 14, the fifth plot 1410 is a plot of an encoded signal transmitted from a low voltage stage and received at a high voltage stage of the isolated gate driver versus time. The fifth plot 1410 includes a logic value axis (L) and a time axis (t). The example fifth plot 1410 includes an example fifth line 1426 that corresponds to the logical value of the encoded signal. For example, the low voltage stage demodulator 344 of FIG. 3 and/or the low voltage stage demodulator 452 of FIG. 4 can generate the encoded signal (e.g., the fifth line 1426) to be processed by the low voltage stage signal converter 340 of FIG. 3 and/or the low voltage stage signal converter 448 of FIG. 4.

In the illustrated example of FIG. 14, the sixth plot 1412 is a plot of a logic value representative of a timer of a UVLO decoder of an isolated gate driver versus time. The example sixth plot 1412 includes an example sixth line 1428 that corresponds to the logic value of a timer of a UVLO decoder of the isolated gate driver (e.g., the UVLO decoder 350 of FIGS. 3, 4, and 10). For example, the second logic circuit 1006 generates the logic value representative of the timer of the UVLO decoder 350 (e.g., the sixth line 1428).

In the example of FIG. 14, the seventh plot 1414 is a plot of a UVLO signal generated by a UVLO decoder of the isolated gate driver (e.g., the UVLO decoder 350 of FIGS. 3, 4, and 10) versus time. The example seventh plot 1414 includes an example seventh line 1430 that corresponds to the logic value of the UVLO signal. For example, the UVLO decoder 350 of FIGS. 3, 4, and 10 can generate the UVLO signal (e.g., the seventh line 1430).

In the illustrated example of FIG. 14, the eighth plot 1416 is a plot of an APWM signal on the low voltage stage of the isolated gate driver. The eighth plot 1416 includes a logic value axis (L) and a time axis (t). The example eighth plot 1416 includes an example eighth line 1432 that corresponds to the logical value of the APWM signal on the low voltage stage of the isolated gate driver. For example, the eighth line 1432 may correspond to the logic value at the output of the fourth pin 334 of FIG. 3 and/or the fourth pin 436 of FIG. 4.

In the example of FIG. 14, each of the first plot 1402, the second plot 1404, the third plot 1406, the fourth plot 1408, the fifth plot 1410, the sixth plot 1412, the seventh plot 1414, and the eighth plot 1416 includes a first time, $t_1$, a second time, $t_2$, a third time, $t_3$, a fourth time, $t_4$, a fifth time, $t_5$, a sixth time, $t_6$, and a seventh time, $t_7$. At the first time, the first line 1418 is at a logic high value, the second line 1420 begins to increase from a current value of zero amps to a current value of ten amps, the third line 1422 is at a logic high value, the fourth line 1424 transitions from a logic low value to a logic high value, the fifth line 1426 transitions from a logic low value to a logic high value, the sixth line 1428 transitions from a logic high value to a logic low value, the seventh line 1430 is at a logic low value, and the eighth line 1432 is at a logic high value. The rising edge on the fifth line 1426 (e.g., the encoded signal) corresponds to the rising edge on the fourth line 1424 (e.g., the APWM signal). Additionally, as a result of the rising edge on the fifth line 1426 (e.g., the encoded signal), the sixth line 1428 (e.g., the logic value of a timer of a UVLO decoder of the isolated gate driver) transitions from a logic high value to a logic low value.

In the example illustrated in FIG. 14, at the second time, the first line 1418 is at a logic low value, the second line 1420 is at a current value of zero amps, the third line 1422 is at a logic high value, the fourth line 1424 transitions from a logic high value to a logic low value, the fifth line 1426 transitions from a logic high value to a logic low value, the sixth line 1428 transitions from a logic low value to a logic high value, the seventh line 1430 is at a logic low value, and the eighth line 1432 is at a logic low value. The falling edge on the fifth line 1426 (e.g., the encoded signal) corresponds to the falling edge on the fourth line 1424 (e.g., the APWM signal). Additionally, as a result of the falling edge on the fifth line 1426 (e.g., the encoded signal), the sixth line 1428 (e.g., the logic value of a timer of a UVLO decoder of the isolated gate driver) transitions from a logic low value to a logic high value.

In the example of FIG. 14, at the third time, the first line 1418 is at a logic high value, the second line 1420 begins to increase from a current value of zero amps to a current value of ten amps, the third line 1422 is at a logic high value, the fourth line 1424 transitions from a logic low value to a logic high value, the fifth line 1426 transitions from a logic low value to a logic high value, the sixth line 1428 transitions from a logic high value to a logic low value, the seventh line 1430 is at a logic low value, and the eighth line 1432 is at a logic high value. The rising edge on the fifth line 1426 (e.g., the encoded signal) corresponds to the rising edge on the fourth line 1424 (e.g., the APWM signal). Additionally, as a result of the rising edge on the fifth line 1426 (e.g., the encoded signal), the sixth line 1428 (e.g., the logic value of a timer of a UVLO decoder of the isolated gate driver) transitions from a logic high value to a logic low value. Furthermore, because the rising edge on the fifth line 1426 occurred before the timer of the UVLO decoder expired (e.g., before the timer of the UVLO decoder expired), the UVLO decoder does not indicate a UVLO event.

In the illustrated example of FIG. 14, at the fourth time, the first line 1418 is at a logic high value, the second line 1420 is at a current value of ten amps, the third line 1422 transitions from a logic high value to a logic low value, the fourth line 1424 is at a logic high value, the fifth line 1426 is at a logic high value, the sixth line 1428 is at a logic low value, the seventh line 1430 is at a logic low value, and the eighth line 1432 is at a logic high value. As a result of the logic low value on the third line 1422 between the fourth time and the fifth time, the UVLO encoder of the isolated gate driver (e.g., the UVLO encoder 376 of FIGS. 3, 4, and 9) encodes a UVLO event into the encoded signal (e.g., the fifth line 1426). For example, the UVLO encoder 376 encodes the UVLO event as a voltage level and/or a logic value of zero for a predetermined number of pulses (e.g., 240) at the frequency $f_3$. Additionally, in response to the logic low value on the third line 1422 (e.g., the UVLO signal), at least one driver of the isolated gate driver (e.g., the driver 364 of FIGS. 3 and 4) initiates STO of the power switching device (e.g., the switch 306 of FIG. 3 and/or the switch 406 of FIG. 4).

In the example of FIG. 14, at the fifth time, the first line 1418 is at a logic high value, the second line 1420 is decreasing from a current value of ten amps to a current value of zero amps, the third line 1422 is at a logic high value, the fourth line 1424 is at a logic high value, the fifth line 1426 transitions from a logic high value to a logic low value, the sixth line 1428 transitions from a logic low value to a logic high value, the seventh line 1430 is at a logic low value, and the eighth line 1432 transitions from a logic high value to a logic low value. The falling edge on the fifth line 1426 (e.g., the encoded signal) is representative of the UVLO event (e.g., the logic low value on the third line 1422 between the fourth time and the fifth time). Additionally, as a result of the falling edge on the fifth line 1426 (e.g., the encoded signal), the sixth line 1428 (e.g., the logic value of a timer of a UVLO decoder of the isolated gate driver) transitions from a logic low value to a logic high value.

In the illustrated example of FIG. 14, at the sixth time, the first line 1418 transitions from a logic high value to a logic low value, the second line 1420 is at a current value of zero amps, the third line 1422 is at a logic high value, the fourth line 1424 transitions from a logic low value to a logic high value, the fifth line 1426 is at a logic low value, the sixth line 1428 is at a logic high value, the seventh line 1430 is at a logic low value, and the eighth line 1432 is at a logic low value. As a result of the logic low value on the third line 1422 between the fourth time and the fifth time, the rising edge on the fourth line 1424 at the sixth time is not encoded into the encoded signal. For example, at the sixth time, because the UVLO event encoded into the encoded signal (e.g., the fifth line 1426) by the UVLO encoder 376 of FIGS. 3, 4, and 9 is longer than the period of the APWM signal (e.g., greater than the period corresponding to the inverse of the frequency $f_1$), the high voltage stage signal converter 360 of FIG. 3 and/or the high voltage stage signal converter 470 of FIG. 4 does not encode the rising edge of the APWM signal (e.g., the fourth line 1424) into the encoded signal (e.g., the fifth line 1426).

In the example of FIG. 14, at the seventh time, the first line 1418 is at a logic low value, the second line 1420 is at a current value of zero amps, the third line 1422 is at a logic high value, the fourth line 1424 is at a logic high value, the fifth line 1426 is at a logic low value, the sixth line 1428 is at a logic high value, the seventh line 1430 transitions from a logic low value to a logic high value, and the eighth line 1432 is at a logic low value. As a result of the rising edge on the seventh line 1430 at the seventh time, a UVLO event is indicated to a computing system coupled to the isolated gate driver. For example, the low voltage stage signal converter 340 of FIG. 3 and/or the low voltage stage signal converter 448 of FIG. 4 indicated a UVLO event to the computing system 302 of FIG. 3 and/or the computing system 402 of FIG. 4.

Figure 15:
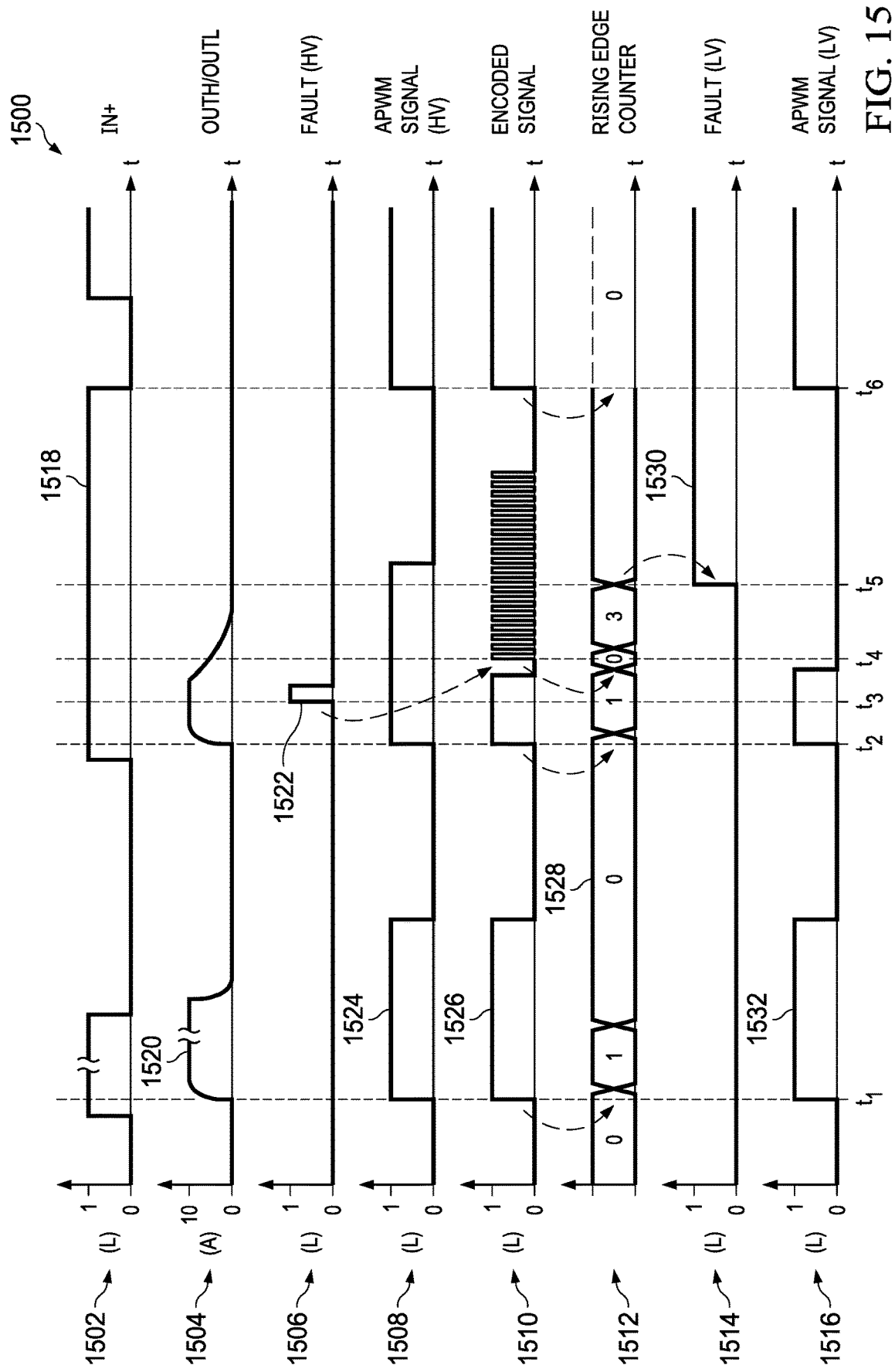
FIG. 15 is a graphical illustration depicting the operation of an isolated gate driver when sensing a fault condition of a power switching device.

FIG. 15 is a graphical illustration 1500 depicting the operation of an isolated gate driver when sensing a fault condition of a power switching device. For example, the isolated gate driver may be implemented by the isolated gate driver 304 of FIG. 3 and/or the isolated gate driver 404 of FIG. 4. The graphical illustration 1500 includes an example first plot 1502, an example second plot 1504, an example third plot 1506, an example fourth plot 1508, an example fifth plot 1510, an example sixth plot 1512, an example seventh plot 1514, and an example eighth plot 1516.

In the example of FIG. 15, the first plot 1502 is a plot of a PWM input signal from a computing system to the isolated gate driver versus time. The first plot 1502 includes a logic value axis (L) and a time axis (t). The example first plot 1502 includes an example first line 1518 that corresponds to the logical value of the signal input to at least one PWM input of the isolated gate driver (e.g., the first signal IN+). For example, the at least one PWM input of the isolated gate driver may correspond to the first pin 328 of the isolated gate driver 304 of FIG. 3 and/or the first pin 430 of the isolated gate driver 404 of FIG. 4.

In the illustrated example of FIG. 15, the second plot 1504 is a plot of the output of at least one driver of the isolated gate driver versus time. The second plot 1504 includes a current value axis (A) and a time axis (t). The example second plot 1504 includes an example second line 1520 that corresponds to the value of the current output from the at least one driver of the isolated gate driver. For example, the second line 1520 may correspond to the value of the current output from the seventh pin 352 and/or the eighth pin 354 of FIG. 3 and/or the ninth pin 456 and/or the tenth pin 458 of FIG. 4.

In the illustrated example of FIG. 15, the third plot 1506 is a plot of the logic value of a FLT signal generated by a fault sensor of the isolated gate driver versus time. For example, the fault sensor may be implemented by the fault sensor 370 of FIGS. 3 and 4. The third plot 1506 includes a logic value axis (L) and a time axis (t). The example third plot 1506 includes an example third line 1522 that corresponds to the logic value of the FLT signal generated by the fault sensor of the isolated gate driver. For example, the fault sensor 370 of FIGS. 3 and 4 can generate the fault signal (e.g., the FLT signal, the third line 1522).

In the illustrated example of FIG. 15, the fourth plot 1508 is a plot of an APWM signal generated by an APWM converter of the isolated gate driver versus time. The fourth plot 1508 includes a logic value axis (L) and a time axis (t). The example fourth plot 1508 includes an example fourth line 1524 that corresponds to the logical value of the APWM signal of the APWM converter of the isolated gate driver. For example, the APWM signal generator 366 of FIGS. 3 and 4 can generate the APWM signal (e.g., the fourth line 1524).

In the illustrated example of FIG. 15, the fifth plot 1510 is a plot of an encoded signal transmitted from a low voltage stage and received at a high voltage stage of the isolated gate driver versus time. The fifth plot 1510 includes a logic value axis (L) and a time axis (t). The example fifth plot 1510 includes an example fifth line 1526 that corresponds to the logical value of the encoded signal. For example, the low voltage stage demodulator 344 of FIG. 3 and/or the low voltage stage demodulator 452 of FIG. 4 can generate the encoded signal (e.g., the fifth line 1426) to be processed by the low voltage stage signal converter 340 of FIG. 3 and/or the low voltage stage signal converter 448 of FIG. 4.

In the illustrated example of FIG. 15, the sixth plot 1512 is a plot of a count value of a rising edge counter (e.g., the rising edge counter 804 of FIG. 8) versus time. The example sixth plot 1512 includes an example sixth line 1528 that corresponds to the count value of a rising edge counter in a fault decoder of the isolated gate driver (e.g., the fault decoder 348 of FIGS. 3, 4, and 8). For example, the rising edge counter 804 of FIG. 8 counts the rising edges of the encoded signal over a predetermined period of time.

In the example of FIG. 15, the seventh plot 1514 is a plot of a FLT signal generated by a fault decoder of the isolated gate driver (e.g., the fault decoder 348 of FIGS. 3, 4, and 8) versus time. The example seventh plot 1514 includes an example seventh line 1530 that corresponds to the logic value of the FLT signal. For example, the fault decoder 348 of FIGS. 3, 4, and 8 can generate the FLT signal (e.g., the seventh line 1530).

In the illustrated example of FIG. 15, the eighth plot 1516 is a plot of an APWM signal on the low voltage stage of the isolated gate driver. The eighth plot 1516 includes a logic value axis (L) and a time axis (t). The example eighth plot 1516 includes an example eighth line 1532 that corresponds to the logical value of the APWM signal on the low voltage stage of the isolated gate driver. For example, the eighth line 1532 may correspond to the logic value at the output of the fourth pin 334 of FIG. 3 and/or the fourth pin 436 of FIG. 4.

In the example of FIG. 15, each of the first plot 1502, the second plot 1504, the third plot 1506, the fourth plot 1508, the fifth plot 1510, the sixth plot 1512, the seventh plot 1514, and the eighth plot 1516 includes a first time, $t_1$, a second time, $t_2$, a third time, $t_3$, a fourth time, $t_4$, a fifth time, $t_5$, and a sixth time, $t_6$. At the first time, the first line 1518 is at a logic high value, the second line 1520 begins to increase from a current value of zero amps to a current value of ten amps, the third line 1522 is at a logic low value, the fourth line 1524 transitions from a logic low value to a logic high value, the fifth line 1526 transitions from a logic low value to a logic high value, the sixth line 1528 is at a count value of zero, the seventh line 1530 is at a logic low value, and the eighth line 1532 transitions from a logic low value to a logic high value. As a result of the rising edge on the fifth line 1526 (e.g., the encoded signal) the rising edge counter of the fault decoder of the isolated gate driver counts a rising edge. For example, as a result of the rising edge on the fifth line 1526, the rising edge counter 804 of FIG. 8 counts a rising edge.

In the example illustrated in FIG. 15, at the second time, the first line 1518 is at a logic high value, the second line 1520 begins to increase from a current value of zero amps to a current value of ten amps, the third line 1522 is at a logic low value, the fourth line 1524 transitions from a logic low value to a logic high value, the fifth line 1526 transitions from a logic low value to a logic high value, the sixth line 1528 is at a count value of zero, the seventh line 1530 is at a logic low value, and the eighth line 1532 transitions from a logic low value to a logic high value. As a result of the rising edge on the fifth line 1526 (e.g., the encoded signal) the rising edge counter of the fault decoder of the isolated gate driver counts a rising edge. For example, as a result of the rising edge on the fifth line 1526, the rising edge counter 804 of FIG. 8 counts a rising edge. Additionally, for example, as a result of the rising edge on the fifth line 1526, the fault decoder 348 of FIGS. 3, 4 and 8 starts a timer that is five times as long as the period of the oscillator 802.

In the example of FIG. 15, at the third time, the first line 1518 is at a logic high value, the second line 1520 is at a current value of ten amps, the third line 1522 transitions from a logic low value to a logic high value, the fourth line 1524 is at a logic high value, the fifth line 1526 is at a logic high value, the sixth line 1528 is at a count value of one, the seventh line 1530 is at a logic low value, and the eighth line 1532 is at a logic low value. As a result of rising edge on the third line 1522 (e.g., the FLT signal) at the third time, the fault encoder of the isolated gate driver (e.g., the fault encoder 374 of FIGS. 3, 4, and 7) encodes a fault event into the encoded signal (e.g., the fifth line 1526). For example, the fault encoder 374 encodes the fault event as a predetermined number of pulses (e.g., 36) at the frequency $f_3$. The predetermined number of pulses encoded into the encoded signal (e.g., the fifth line 1526) corresponds to a threshold number of pulses that reduces the distortion in the APWM signal (e.g., the fourth line 1524) as it is detected by the low voltage stage signal converter of the isolated gate driver (e.g., the low voltage stage signal converter 340 of FIG. 3 and/or the low voltage stage signal converter 448 of FIG. 4). Additionally, as a result of the rising edge of the third line 1522 at the third time, at least one driver of the isolated gate driver (e.g., the driver 364) sinks ten amps of current to the power switching device via STO of the power switching device (e.g., the switch 306 of FIG. 3 and/or the switch 406 of FIG. 4).

In the illustrated example of FIG. 15, at the fourth time, the first line 1518 is at a logic high value, the second line 1520 is decreasing from a current value of ten amps to a current value of zero amps, the third line 1522 is at a logic low value, the fourth line 1524 is at a logic high value, the fifth line 1526 transitions from a logic low value to a logic high value, the sixth line 1528 is at a count value of zero, the seventh line 1530 is at a logic low value, and the eighth line 1532 is at a logic low value. As a result of rising edge on the third line 1522 (e.g., the FLT signal) at the third time, the rising edge of the fifth line 1526 is at the frequency $f_3$.

In the example of FIG. 15, at the fifth time, the first line 1518 is at a logic high value, the second line 1520 is at a current value of zero amps, the third line 1522 is at a logic low value, the fourth line 1524 is at a logic high value, the fifth line 1526 is at a logic low value, the sixth line 1528 is at a count value of three, the seventh line 1530 transitions from a logic low value to a logic high value, and the eighth line 1532 is at a logic low value. As a result of the count value of three on the sixth line 1528 at the fifth time, the fault decoder of the isolated gate driver (e.g., the fault decoder 348 of FIGS. 3, 4, and 8) decodes the fault event and generates a logic high value on the seventh line 1530. For example, the fault decoder 348 generates a logic high value on the FLT signal (e.g., the seventh line 1530).

In the illustrated example of FIG. 15, at the sixth time, the first line 1518 transitions from a logic high value to a logic low value, the second line 1520 is at a current value of zero amps, the third line 1522 is at a logic low value, the fourth line 1524 transitions from a logic low value to a logic high value, the fifth line 1526 transitions from a logic low value to a logic high value, the sixth line 1528 is at a count value of zero, the seventh line 1530 is at a logic high value, and the eighth line 1532 transitions from a logic low value to a logic high value. Because the fault encoder of the isolated gate driver has completed encoding of a given fault into the encoded signal (e.g., the fifth line 1526), as a result of the rising edge on the fourth line 1524 at the sixth time, the eighth line 1532 transitions from a logic low value to a logic high value.

While an example manner of implementing the low voltage stage signal converter 340 of FIG. 3 and/or the low voltage stage signal converter 448 of FIG. 4 is illustrated in FIGS. 5, 8, and 10, one or more of the elements, processes and/or devices illustrated in FIGS. 5, 8, and 10 may be combined, divided, re-arranged, omitted, eliminated and/or implemented in any other way. Further, the example oscillator 501, the example falling edge detector 502, the example signal multiplexer 503, the example first logic circuit 504, the example second logic circuit 506, the example third logic circuit 508, the example first logic gate 510, the example fourth logic circuit 512, the example comparator 514, the example second logic gate 516, the example fifth logic circuit 518, the example sixth logic circuit 520, and/or, more generally, the example STO encoder 346 of FIGS. 3, 4, and 5, and/or, the example oscillator 802, the example rising edge counter 804, the example synchronizer 806, the example timer 808, the example reset circuit 810, the example first logic circuit 812, the example second logic circuit 814, the example first logic gate 816, the example third logic circuit 818, the example fourth logic circuit 820, the example fifth logic circuit 822, the example sixth logic circuit 824, the example second logic gate 826, the example seventh logic circuit 828, the example eighth logic circuit 830, the example first comparator 832, the example second comparator 834, the example third logic gate 836, the example ninth logic circuit 838, and/or, more generally, the example fault decoder 348 of FIGS. 3, 4, and 8, and/or, the example oscillator 1002, the example first logic circuit 1004, the example second logic circuit 1006, the example third logic circuit 1008, the example fourth logic circuit 1010, the example comparator 1012, and/or the example logic gate 1014 of FIG. 10, and/or, more generally, the example UVLO decoder 350 of FIGS. 3, 4, and 8, and/or, more generally, the example low voltage stage signal converter 340 of FIG. 3 and/or the example low voltage stage signal converter 448 of FIG. 4 may be implemented by hardware, software, firmware and/or any combination of hardware, software and/or firmware.

Thus, for example, any of the example oscillator 501, the example falling edge detector 502, the example signal multiplexer 503, the example first logic circuit 504, the example second logic circuit 506, the example third logic circuit 508, the example first logic gate 510, the example fourth logic circuit 512, the example comparator 514, the example second logic gate 516, the example fifth logic circuit 518, the example sixth logic circuit 520, and/or, more generally, the example STO encoder 346 of FIGS. 3, 4, and 5, and/or, the example oscillator 802, the example rising edge counter 804, the example synchronizer 806, the example timer 808, the example reset circuit 810, the example first logic circuit 812, the example second logic circuit 814, the example first logic gate 816, the example third logic circuit 818, the example fourth logic circuit 820, the example fifth logic circuit 822, the example sixth logic circuit 824, the example second logic gate 826, the example seventh logic circuit 828, the example eighth logic circuit 830, the example first comparator 832, the example second comparator 834, the example third logic gate 836, the example ninth logic circuit 838, and/or, more generally, the example fault decoder 348 of FIGS. 3, 4, and 8, and/or, the example oscillator 1002, the example first logic circuit 1004, the example second logic circuit 1006, the example third logic circuit 1008, the example fourth logic circuit 1010, the example comparator 1012, and/or the example logic gate 1014 of FIG. 10, and/or, more generally, the example UVLO decoder 350 of FIGS. 3, 4, and 8, and/or, more generally, the example low voltage stage signal converter 340 of FIG. 3 and/or the example low voltage stage signal converter 448 of FIG. 4 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)).

When reading any of the apparatus or system claims of this patent to cover a purely software and/or firmware implementation, at least one of the example oscillator 501, the example falling edge detector 502, the example signal multiplexer 503, the example first logic circuit 504, the example second logic circuit 506, the example third logic circuit 508, the example first logic gate 510, the example fourth logic circuit 512, the example comparator 514, the example second logic gate 516, the example fifth logic circuit 518, the example sixth logic circuit 520, and/or, more generally the example STO encoder 346 of FIGS. 3, 4, and 5, and/or, the example oscillator 802, the example rising edge counter 804, the example synchronizer 806, the example timer 808, the example reset circuit 810, the example first logic circuit 812, the example second logic circuit 814, the example first logic gate 816, the example third logic circuit 818, the example fourth logic circuit 820, the example fifth logic circuit 822, the example sixth logic circuit 824, the example second logic gate 826, the example seventh logic circuit 828, the example eighth logic circuit 830, the example first comparator 832, the example second comparator 834, the example third logic gate 836, the example ninth logic circuit 838, and/or, more generally, the example fault decoder 348 of FIGS. 3, 4, and 8, and/or, the example oscillator 1002, the example first logic circuit 1004, the example second logic circuit 1006, the example third logic circuit 1008, the example fourth logic circuit 1010, the example comparator 1012, and/or the example logic gate 1014 of FIG. 10, and/or, more generally, the example UVLO decoder 350 of FIGS. 3, 4, and 8, and/or, more generally, the example low voltage stage signal converter 340 of FIG. 3 and/or the example low voltage stage signal converter 448 of FIG. 4 is/are hereby expressly defined to include a non-transitory computer readable storage device or storage disk such as a memory, a digital versatile disk (DVD), a compact disk (CD), a Blu-ray disk, etc. including the software and/or firmware.

Further still, the example oscillator 501, the example falling edge detector 502, the example signal multiplexer 503, the example first logic circuit 504, the example second logic circuit 506, the example third logic circuit 508, the example first logic gate 510, the example fourth logic circuit 512, the example comparator 514, the example second logic gate 516, the example fifth logic circuit 518, the example sixth logic circuit 520, and/or, more generally, the example STO encoder 346 of FIGS. 3, 4, and 5, and/or, the example oscillator 802, the example rising edge counter 804, the example synchronizer 806, the example timer 808, the example reset circuit 810, the example first logic circuit 812, the example second logic circuit 814, the example first logic gate 816, the example third logic circuit 818, the example fourth logic circuit 820, the example fifth logic circuit 822, the example sixth logic circuit 824, the example second logic gate 826, the example seventh logic circuit 828, the example eighth logic circuit 830, the example first comparator 832, the example second comparator 834, the example third logic gate 836, the example ninth logic circuit 838, and/or, more generally, the example fault decoder 348 of FIGS. 3, 4, and 8, and/or, the example oscillator 1002, the example first logic circuit 1004, the example second logic circuit 1006, the example third logic circuit 1008, the example fourth logic circuit 1010, the example comparator 1012, and/or the example logic gate 1014 of FIG. 10, and/or, more generally, the example UVLO decoder 350 of FIGS. 3, 4, and 8, and/or, more generally, the example low voltage stage signal converter 340 of FIG. 3 and/or the example low voltage stage signal converter 448 of FIG. 4 may include one or more elements, processes and/or devices in addition to, or instead of, those illustrated in FIGS. 3, 4, 5, 8, and 10 and/or may include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 16:
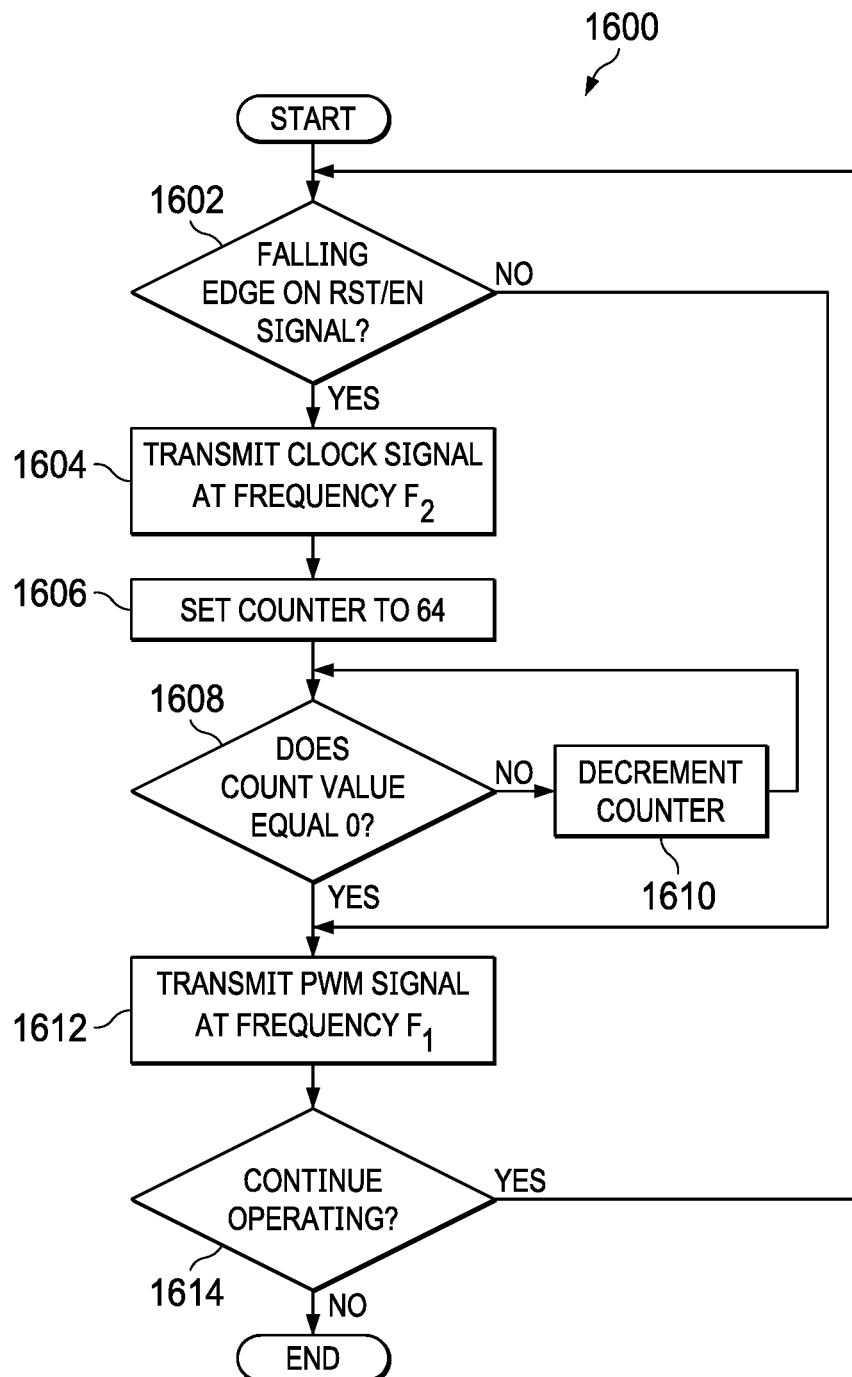
FIG. 16 is a flowchart representative of a process, which may be implemented utilizing machine readable instructions that may be executed, to implement the low voltage stage signal converter of FIG. 3 and/or the low voltage stage signal converter of FIG. 4 to facilitate STO encoding.
Figure 19:
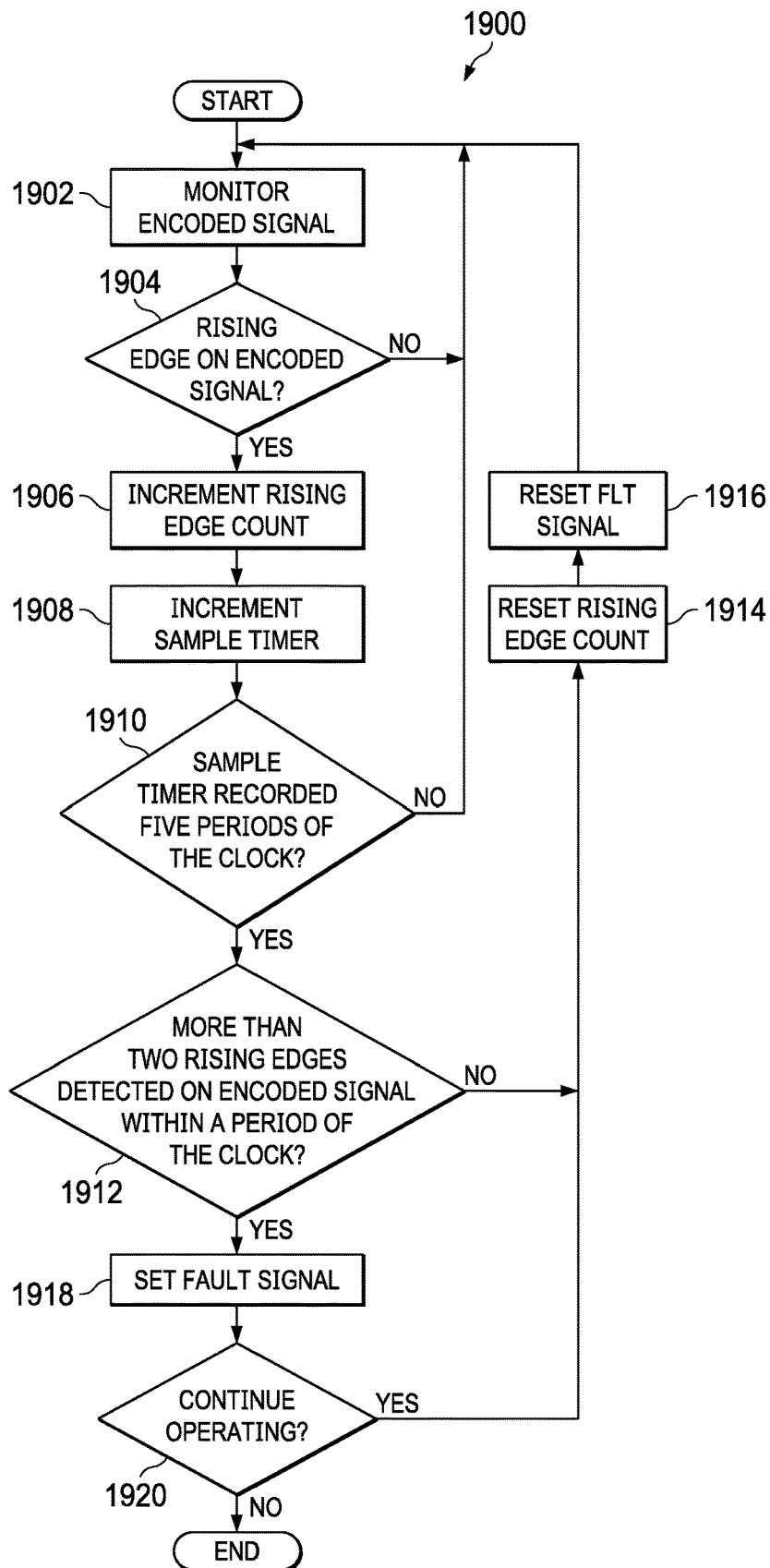
FIG. 19 is a flowchart representative of a process, which may be implemented utilizing machine readable instructions that may be executed, to implement low voltage stage signal converter of FIG. 3 and/or the low voltage stage signal converter of FIG. 4 to facilitate fault decoding.
Figure 21:
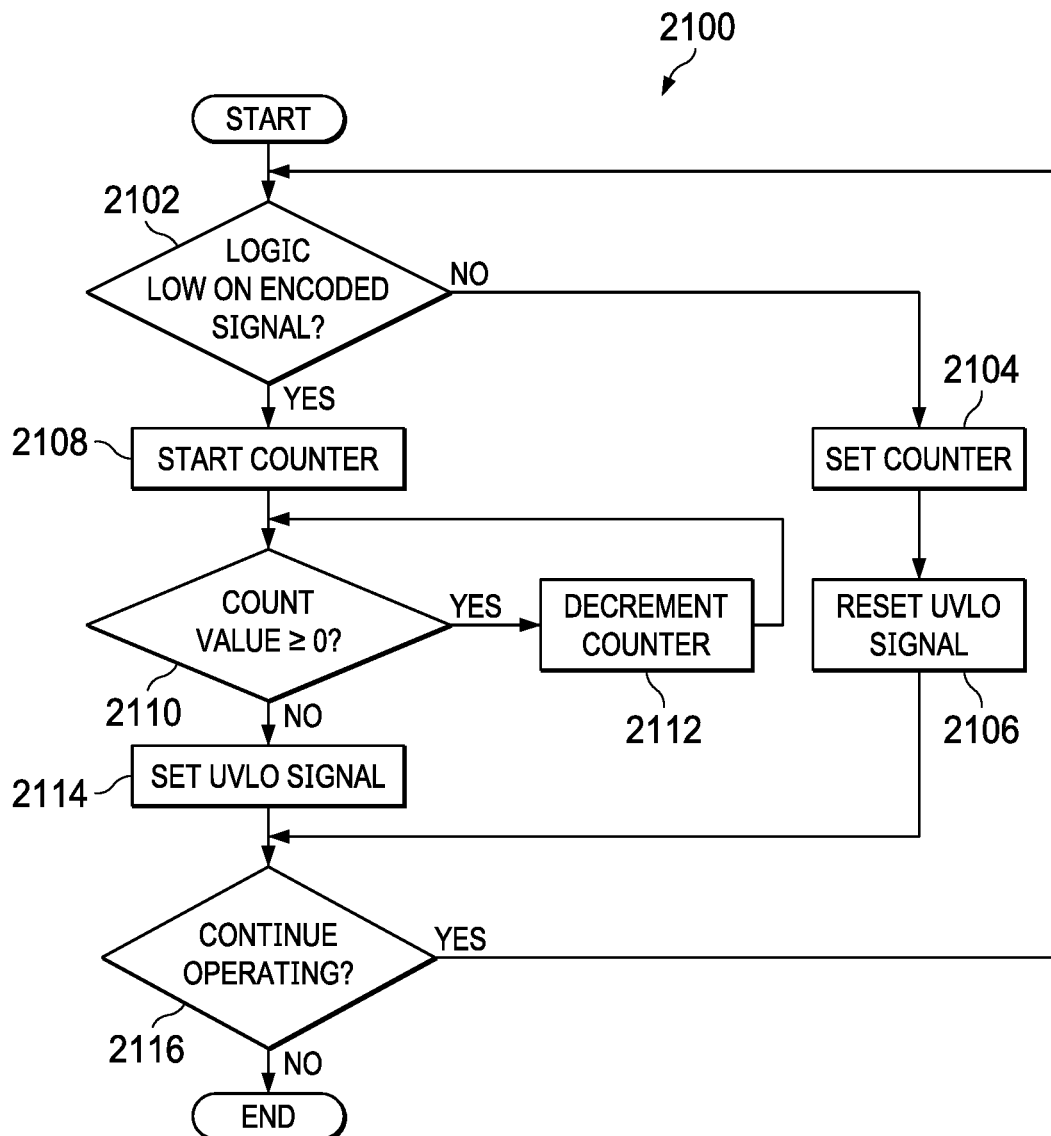
FIG. 21 is a flowchart representative of a process, which may be implemented utilizing machine readable instructions that may be executed, to implement the low voltage stage signal converter of FIG. 3 and/or the low voltage stage signal converter of FIG. 4 to facilitate UVLO decoding.

Flowchart representative of example hardware logic, machine readable instructions, hardware implemented state machines, and/or any combination thereof for implementing the example low voltage stage signal converter 340 of FIG. 3 and/or the example low voltage stage signal converter 448 of FIG. 4 is shown in FIGS. 16, 19, and 21. The machine readable instructions may be one or more executable programs or portion(s) of an executable program for execution by a computer processor. The program may be embodied in software stored on a non-transitory computer readable storage medium such as a CD-ROM, a floppy disk, a hard drive, a DVD, a Blu-ray disk, or a memory associated with a processor, but the entire program and/or parts thereof could alternatively be executed by a device other than such a processor and/or embodied in firmware or dedicated hardware. Further, although the example program is described with reference to the flowchart illustrated in FIGS. 16, 19, and 21, many other methods of implementing the example low voltage stage signal converter 340 of FIG. 3 and/or the example low voltage stage signal converter 448 of FIG. 4 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

Additionally, while an example manner of implementing the high voltage stage signal converter 360 of FIG. 3 and/or the high voltage stage signal converter 470 of FIG. 4 is illustrated in FIGS. 6, 7, and 9, one or more of the elements, processes and/or devices illustrated in FIGS. 6, 7, and 9 may be combined, divided, re-arranged, omitted, eliminated and/or implemented in any other way. Further, the example oscillator 602, the example rising edge counter 604, the example synchronizer 606, the example timer 608, the example reset circuit 610, the example first logic circuit 612, the example second logic circuit 614, the example first logic gate 616, the example third logic circuit 618, the example fourth logic circuit 620, the example fifth logic circuit 622, the example sixth logic circuit 624, the example second logic gate 626, the example seventh logic circuit 628, the example eighth logic circuit 630, the example first comparator 632, the example second comparator 634, the example third logic gate 636, the example ninth logic circuit 638, and/or, more generally, the example STO decoder 372 of FIGS. 3, 4, and 6, and/or the example oscillator 702, the example edge detector 703, the example first logic circuit 704, the example second logic circuit 706, the example third logic circuit 708, the example first logic gate 710, the example clock counter 712, the example signal selector 713, the example fourth logic circuit 714, the example comparator 716, the example second logic gate 718, the example fifth logic circuit 720, the example sixth logic circuit 722, the example seventh logic circuit 724, the example third logic gate 726, the example eighth logic circuit 728, and/or, more generally, the example fault decoder 348 of FIGS. 3, 4, and 7, and/or, the example oscillator 902, the example level detector 903, the example first logic gate 904, the example first logic circuit 906, the example second logic circuit 908, the example signal selector 909, the example second logic gate 910, the example clock counter 911, the example third logic gate 912, the example fourth logic gate 914, the example third logic circuit 916, the example fifth logic gate 918, the example fourth logic circuit 920, the example fifth logic circuit 922, the example sixth logic circuit 924, the example comparator 926, and/or the example seventh logic circuit 928 of FIG. 9, and/or, more generally, the example UVLO encoder 376 of FIGS. 3, 4, and 9, and/or, more generally, the example high voltage stage signal converter 360 of FIG. 3 and/or the example high voltage stage signal converter 470 of FIG. 4 may be implemented by hardware, software, firmware and/or any combination of hardware, software and/or firmware.

Thus, for example, any of the example oscillator 602, the example rising edge counter 604, the example synchronizer 606, the example timer 608, the example reset circuit 610, the example first logic circuit 612, the example second logic circuit 614, the example first logic gate 616, the example third logic circuit 618, the example fourth logic circuit 620, the example fifth logic circuit 622, the example sixth logic circuit 624, the example second logic gate 626, the example seventh logic circuit 628, the example eighth logic circuit 630, the example first comparator 632, the example second comparator 634, the example third logic gate 636, the example ninth logic circuit 638, and/or, more generally, the example STO decoder 372 of FIGS. 3, 4, and 6, and/or the example oscillator 702, the example edge detector 703, the example first logic circuit 704, the example second logic circuit 706, the example third logic circuit 708, the example first logic gate 710, the example clock counter 712, the example signal selector 713, the example fourth logic circuit 714, the example comparator 716, the example second logic gate 718, the example fifth logic circuit 720, the example sixth logic circuit 722, the example seventh logic circuit 724, the example third logic gate 726, the example eighth logic circuit 728, and/or, more generally, the example fault decoder 348 of FIGS. 3, 4, and 7, and/or, the example oscillator 902, the example level detector 903, the example first logic gate 904, the example first logic circuit 906, the example second logic circuit 908, the example signal selector 909, the example second logic gate 910, the example clock counter 911, the example third logic gate 912, the example fourth logic gate 914, the example third logic circuit 916, the example fifth logic gate 918, the example fourth logic circuit 920, the example fifth logic circuit 922, the example sixth logic circuit 924, the example comparator 926, and/or the example seventh logic circuit 928 of FIG. 9, and/or, more generally, the example UVLO encoder 376 of FIGS. 3, 4, and 9, and/or, more generally, the example high voltage stage signal converter 360 of FIG. 3 and/or the example high voltage stage signal converter 470 of FIG. 4 could be implemented by one or more analog or digital circuit(s), logic circuits, programmable processor(s), programmable controller(s), graphics processing unit(s) (GPU(s)), digital signal processor(s) (DSP(s)), application specific integrated circuit(s) (ASIC(s)), programmable logic device(s) (PLD(s)) and/or field programmable logic device(s) (FPLD(s)).

When reading any of the apparatus or system claims of this patent to cover a purely software and/or firmware implementation, at least one of the example oscillator 602, the example rising edge counter 604, the example synchronizer 606, the example timer 608, the example reset circuit 610, the example first logic circuit 612, the example second logic circuit 614, the example first logic gate 616, the example third logic circuit 618, the example fourth logic circuit 620, the example fifth logic circuit 622, the example sixth logic circuit 624, the example second logic gate 626, the example seventh logic circuit 628, the example eighth logic circuit 630, the example first comparator 632, the example second comparator 634, the example third logic gate 636, the example ninth logic circuit 638, and/or, more generally, the example STO decoder 372 of FIGS. 3, 4, and 6, and/or the example oscillator 702, the example edge detector 703, the example first logic circuit 704, the example second logic circuit 706, the example third logic circuit 708, the example first logic gate 710, the example clock counter 712, the example signal selector 713, the example fourth logic circuit 714, the example comparator 716, the example second logic gate 718, the example fifth logic circuit 720, the example sixth logic circuit 722, the example seventh logic circuit 724, the example third logic gate 726, the example eighth logic circuit 728, and/or, more generally, the example fault decoder 348 of FIGS. 3, 4, and 7, and/or, the example oscillator 902, the example level detector 903, the example first logic gate 904, the example first logic circuit 906, the example second logic circuit 908, the example signal selector 909, the example second logic gate 910, the example clock counter 911, the example third logic gate 912, the example fourth logic gate 914, the example third logic circuit 916, the example fifth logic gate 918, the example fourth logic circuit 920, the example fifth logic circuit 922, the example sixth logic circuit 924, the example comparator 926, and/or the example seventh logic circuit 928 of FIG. 9, and/or, more generally, the example UVLO encoder 376 of FIGS. 3, 4, and 9, and/or, more generally, the example high voltage stage signal converter 360 of FIG. 3 and/or the example high voltage stage signal converter 470 of FIG. 4 is/are hereby expressly defined to include a non-transitory computer readable storage device or storage disk such as a memory, a digital versatile disk (DVD), a compact disk (CD), a Blu-ray disk, etc. including the software and/or firmware.

Further still, the example oscillator 602, the example rising edge counter 604, the example synchronizer 606, the example timer 608, the example reset circuit 610, the example first logic circuit 612, the example second logic circuit 614, the example first logic gate 616, the example third logic circuit 618, the example fourth logic circuit 620, the example fifth logic circuit 622, the example sixth logic circuit 624, the example second logic gate 626, the example seventh logic circuit 628, the example eighth logic circuit 630, the example first comparator 632, the example second comparator 634, the example third logic gate 636, the example ninth logic circuit 638, and/or, more generally, the example STO decoder 372 of FIGS. 3, 4, and 6, and/or the example oscillator 702, the example edge detector 703, the example first logic circuit 704, the example second logic circuit 706, the example third logic circuit 708, the example first logic gate 710, the example clock counter 712, the example signal selector 713, the example fourth logic circuit 714, the example comparator 716, the example second logic gate 718, the example fifth logic circuit 720, the example sixth logic circuit 722, the example seventh logic circuit 724, the example third logic gate 726, the example eighth logic circuit 728, and/or, more generally, the example fault decoder 348 of FIGS. 3, 4, and 7, and/or, the example oscillator 902, the example level detector 903, the example first logic gate 904, the example first logic circuit 906, the example second logic circuit 908, the example signal selector 909, the example second logic gate 910, the example clock counter 911, the example third logic gate 912, the example fourth logic gate 914, the example third logic circuit 916, the example fifth logic gate 918, the example fourth logic circuit 920, the example fifth logic circuit 922, the example sixth logic circuit 924, the example comparator 926, and/or the example seventh logic circuit 928 of FIG. 9, and/or, more generally, the example UVLO encoder 376 of FIGS. 3, 4, and 9, and/or, more generally, the example high voltage stage signal converter 360 of FIG. 3 and/or the example high voltage stage signal converter 470 of FIG. 4 may include one or more elements, processes and/or devices in addition to, or instead of, those illustrated in FIGS. 3, 4, 6, 7, and 9 and/or may include more than one of any or all of the illustrated elements, processes and devices. As used herein, the phrase "in communication," including variations thereof, encompasses direct communication and/or indirect communication through one or more intermediary components, and does not require direct physical (e.g., wired) communication and/or constant communication, but rather additionally includes selective communication at periodic intervals, scheduled intervals, aperiodic intervals, and/or one-time events.

Figure 17:
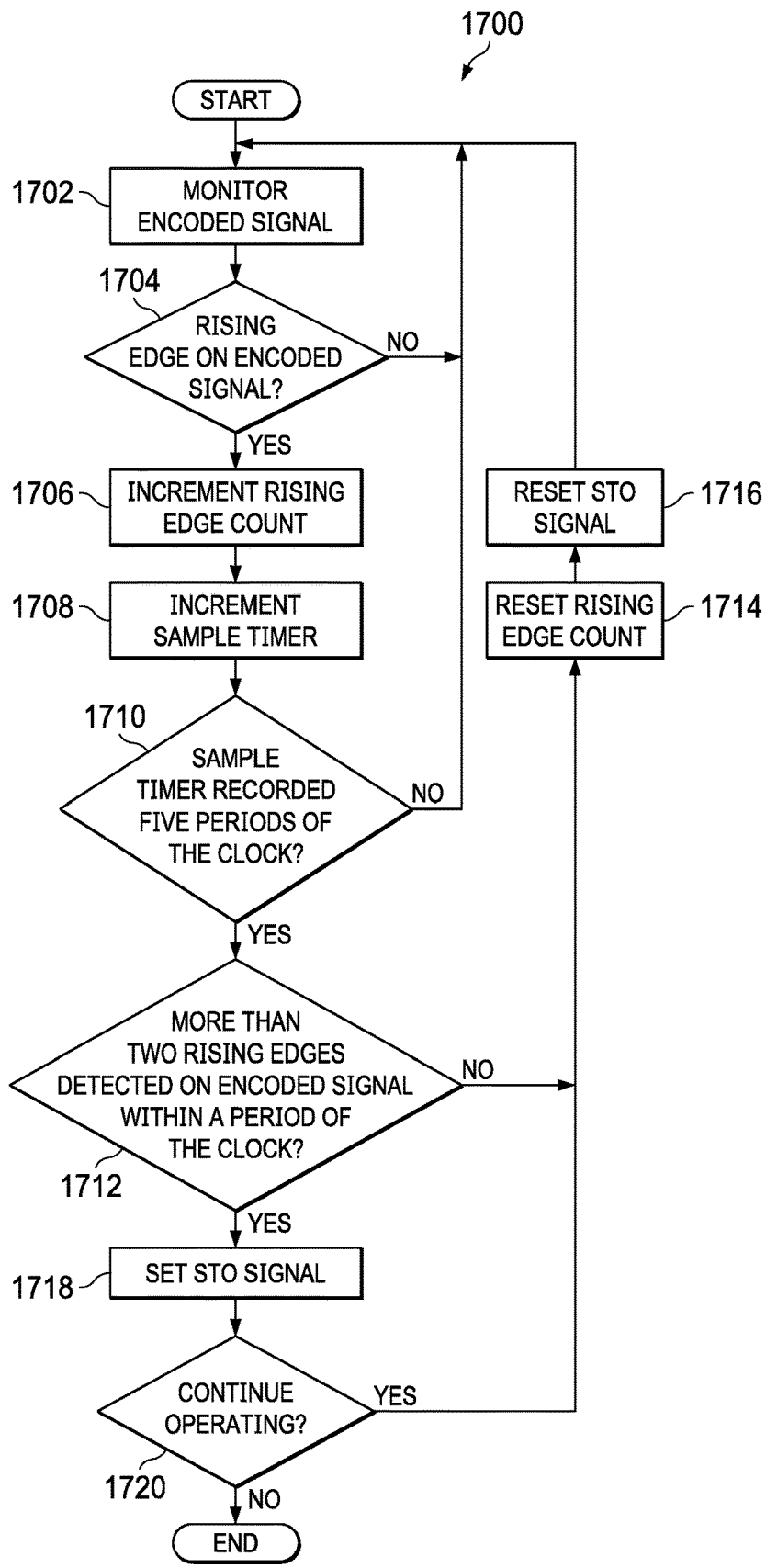
FIG. 17 is a flowchart representative of a process, which may be implemented utilizing machine readable instructions that may be executed, to implement the high voltage stage signal converter of FIG. 3 and/or the high voltage stage signal converter of FIG. 4 to facilitate STO decoding.
Figure 18:
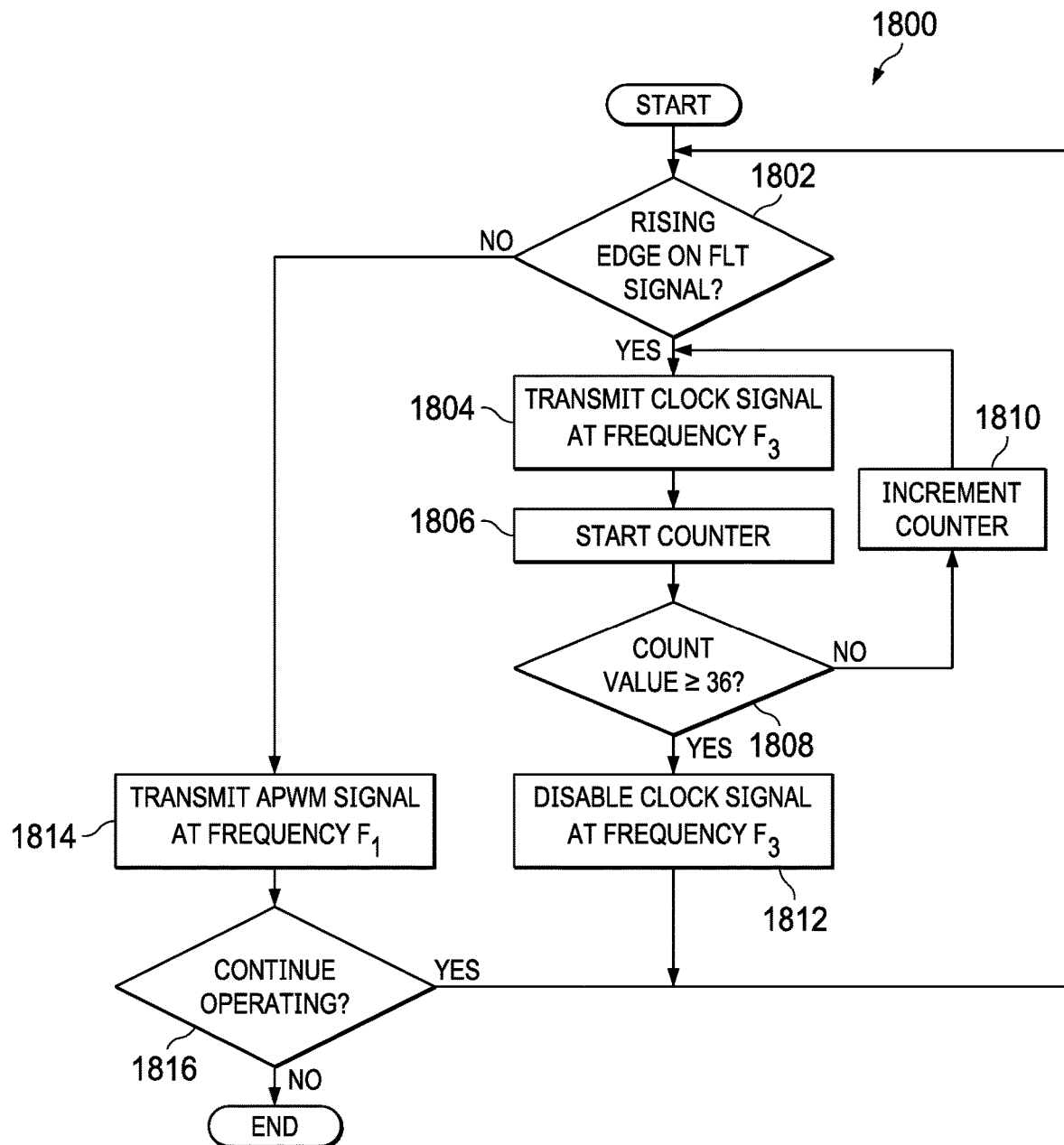
FIG. 18 is a flowchart representative of a process, which may be implemented utilizing machine readable instructions that may be executed, to implement the high voltage stage signal converter of FIG. 3 and/or the high voltage stage signal converter of FIG. 4 to facilitate fault encoding.
Figure 20:
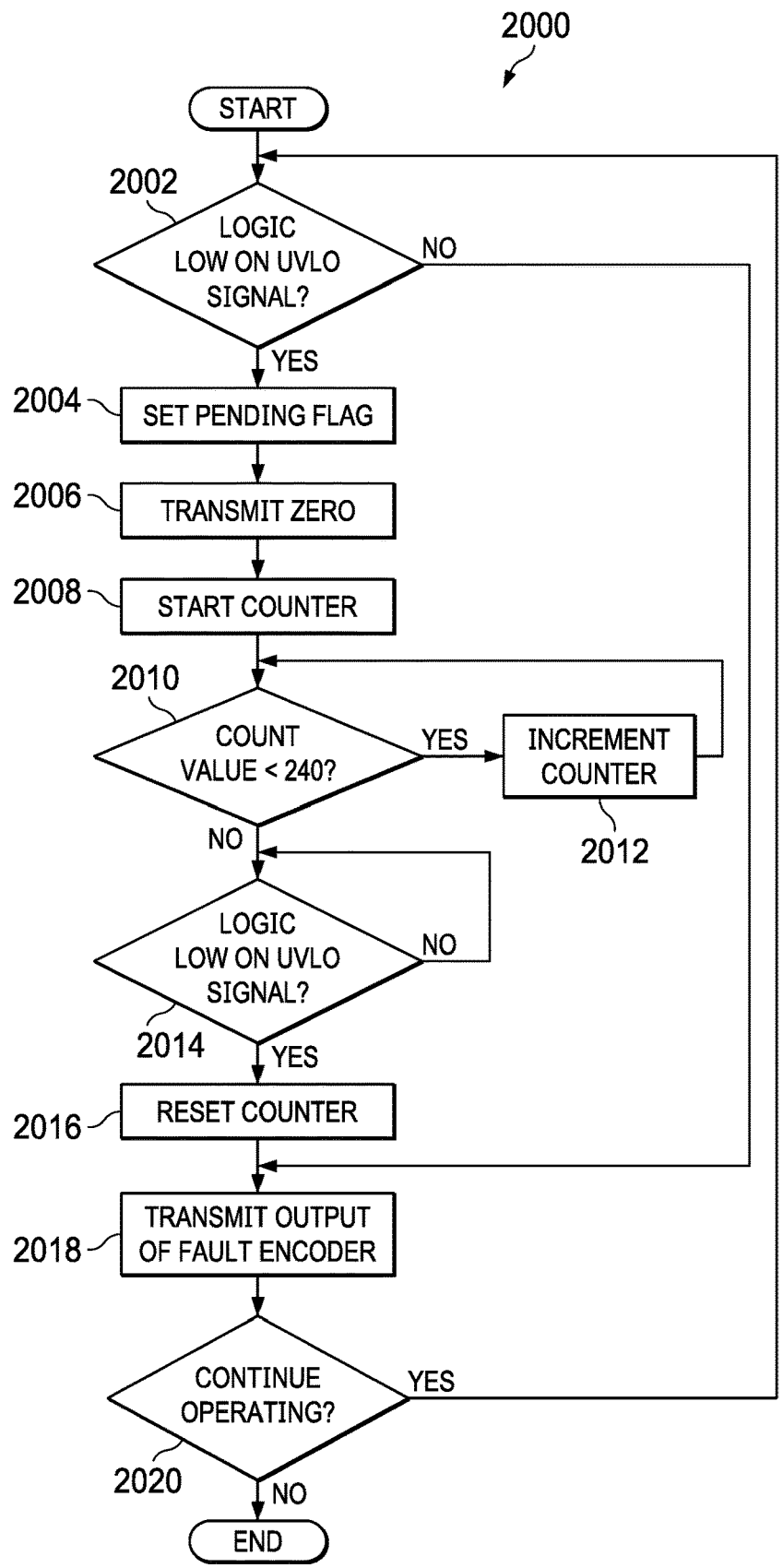
FIG. 20 is a flowchart representative of a process, which may be implemented utilizing machine readable instructions that may be executed, to implement the high voltage stage signal converter of FIG. 3 and/or the high voltage stage signal converter of FIG. 4 to facilitate under voltage condition encoding.

Flowchart representative of example hardware logic, machine readable instructions, hardware implemented state machines, and/or any combination thereof for implementing the example high voltage stage signal converter 360 of FIG. 3 and/or the example high voltage stage signal converter 470 of FIG. 4 is shown in FIGS. 17, 18, and 20. The machine readable instructions may be one or more executable programs or portion(s) of an executable program for execution by a computer processor. The program may be embodied in software stored on a non-transitory computer readable storage medium such as a CD-ROM, a floppy disk, a hard drive, a DVD, a Blu-ray disk, or a memory associated with a processor, but the entire program and/or parts thereof could alternatively be executed by a device other than such a processor and/or embodied in firmware or dedicated hardware. Further, although the example program is described with reference to the flowchart illustrated in FIGS. 17, 18, and 20, many other methods of implementing the example high voltage stage signal converter 360 of FIG. 3 and/or the example high voltage stage signal converter 470 of FIG. 4 may alternatively be used. For example, the order of execution of the blocks may be changed, and/or some of the blocks described may be changed, eliminated, or combined. Additionally or alternatively, any or all of the blocks may be implemented by one or more hardware circuits (e.g., discrete and/or integrated analog and/or digital circuitry, an FPGA, an ASIC, a comparator, an operational-amplifier (op-amp), a logic circuit, etc.) structured to perform the corresponding operation without executing software or firmware.

The machine readable instructions described herein may be stored in one or more of a compressed format, an encrypted format, a fragmented format, a compiled format, an executable format, a packaged format, etc. Machine readable instructions as described herein may be stored as data (e.g., portions of instructions, code, representations of code, etc.) that may be utilized to create, manufacture, and/or produce machine executable instructions. For example, the machine readable instructions may be fragmented and stored on one or more storage devices and/or computing devices (e.g., servers). The machine readable instructions may require one or more of installation, modification, adaptation, updating, combining, supplementing, configuring, decryption, decompression, unpacking, distribution, reassignment, compilation, etc. in order to make them directly readable, interpretable, and/or executable by a computing device and/or other machine. For example, the machine readable instructions may be stored in multiple parts, which are individually compressed, encrypted, and stored on separate computing devices, wherein the parts when decrypted, decompressed, and combined form a set of executable instructions that implement a program such as that described herein.

In another example, the machine readable instructions may be stored in a state in which they may be read by a computer, but require addition of a library (e.g., a dynamic link library (DLL)), a software development kit (SDK), an application programming interface (API), etc. in order to execute the instructions on a particular computing device or other device. In another example, the machine readable instructions may need to be configured (e.g., settings stored, data input, network addresses recorded, etc.) before the machine readable instructions and/or the corresponding program(s) can be executed in whole or in part. Thus, the disclosed machine readable instructions and/or corresponding program(s) are intended to encompass such machine readable instructions and/or program(s) regardless of the particular format or state of the machine readable instructions and/or program(s) when stored or otherwise at rest or in transit.

The machine readable instructions described herein can be represented by any past, present, or future instruction language, scripting language, programming language, etc. For example, the machine readable instructions may be represented using any of the following languages: C, C++, Java, C #, Perl, Python, JavaScript, HyperText Markup Language (HTML), Structured Query Language (SQL), Swift, etc.

As mentioned above, the example processes of FIGS. 16-21 may be implemented using executable instructions (e.g., computer and/or machine readable instructions) stored on a non-transitory computer and/or machine readable medium such as a hard disk drive, a flash memory, a read-only memory, a compact disk, a digital versatile disk, a cache, a random-access memory and/or any other storage device or storage disk in which information is stored for any duration (e.g., for extended time periods, permanently, for brief instances, for temporarily buffering, and/or for caching of the information). As used herein, the term non-transitory computer readable medium is expressly defined to include any type of computer readable storage device and/or storage disk and to exclude propagating signals and to exclude transmission media.

"Including" and "comprising" (and all forms and tenses thereof) are used herein to be open ended terms. Thus, whenever a claim employs any form of "include" or "comprise" (e.g., comprises, includes, comprising, including, having, etc.) as a preamble or within a claim recitation of any kind, it is to be understood that additional elements, terms, etc. may be present without falling outside the scope of the corresponding claim or recitation. As used herein, when the phrase "at least" is used as the transition term in, for example, a preamble of a claim, it is open-ended in the same manner as the term "comprising" and "including" are open ended. The term "and/or" when used, for example, in a form such as A, B, and/or C refers to any combination or subset of A, B, C such as (1) A alone, (2) B alone, (3) C alone, (4) A with B, (5) A with C, (6) B with C, and (7) A with B and with C. As used herein in the context of describing structures, components, items, objects and/or things, the phrase "at least one of A and B" is intended to refer to implementations including any of (1) at least one A, (2) at least one B, and (3) at least one A and at least one B. Similarly, as used herein in the context of describing structures, components, items, objects and/or things, the phrase "at least one of A or B" is intended to refer to implementations including any of (1) at least one A, (2) at least one B, and (3) at least one A and at least one B. As used herein in the context of describing the performance or execution of processes, instructions, actions, activities and/or steps, the phrase "at least one of A and B" is intended to refer to implementations including any of (1) at least one A, (2) at least one B, and (3) at least one A and at least one B. Similarly, as used herein in the context of describing the performance or execution of processes, instructions, actions, activities and/or steps, the phrase "at least one of A or B" is intended to refer to implementations including any of (1) at least one A, (2) at least one B, and (3) at least one A and at least one B.

As used herein, singular references (e.g., "a", "an", "first", "second", etc.) do not exclude a plurality. The term "a" or "an" entity, as used herein, refers to one or more of that entity. The terms "a" (or "an"), "one or more", and "at least one" can be used interchangeably herein. Furthermore, although individually listed, a plurality of means, elements or method actions may be implemented by, e.g., a single unit or processor. Additionally, although individual features may be included in different examples or claims, these may possibly be combined, and the inclusion in different examples or claims does not imply that a combination of features is not feasible and/or advantageous.

FIG. 16 is a flowchart representative of a process, which may be implemented utilizing machine readable instructions that may be executed, to implement the low voltage stage signal converter 340 of FIG. 3 and/or the low voltage stage signal converter 448 of FIG. 4 to facilitate STO encoding. For example, the process 1600 may be executed to implement the STO encoder 346 of FIGS. 3, 4, and 5.

In the example of FIG. 16, the process 1600 begins at block 1602 where the STO encoder 346 determines whether there has been a falling edge on the RST/EN signal. If the STO encoder 346 determines that there is a falling edge on the RST/EN signal (e.g., block 1602: YES), the process 1600 proceeds to block 1604. If the STO encoder 346 determines that there is not a falling edge on the RST/EN signal (e.g., block 1602: NO), the process 1600 proceeds to block 1612. At block 1604, the signal multiplexer 503 transmits a clock signal at the frequency $f_2$. For example, at block 1604, the signal multiplexer 503 encodes the frequency $f_2$ into the encoded signal to be transmitted from the low voltage stage 318 of FIG. 3 and/or the low voltage stage 420 of FIG. 4 to the high voltage stage 320 of FIG. 3 and/or the high voltage stage 422 of FIG. 4.

In the illustrated example of FIG. 16, at block 1606, the STO encoder 346 sets a counter to a logic value corresponding to a decimal value of 64. For example, the fourth logic circuit 512 sets the count value of the fourth logic circuit 512 to a logic value corresponding to the decimal value of 64 at the falling edge of the RST/EN signal. At block 1608, the STO encoder 346 determines whether the count value is equal to zero. For example, at block 1608, the comparator 514 determines whether the count value of the fourth logic circuit 512 is equal to zero. If the STO encoder 346 determines that the count value is equal to zero (e.g., block 1608: YES), the process 1600 proceeds to block 1612. If the STO encoder 346 determines that the count value is not equal to zero (e.g., block 1608: NO), the process 1600 proceeds to block 1610.

In the example of FIG. 16, at block 1610, the STO encoder 346 decrements the count value of the fourth logic circuit 512. For example, in response to a logic high value at the output of the comparator 514, the fourth logic circuit 512 decrements the count value of the fourth logic circuit 512. After block 1610, the process 1600 proceeds to block 1608.

In the illustrated example of FIG. 16, at block 1612, the signal multiplexer 503 transmits the PWM signal at the frequency $f_1$. For example, at block 1612, the signal multiplexer 503 encodes the frequency $f_1$ into the encoded signal to be transmitted from the low voltage stage 318 of FIG. 3 and/or the low voltage stage 420 of FIG. 4 to the high voltage stage 320 of FIG. 3 and/or the high voltage stage 422 of FIG. 4. After block 1612, the process 1600 proceeds to block 1614 where the STO encoder 346 determines whether to continue operating. A condition that could cause the STO encoder 346 to determine to not continue operating can be, for example, a loss of power. If the STO encoder 346 determines to continue operating (e.g., block 1614: YES), the process 1600 proceeds to block 1602. If the STO encoder 346 determines to not continue operating (e.g., block 1614: NO), the process 1600 terminates.

FIG. 17 is a flowchart representative of a process 1700, which may be implemented utilizing machine readable instructions that may be executed, to implement the high voltage stage signal converter 360 of FIG. 3 and/or the high voltage stage signal converter 470 of FIG. 4 to facilitate STO decoding. For example, the process 1700 may be executed to implement the STO decoder 372 of FIGS. 3, 4, and 6.

In the example of FIG. 17, the process 1700 begins at block 1702 where the STO decoder 372 monitors the encoded signal. For example, the second logic circuit 614, and/or, more generally, the rising edge counter 604 monitors the encoded signal received from the high voltage stage demodulator 358 of FIG. 3 and/or the high voltage stage demodulator 468 of FIG. 4. At block 1704, the STO decoder 372 determines whether there is a rising edge on the encoded signal. For example, the second logic circuit 614, and/or, more generally, the rising edge counter 604 determines whether there is a rising edge on the encoded signal.

In the example illustrated in FIG. 17, if the STO decoder 372 determines that there is a rising edge on the encoded signal (e.g., block 1704: YES), the process 1700 proceeds to block 1706. If the STO decoder 372 determines that there is not a rising edge on the encoded signal (e.g., block 1704: NO), the process 1700 proceeds to block 1702. At block 1706, the STO decoder 372 increments the rising edge count. For example, the second logic circuit 614, and/or, more generally, the rising edge counter 604 increments the rising edge count of the rising edge counter 604 by loading a logic high value into one or more of the second logic circuit 614, the third logic circuit 618, and/or the fourth logic circuit 620.

In the example of FIG. 17, at block 1708, the STO decoder 372 increments a timer corresponding to the number of clock cycles of the oscillator 602 that the STO decoder 372 has sampled the encoded signal (e.g., a sample timer). For example, the sixth logic circuit 624, and/or, more generally, the timer 608 increments the timer 608 (e.g., the sample timer) by loading a logic high value into one or more of the sixth logic circuit 624, the seventh logic circuit 628, and/or the eighth logic circuit 630. At block 1710, the STO decoder 372 determines whether the timer 608 (e.g., the sample timer) has recorded five or more periods of the clock (e.g., the oscillator 602). For example, the first comparator 632 determines whether the timer 608 has recorded five or more periods of the oscillator 602. If the STO decoder 372 determines that the timer 608 (e.g., the sample timer) has recorded five or more periods of the clock (e.g., block 1710: YES), the process 1700 proceeds to block 1712. If the STO decoder 372 determines that the timer 608 (e.g., the sample timer) has not recorded five or more periods of the clock (e.g., block 1710: NO), the process 1700 proceeds to block 1702.

In the example of FIG. 17, at block 1712, the STO decoder 372 determines whether more than two rising edges have been detected on the encoded signal within a period the clock. For example, the period of the clock corresponds to a period of the oscillator 602 at the frequency $f_3$, and the second comparator 634 determines whether more than two rising edges have been detected on the encoded signal within a period the clock.

In the illustrated example of FIG. 17, if the STO decoder 372 determines that more than two rising edges have been detected on the encoded signal within a period the clock (e.g., block 1712: YES), the process 1700 proceeds to block 1718. If the STO decoder 372 determines that more than two rising edges have not been detected on the encoded signal within a period the clock (e.g., block 1712: NO), the process 1700 proceeds to block 1714. At block 1714, the ninth logic circuit 638, and/or, more generally, the reset circuit 610 resets the rising edge count of the rising edge counter 604. After block 1714, the process 1700 proceeds to block 1716 where the first comparator 632, and/or, more generally, the timer 608 resets the STO signal. After block 1716, the process 1700 proceeds to block 1702.

In the illustrated example of FIG. 17, at block 1718, the STO decoder 372 sets the STO signal to a logic high value. For example, in response determining that five or more periods of the clock have been recorded and more than two edges of the encoded signal have been counted, the first comparator 632, and/or, more generally, the timer 608 sets a logic high value as the logic value of the STO signal by loading a logic high value as the input to the second input of the first logic circuit 612. After block 1718, the process 1700 proceeds to block 1720.

In the example of FIG. 17, at block 1720, the STO decoder 372 determines whether to continue operating. A condition that could cause the STO decoder 372 to determine to not continue operating can be, for example, a loss of power. If the STO decoder 372 determines to continue operating (e.g., block 1720: YES), the process 1700 proceeds to block 1714. If the STO decoder 372 determines to not continue operating (e.g., block 1720: NO), the process 1700 terminates.

FIG. 18 is a flowchart representative of a process 1800, which may be implemented utilizing machine readable instructions that may be executed, to implement the high voltage stage signal converter 360 of FIG. 3 and/or the high voltage stage signal converter 470 of FIG. 4 to facilitate fault encoding. For example, the process 1800 may be executed to implement the fault encoder 374 of FIGS. 3, 4, and 7.

In the example of FIG. 18, the process 1800 begins at block 1802 where the edge detector 703 determines whether there has been a rising edge on the FLT signal. For example, the edge detector 703 can monitor the output of the fault sensor 370. If the edge detector 703 determines that there has been a rising edge on the FLT signal (e.g., block 1802: YES), the process 1800 proceeds to block 1804. If the edge detector 703 determines that there has not been a rising edge on the FLT signal (e.g., block 1802: NO), the process 1800 proceeds to block 1816. At block 1804, the signal selector 713 causes the eighth logic circuit 728 (e.g., a multiplexer) to transmit a clock signal at the frequency $f_3$. For example, at block 1804, the signal selector 713 causes the eighth logic circuit 728 to encode the frequency $f_3$ into the encoded signal to be transmitted from the high voltage stage 320 of FIG. 3 and/or the high voltage stage 422 of FIG. 4 to the low voltage stage 318 of FIG. 3 and/or the low voltage stage 420 of FIG. 4.

In the illustrated example of FIG. 18, at block 1806, the clock counter 712 starts a counter. For example, the fourth logic circuit 714 starts counting from a count value corresponding to a logic value of zero at the rising edge of the FLT signal. At block 1808, the clock counter 712 determines whether the count value is greater than or equal to 36. For example, at block 1808, the comparator 716 determines whether the count value of the fourth logic circuit 714 is greater than or equal to 36. If the clock counter 712 determines that the count value is greater than or equal to 36 (e.g., block 1808: YES), the process 1800 proceeds to block 1812. If the clock counter 712 determines that the count value is not greater than or equal to 36 (e.g., block 1808: NO), the process 1800 proceeds to block 1810.

In the illustrated example of FIG. 18, at block 1810, the clock counter 712 increments the count value of the fourth logic circuit 714. After block 1810, the process 1800 proceeds to block 1804.

In the illustrated example of FIG. 18, at block 1812, the clock counter 712 disables the clock signal the frequency. After block 1812, the process 1800 proceeds to block 1802. At block 1814, the signal selector 713 causes the eighth logic circuit 728 to transmit the APWM signal at the frequency $f_1$. For example, at block 1814, the signal selector 713 causes the eighth logic circuit 728 to encode the frequency $f_1$ into the encoded signal to be transmitted from the high voltage stage 320 of FIG. 3 and/or the high voltage stage 422 of FIG. 4 to the low voltage stage 318 of FIG. 3 and/or the low voltage stage 420 of FIG. 4. After block 1814, the process 1800 proceeds to block 1816 where the fault encoder 374 determines whether to continue operating. A condition that could cause the fault encoder 374 to determine to not continue operating can be, for example, a loss of power. If the fault encoder 374 determines to continue operating (e.g., block 1816: YES), the process 1800 proceeds to block 1802. If the fault encoder 374 determines to not continue operating (e.g., block 1816: NO), the process 1800 terminates.

FIG. 19 is a flowchart representative of a process 1900, which may be implemented utilizing machine readable instructions that may be executed, to implement low voltage stage signal converter 340 of FIG. 3 and/or the low voltage stage signal converter 448 of FIG. 4 to facilitate fault decoding. For example, the process 1900 may be executed to implement the fault decoder 348 of FIGS. 3, 4, and 8.

In the example of FIG. 19, the process 1900 begins at block 1902 where the fault decoder 348 monitors the encoded signal. For example, the second logic circuit 814, and/or, more generally, the rising edge counter 804 monitors the encoded signal received from the low voltage stage demodulator 344 of FIG. 3 and/or the low voltage stage demodulator 452 of FIG. 4. At block 1904, the fault decoder 348 determines whether there is a rising edge on the encoded signal. For example, the second logic circuit 814, and/or, more generally, the rising edge counter 804 determines whether there is a rising edge on the encoded signal.

In the example illustrated in FIG. 19, if the fault decoder 348 determines that there is a rising edge on the encoded signal (e.g., block 1904: YES), the process 1900 proceeds to block 1906. If the fault decoder 348 determines that there is not a rising edge on the encoded signal (e.g., block 1904: NO), the process 1900 proceeds to block 1902. At block 1906, the fault decoder 348 increments the rising edge count. For example, the second logic circuit 814, and/or, more generally, the rising edge counter 804 increments the rising edge count of the rising edge counter 804 by loading a logic high value into one or more of the second logic circuit 814, the third logic circuit 818, and/or the fourth logic circuit 820.

In the example of FIG. 19, at block 1908, the fault decoder 348 increments a timer corresponding to the number of clock cycles of the oscillator 802 that the fault decoder 348 has sampled the encoded signal (e.g., a sample timer). For example, the sixth logic circuit 824, and/or, more generally, the timer 808 increments the timer 808 (e.g., the sample timer) by loading a logic high value into one or more of the sixth logic circuit 824, the seventh logic circuit 828, and/or the eighth logic circuit 830. At block 1910, the fault decoder 348 determines whether the timer 808 (e.g., the sample timer) has recorded five or more periods of the clock (e.g., the oscillator 802). For example, the first comparator 832 determines whether the timer 808 has recorded five or more periods of the oscillator 802. If the fault decoder 348 determines that the timer 808 (e.g., the sample timer) has recorded five or more periods of the clock (e.g., block 1910: YES), the process 1900 proceeds to block 1912. If the fault decoder 348 determines that the timer 808 (e.g., the sample timer) has not recorded five or more periods of the clock (e.g., block 1910: NO), the process 1900 proceeds to block 1902.

In the example of FIG. 19, at block 1912, the fault decoder 348 determines whether more than two rising edges have been detected on the encoded signal within a period the clock. For example, the period of the clock corresponds to a period of the oscillator 802 at the frequency $f_2$, and the second comparator 834 determines whether more than two rising edges have been detected on the encoded signal within a period the clock.

In the illustrated example of FIG. 19, if the fault decoder 348 determines that more than two rising edges have been detected on the encoded signal within a period the clock (e.g., block 1912: YES), the process 1900 proceeds to block 1918. If the fault decoder 348 determines that more than two rising edges have not been detected on the encoded signal within a period the clock (e.g., block 1912: NO), the process 1900 proceeds to block 1914. At block 1914, the ninth logic circuit 838, and/or, more generally, the reset circuit 810 resets the rising edge count of the rising edge counter 804. After block 1914, the process 1900 proceeds to block 1916 where the first comparator 832 and/or, more generally, the timer 808 resets the FLT signal. After block 1916, the process 1900 proceeds to block 1902.

In the illustrated example of FIG. 19, at block 1918, the fault decoder 348 sets the FLT signal to a logic high value. For example, in response determining that five or more periods of the clock have been recorded and more than two edges of the encoded signal have been counted, the first comparator 832, and/or, more generally, the timer 808 sets a logic high value as the logic value of the FLT signal by loading a logic high value as the input to the second input of the first logic circuit 812. After block 1918, the process 1900 proceeds to block 1920.

In the example of FIG. 19, at block 1920, the fault decoder 348 determines whether to continue operating. A condition that could cause the fault decoder 348 to determine to not continue operating can be, for example, a loss of power. If the fault decoder 348 determines to continue operating (e.g., block 1920: YES), the process 1900 proceeds to block 1912. If the fault decoder 348 determines to not continue operating (e.g., block 1920: NO), the process 1900 terminates.

FIG. 20 is a flowchart representative of a process 2000, which may be implemented utilizing machine readable instructions that may be executed, to implement the high voltage stage signal converter 360 of FIG. 3 and/or the high voltage stage signal converter 470 of FIG. 4 to facilitate under voltage condition encoding. For example, the process 2000 may be executed to implement the UVLO encoder 376 of FIGS. 3, 4, and 9.

In the example of FIG. 20, the process 2000 begins at block 2002 where the level detector 903 determines whether there has been a logic low value on the UVLO signal. For example, the level detector 903 can monitor the output of the UVLO sensor 368. If the level detector 903 determines that there has been a logic low value on the UVLO signal (e.g., block 2002: YES), the process 2000 proceeds to block 2004. If the level detector 903 determines that there has not been a rising edge on the UVLO signal (e.g., block 2002: NO), the process 2000 proceeds to block 2018. At block 2004, the clock counter 911 sets a pending flag to a logic high value. For example, the third logic circuit 916 sets a pending flag in response to the logic low value on the UVLO signal. At block 2006, the signal selector 909 causes the seventh logic circuit 928 to transmit a logic value corresponding to a decimal value of zero. For example, at block 2006, the signal selector 909 causes the seventh logic circuit 928 to encode a logic low value into the encoded signal to be transmitted from the high voltage stage 320 of FIG. 3 and/or the high voltage stage 422 of FIG. 4 to the low voltage stage 318 of FIG. 3 and/or the low voltage stage 420 of FIG. 4.

In the illustrated example of FIG. 20, at block 2008, the clock counter 911 starts a counter. For example, the sixth logic circuit 924 starts counting from a count value corresponding to a logic value of zero at the rising edge of the UVLO signal. At block 2010, the clock counter 911 determines whether the count value is less than 240. For example, at block 2010, the comparator 926 determines whether the count value of the sixth logic circuit 924 is less than 240. If the clock counter 911 determines that the count value is less than 240 (e.g., block 2010: YES), the process 2000 proceeds to block 2012. If the clock counter 911 determines that the count value is not less than 240 (e.g., block 2010: NO), the process 2000 proceeds to block 2014.

In the example of FIG. 20, at block 2012, the clock counter 911 increments the count value of the sixth logic circuit 924. After block 2012, the process 2000 proceeds to block 2010. At block 2014, the level detector 903 determines whether there is a logic low value on the UVLO signal. If the level detector 903 determines that there is a logic low value on the UVLO signal (e.g., block 2014: YES), the process 2000 proceeds to block 2016. If the level detector 903 determines that there is not a rising edge on the UVLO signal (e.g., block 2014: NO), the process 2000 proceeds to block 2014. At block 2016, the clock counter 911 resets the count value of the sixth logic circuit 924. For example, in response to a logic low at the output of the second logic circuit 908 and the count value of the sixth logic circuit 924 being greater than or equal to 240, fifth logic circuit 922 resets and/or otherwise clears the logic values of the sixth logic circuit 924. After block 2016, the process 2000 proceeds to block 2018.

In the illustrated example of FIG. 20, at block 2018, the signal selector 909 causes the seventh logic circuit 928 to transmit the signal at the output of the encoder (e.g., the output of the eighth logic circuit 728 of FIG. 7). For example, at block 2018, the signal selector 909 causes the seventh logic circuit 928 to encode signal at the output of the encoder (e.g., the output of the eighth logic circuit 728 of FIG. 7) into the encoded signal to be transmitted from the high voltage stage 320 of FIG. 3 and/or the high voltage stage 422 of FIG. 4 to the low voltage stage 318 of FIG. 3 and/or the low voltage stage 420 of FIG. 4. After block 2018, the process 2000 proceeds to block 2020 where the UVLO encoder 376 determines whether to continue operating. A condition that could cause the UVLO encoder 376 to determine to not continue operating can be, for example, a loss of power. If the UVLO encoder 376 determines to continue operating (e.g., block 2020: YES), the process 2000 proceeds to block 2002. If the UVLO encoder 376 determines to not continue operating (e.g., block 2020: NO), the process 2000 terminates.

FIG. 21 is a flowchart representative of a process 2100, which may be implemented by machine readable instructions that may be executed, to implement the low voltage stage signal converter 340 of FIG. 3 and/or the low voltage stage signal converter 448 of FIG. 4 to facilitate UVLO decoding. For example, the process 2100 may be executed to implement the UVLO decoder 350 of FIGS. 3, 4, and 10.

In the example of FIG. 21, at block 2102, the UVLO decoder 350 determines whether there has been a logic low value on the encoded signal. For example, the first logic circuit 1004 determines whether there has been a logic low on the encoded signal. If the UVLO decoder 350 determines that there is a logic low value on the encoded signal (e.g., block 2102: YES), the process 2100 proceeds to block 2108. If the UVLO decoder 350 determines that there is not a logic low value on the encoded signal (e.g., block 2102: NO), the process 2100 proceeds to block 2104.

In the illustrated example of FIG. 21, at block 2104, the UVLO decoder 350 sets the count value of the fourth logic circuit 1010. After block 2104, the process 2100 proceeds to block 2106 where the UVLO decoder 350 resets the UVLO signal. After block 2106, the process 2100 proceeds to block 2116.

In the example of FIG. 21, at block 2108, the UVLO decoder 350 starts a counter. For example, the fourth logic circuit 1010 starts counting from a count value corresponding to a logic value of zero is response to a logic low value on the encoded signal. At block 2110, the UVLO decoder 350 determines whether the count value is greater than or equal to zero. For example, at block 2110, the comparator 1012 determines whether the count value of the fourth logic circuit 1010 is greater than or equal to zero. If the UVLO decoder 350 determines that the count value is greater than or equal to zero (e.g., block 2110: NO), the process 2100 proceeds to block 2114. If the UVLO decoder 350 determines that the count value is not greater than or equal to zero (e.g., block 2110: YES), the process 2100 proceeds to block 2112.

In the example illustrated in FIG. 21, at block 2112, the UVLO decoder 350 decrements the count value of the fourth logic circuit 1010. After block 2112, the process 2100 proceeds to block 2110. At block 2114, the UVLO decoder 350 sets the UVLO signal to a logic high value. For example, in response determining that the count value of the fourth logic circuit 1010 is not greater than or equal to zero, the comparator 1012, and/or, more generally, the UVLO decoder 350 sets a logic high value as the logic value of the UVLO signal by loading a logic low value as the input to the logic gate 1014. After block 2114, the process 2100 proceeds to block 2116.

In the example of FIG. 21, at block 2116, the UVLO decoder 350 determines whether to continue operating. A condition that could cause the UVLO decoder 350 to determine to not continue operating can be, for example, a loss of power. If the UVLO decoder 350 determines to continue operating (e.g., block 2116: YES), the process 2100 proceeds to block 2102. If the UVLO decoder 350 determines to not continue operating (e.g., block 2116: NO), the process 2100 terminates.

From the foregoing, it will be appreciated that example methods, apparatus and articles of manufacture have been disclosed that allow for the use of a single transmission channel to transmits multiple signals associated with the driving of a power switching device across an isolation barrier of an isolated gate driver. Additionally, the example methods, apparatus, and articles of manufacture have been disclosed that allow for the use of a single transmission channel to communicate at least three asynchronous signals associated with the operation of one or more of the isolated gate driver and/or the power switching device while facilitating the detects of at least faults with reduced latency. The example methods, apparatus, and articles of manufacture disclosed herein include classifying signals to be transmitted across an isolation barrier by priority and time multiplexing such signals. For example, high frequency pulse can be embedded between lower frequency signals to generate an encoded signal and indicate at least a fault while different voltage level signals can be embedded into the encoded signal to indicate at least an undervoltage condition of the isolated gate driver.

The disclosed methods, apparatus and articles of manufacture improve the efficiency of using a computing device by decreasing the digital overhead used to transmit and detect STO events (e.g., interrupts) and regular control of a power switching device when using an isolation barrier and decreasing the time needed to detect STO events. Moreover, when implementing the examples disclosed herein, STO of a power switching device can be triggered in the range of 100s of ns. Additionally, the example methods, apparatus, and articles of manufacture disclosed herein improve the efficiency of using a computing device by decreasing the digital overhead used to transmit and detect multiple signals that can be used by a computing system to monitor the operation of a power switching device and/or an isolated gate driver. The disclosed methods, apparatus, and articles of manufacture further improve the efficiency of using a computing device by reducing the time needed to for a computing system to detect at least, faults, undervoltage conditions, and characteristics of the power switching device, Additionally, when implementing the examples disclosed herein, faults associated with the power switching device can be detected in the range of 100s of ns. The disclosed methods, apparatus and articles of manufacture are accordingly directed to one or more improvement(s) in the functioning of a computer.

Example methods, apparatus, systems, and articles of manufacture to transmit signals in isolated gate drivers are disclosed herein. Further examples and combinations thereof include the following:

Example 1 includes an apparatus comprising a first encoder including an edge detector coupled to a first sensor, a first clock counter coupled to the edge detector, a first signal selector coupled to the first clock counter, and a first multiplexer including coupled to a signal generator, the first clock counter, and the first signal selector, and a second encoder including a level detector coupled to a second sensor, a second clock counter coupled to the level detector, a second signal selector coupled to the level detector and the second clock counter, and a second multiplexer coupled to the first multiplexer, a reference voltage, the second signal selector, and a modulator.

Example 2 includes the apparatus of example 1, wherein the first sensor is configured to monitor a current associated with a silicon carbide switch and the second sensor is configured to monitor a voltage associated with an isolated gate driver, the isolated gate driver including the signal generator, the first sensor, the second sensor, the modulator, the first encoder, and the second encoder.

Example 3 includes the apparatus of example 1, wherein the first sensor includes an output and an input coupled to a current terminal of a switch, the second sensor includes an output, the signal generator includes an output and an input coupled to an output of a third sensor, the third sensor configured to monitor a temperature associated with the switch, the signal generator configured to convert a voltage associated with the temperature to a pulse width modulated signal, the modulator includes an input, the edge detector includes an output and an input coupled to the output of the first sensor, the first clock counter includes a first output, a second output, and an input coupled to the output of the edge detector, the first signal selector includes an output and an input coupled to the first output of the first clock counter, the first multiplexer includes a first input, a second input, a third input, and an output, the first input of the first multiplexer coupled to the output of the signal generator, the second input of the first multiplexer coupled to the second output of the first clock counter, and the third input of the first multiplexer coupled to the output of the first signal selector, the level detector includes an output and an input coupled to the output of the second sensor, the second clock counter includes an output and an input coupled to the output of the level detector, the second signal selector includes an output, a first input coupled to the output of the level detector, and a second input coupled to the output of the second clock counter, and the second multiplexer includes a first input, a second input, a third input, and an output, the first input of the second multiplexer coupled to the output of the first multiplexer, the second input of the second multiplexer coupled to a reference voltage, the third input of the second multiplexer coupled to the output of the second signal selector, and the output of the second multiplexer coupled the input of the modulator.

Example 4 includes the apparatus of example 3, wherein the modulator includes an output coupled to an input of an isolation barrier, the isolation barrier including an output coupled to an input of a low voltage stage, the isolation barrier including capacitive isolation.

Example 5 includes the apparatus of example 1, wherein the edge detector is configured to monitor the first sensor for a rising edge, the first signal selector is configured to cause the first multiplexer to transmit a first signal including a first frequency and a first voltage, in response to the edge detector detecting the rising edge, cause the first multiplexer to transmit a second signal including a second frequency and a second voltage, the second frequency different than the first frequency, and when a count value of the first clock counter meets a predetermined number of rising edges of the second signal, cause the first multiplexer to transmit the first signal.

Example 6 includes the apparatus of example 5, wherein the second frequency of the second signal is greater than the first frequency of the first signal and the predetermined number of rising edges of the second signal corresponds to a period of time that reduces distortion in the first signal.

Example 7 includes the apparatus of example 5, wherein the reference voltage is different than the first voltage and the second voltage.

Example 8 includes the apparatus of example 1, wherein the level detector is configured to monitor the second sensor for a logic low value, the second signal selector is configured to cause the second multiplexer to transmit a first signal including a first frequency and a first voltage, the first signal to be obtained from the first multiplexer, in response to the level detector detecting a logic low value at the second sensor, cause the second multiplexer to transmit the reference voltage, and when a count value of the second clock counter meets a predetermined number of rising edges on a second signal including a second frequency and a second voltage at the second sensor is a logic high value, cause the second multiplexer to transmit the first signal.

Example 9 includes the apparatus of example 8, wherein the predetermined number of rising edges of the second signal corresponds to a first period of time that is greater than a second period of time associated with the first frequency of the first signal.

Example 10 includes the apparatus of example 8, wherein the reference voltage is different than the first voltage and the second voltage.

Example 11 includes a signal converter comprising a first encoder including a first input coupled to an output of a signal generator, a second input coupled to an output of a first sensor, an output, and a first multiplexer, the first input of the first encoder corresponding to an input of the first multiplexer, the output of the first encoder corresponding to an output of the first multiplexer, the first encoder configured to transmit a first signal at the output of the first encoder, the first signal including a first voltage level and a first frequency, in response to a first indication by the first sensor, transmit a second signal at the output of the first encoder, the second signal including a second voltage level and a second frequency, the second frequency different than the first frequency, and a second encoder including a first input coupled to the output of the first encoder, a second input coupled to a second sensor, a second multiplexer, and an output, the first input of the second encoder corresponding to an input of the second multiplexer, the output of second encoder coupled to an input of a modulator, the output of the second encoder corresponding to an output of the second multiplexer, the second encoder configured to, in response to a second indication by the second sensor, transmit a third signal to the modulator, the third signal including a third voltage level different than the first voltage level and the second voltage level.

Example 12 includes the signal converter of example 11, wherein the first encoder includes an edge detector including an output and an input corresponding to the second input of the first encoder, a clock counter including a first output, a second output, and an input coupled to the output of the edge detector, a signal selector including an output and an input coupled to the first output of the clock counter, and the input of the first multiplexer being a first input, the first multiplexer including a second input, and a third input, the second input of the first multiplexer coupled to the second output of the clock counter and the third input of the first multiplexer coupled to the output of the signal selector.

Example 13 includes the signal converter of example 11, wherein the second encoder includes a level detector including an output and an input corresponding to the second input of the second encoder, a clock counter including an output and an input coupled to the output of the level detector, a signal selector including an output and an input coupled to the first input of the clock counter, and the input of the second multiplexer is a first input, the second multiplexer including a second input, and a third input, the second input of the second multiplexer coupled to a third signal including a third frequency and a third voltage, and the third input of the second multiplexer coupled to the output of the signal selector.

Example 14 includes the signal converter of example 11, wherein the first sensor is configured to monitor a current associated with a silicon carbide switch, the second sensor is configured to monitor a voltage associated with an isolated gate driver, the isolated gate driver including the signal generator, the first sensor, the second sensor, the modulator, the first encoder, and the second encoder.

Example 15 includes the signal converter of example 14, wherein the first signal corresponds to a characteristic of a switch coupled to the isolated gate driver, the first indication corresponds to a fault associated with the switch, and the second indication corresponds to an undervoltage condition associated with the isolated gate driver.

Example 16 includes the signal converter of example 11, wherein the first sensor includes an input coupled to a current terminal of a switch and the signal generator includes an input coupled to an output of a third sensor, the third sensor configured to monitor a temperature associated with the switch, the signal generator configured to convert a voltage associated with the temperature to a pulse width modulated signal.

Example 17 includes the signal converter of example 11, wherein the modulator includes an output coupled to an input of an isolation barrier, the isolation barrier including an output coupled to an input of a low voltage stage, the isolation barrier including capacitive isolation.

Example 18 includes the signal converter of example 11, wherein the first encoder is configured to transmit a signal at the output of the first encoder, and transmit the second signal for a first predetermined number of rising edges of the second signal and the second encoder is configured to transmit the third signal for a second predetermined number of rising edges of the second signal.

Example 19 includes the signal converter of example 18, wherein the first predetermined number of rising edges of the second signal corresponds to a period of time that reduces distortion in the first signal.

Example 20 includes the signal converter of example 18, wherein the second predetermined number of rising edges of the second signal corresponds to a first period of time that is greater than a second period of time associated with the first frequency.

Example 21 includes a system comprising a switch including a first current terminal coupled to a voltage supply and a second current terminal coupled to a reference node, the switch configured to conduct current from the first current terminal to the second current terminal, a signal generator including an output, a first sensor including an output and an input coupled to the first current terminal of the switch, a second sensor including an output, a modulator including an input and an output, a capacitor including an output and an input coupled to the output of the modulator, and a signal converter including an output coupled to the input of the modulator, a first input coupled to the output of the signal generator, a second input coupled to the output of the first sensor, and a third input coupled to the output of the second sensor, the signal converter configured to transmit a first signal, the first signal including a first voltage level and a first frequency, in response to a first indication by the first sensor, transmit a second signal, the second signal including a second voltage level and a second frequency, the second frequency different than the first frequency, and in response to a second indication by the second sensor, transmit a third signal, the third signal including a third voltage level different than the first voltage level and the second voltage level.

Example 22 includes the signal converter of example 21, wherein the first sensor is configured to monitor a current associated with a silicon carbide switch, the second sensor is configured to monitor a voltage associated with an isolated gate driver, the isolated gate driver including the signal generator, the first sensor, the second sensor, the modulator, the signal converter.

Example 23 includes the system of example 22, wherein the first signal corresponds to a characteristic of the switch, the first indication corresponds to a fault associated with the switch, and the second indication corresponds to an undervoltage condition associated with the isolated gate driver.

Example 24 includes the system of example 21, wherein the second frequency of the second signal is greater than the first frequency of the first signal, and the third voltage level is less than the first voltage level and the second voltage level.

Example 25 includes the system of example 21, wherein the signal converter is configured to transmit the second signal for a first predetermined number of rising edges of the second signal, and transmit the third signal for a second predetermined number of rising edges of the second signal.

Example 26 includes the system of example 25, wherein the first predetermined number of rising edges of the second signal corresponds to a period of time that reduces distortion in the first signal.

Example 27 includes the system of example 25, wherein the second predetermined number of rising edges of the second signal corresponds to a first period of time that is greater than a second period of time associated with the first frequency.

Example 28 includes the system of example 21, further including a first die and a second die, the first die including the signal generator, the first sensor, the second sensor, the modulator, the capacitor, and the signal converter, the signal converter being a first signal converter, the capacitor being a first capacitor, the first capacitor including an output, the second die including a second capacitor including an output and an input coupled to the output of the first capacitor, a demodulator including an output and an input coupled to the output of the second capacitor, a second signal converter including an input coupled to the output of the demodulator, a first output coupled to a first pin, a second output coupled to a second pin, and a third output coupled to a third pin, the second signal converter configured to transmit a signal at the output of the demodulator to the first pin, monitor the signal at the output of the demodulator for a rising edge, in response to detecting the rising edge of the signal at the output of the demodulator, increment a first count value of a first counter and a timer, in response to the timer meeting a first threshold and the first count value of the first counter meeting a second threshold, transmit a first indication to the second pin, monitor the signal at the output of the demodulator for a logic low value, in response to detecting the logic low value on the signal at the output of the demodulator, decrement a second count value of a second counter, and in response to the second count value of the second counter meeting a third threshold, transmit a second indication to the third pin.

Example 29 includes the system of example 28, wherein the third threshold is different than the first threshold and the second threshold and the second count value corresponds to a first period of time that is greater than a second period of time corresponding to the first frequency of the first signal.

Example 30 includes the system of example 21, further including a first die, a second die, and a third die, the first die including the signal generator, the first sensor, the second sensor, the modulator, and the signal converter, the signal converter being a first signal converter, the capacitor including an output, the second die including the capacitor, the third die including a demodulator including an output and an input coupled to the output of the capacitor, and a second signal converter including an input coupled to the output of the demodulator, a first output coupled to a first pin, a second output coupled to a second pin, and a third output coupled to a third pin, the second signal converter configured to decode a signal at the output of the demodulator.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

The following claims are hereby incorporated into this Detailed Description by this reference, with each claim standing on its own as a separate embodiment of the present disclosure.

What is claimed is:

1. An isolated gate driver circuit comprising:
   (a) a low voltage stage having a pulse width modulation input, having a reset or enable input, having a low stage isolation barrier output, having a low stage isolation barrier input, having a first sensor output, and having a second sensor output;
   (b) an isolation barrier including:
      a first device having an input coupled to the low stage isolation barrier output and having an output; and
      a second device having an output coupled to the low stage isolation barrier input and having an input; and
   (c) a high voltage stage having a high stage isolation barrier input coupled to the first device output, having a high stage isolation barrier output coupled to the second device input, a supply voltage input, a driver output, a first sensor input, a second sensor input, and a third sensor input.

2. The isolated gate driver circuit of claim 1 in which the high voltage stage includes:
   first sensor circuitry having an input coupled to the first sensor input and having a first sensor circuitry output;
   second sensor circuitry having an input coupled to the second sensor input, having an input coupled to the first sensor circuitry output, and having a second sensor circuitry output; and
   modulator circuitry having an input coupled to the second sensor circuitry output and having the high stage isolation barrier output coupled to the second device input.

3. The isolated gate driver circuit of claim 1 in which the high voltage stage includes:
   first sensor circuitry having an input coupled to the first sensor input and having a first sensor circuitry output;
   second sensor circuitry having an input coupled to the second sensor input, having an input coupled to the first sensor circuitry output, and having a second sensor circuitry output;
   third sensor circuitry having a third sensor input coupled to the supply voltage input, having an input coupled to the second sensor circuitry output, and having a third sensor circuitry output;
   modulator circuitry having an input coupled to the third sensor circuitry output and having the high stage isolation barrier output coupled to the second device input.

4. The isolated gate driver circuit of claim 1 in which the high voltage stage includes:
   pulse width modulation circuitry having an input coupled to the first sensor input and having a pulse width modulation output;
   fault sensor circuitry having an input coupled to the second sensor input an input coupled to the pulse width modulation output, and having a fault output; and
   modulator circuitry having an input coupled to the fault output and having the high stage isolation barrier output coupled to the second device input.

5. The isolated gate driver circuit of claim 1 in which the high voltage stage includes:
   pulse width modulation circuitry having an input coupled to the first sensor input and having a pulse width modulation output;
   fault sensor circuitry having an input coupled to the second sensor input, having an input coupled to the pulse width modulation output, and having a fault output;
   under voltage sensor circuitry having an input coupled to the supply voltage input, having an input coupled to the fault output, and having an under voltage output;
   modulator circuitry having an input coupled to the under voltage output and having the high stage isolation barrier output coupled to the second device input.

6. The isolated gate driver circuit of claim 1 in which the high voltage stage includes pulse width modulation circuitry having an analog input coupled to the first sensor input and including signal generator circuitry having an input coupled to the analog input and having a digital pulse width modulation output, the signal generator circuitry providing a digital pulse width modulation signal at a first frequency at the digital output.

7. The isolated gate driver of claim 6 in which the first frequency is in the range of 100s of kilohertz.

8. The isolated gate driver circuit of claim 6 in which the high voltage stage includes fault encoder circuitry having an input coupled to the second sensor input, having an oscillator signal input at a second frequency different from the first frequency, having an input coupled to the digital pulse width modulation output, and having a fault output.

9. The isolated gate driver of claim 6 in which the second frequency is in the range of 10s of MegaHertz.

10. The isolated gate driver circuit of claim 8 in which the fault encoder circuitry includes:
    an oscillator having an output coupled to the oscillator signal input;
    edge detector circuitry having an input coupled to the second sensor input, having an input coupled to the oscillator signal input, and having an edge detect output;
    first clock counter circuitry having an input coupled to the edge detect output, having an input coupled to the oscillator signal input, having a first count input, and having a second frequency clock signal output;
    signal selector circuitry having an input coupled to the oscillator signal input, an input coupled to the clock counter circuitry, and having a first select output; and
    first multiplexer circuitry having an input coupled to the digital pulse width modulation output, having an input coupled to the second frequency clock signal output, having an input coupled to the first select output, and having a first multiplexer output.

11. The isolated gate driver circuit of claim 8 in which the first count input equals 36.

12. The isolated gate driver circuit of claim 8 in which the high voltage stage includes:
    under voltage encoder circuitry having an input coupled to the supply voltage input, having an input coupled to the fault output, having an oscillator signal input at the second frequency, and having an under voltage output; and modulator circuitry having an input coupled to the under voltage output and having the high stage isolation barrier output coupled to the second device input.

13. The isolated gate driver circuit of claim 12 in which the under voltage encoder circuitry includes:

level detector circuitry having an input coupled to the supply voltage input, having an input coupled to the oscillator signal input, and having an event output;

second clock counter circuitry having an input coupled to the oscillator signal input, having an input coupled to the event output, having a second count input, and having a second clock output;

selector circuitry having a first input coupled to the event output, having an input coupled to the second clock output, and having a second select output; and second multiplexer circuitry having an input coupled to the first multiplexer output, having an input tied to a logic state, having a control input coupled to the second select output, and having a modulator output.

14. The isolated gate driver of claim 13 in which the count input equals 240.

15. The isolated gate driver of claim 13 including modulator circuitry having an input coupled go the modulator output and having an output coupled to the a high stage isolation barrier output.

* * * * *